United States Patent
Lin et al.

(10) Patent No.: US 8,329,510 B2
(45) Date of Patent: Dec. 11, 2012

(54) METHOD OF MAKING A SEMICONDUCTOR CHIP ASSEMBLY WITH A POST/BASE HEAT SPREADER WITH AN ESD PROTECTION LAYER

(75) Inventors: Charles W. C. Lin, Singapore (SG); Chia-Chung Wang, Hsinchu (TW)

(73) Assignee: Bridge Semiconductor Corporation, Taipei (TW)

( * ) Notice: Subject to any disclaimer, the term of this patent is extended or adjusted under 35 U.S.C. 154(b) by 0 days.

(21) Appl. No.: 12/978,421

(22) Filed: Dec. 24, 2010

(65) Prior Publication Data
US 2011/0104855 A1 May 5, 2011

Related U.S. Application Data

(60) Division of application No. 12/975,429, filed on Dec. 22, 2010, which is a continuation-in-part of application No. 12/616,773, filed on Nov. 11, 2009, now Pat. No. 8,067,784, and a continuation-in-part of application No. 12/616,775, filed on Nov. 11, 2009, said application No. 12/616,773 is a continuation-in-part of application No. 12/557,540, filed on Sep. 11, 2009, and a continuation-in-part of application No. 12/557,541, filed on Sep. 11, 2009, said application No. 12/616,775 is a continuation-in-part of application No. 12/557,540, filed on Sep. 11, 2009, and a continuation-in-part of application No. 12/557,541, filed on Sep. 11, 2009, said application No. 12/557,540 is a continuation-in-part of application No. 12/406,510, filed on Mar. 18, 2009, said application No. 12/557,541 is a continuation-in-part of application No. 12/406,510, filed on Mar. 18, 2009.

(60) Provisional application No. 61/360,497, filed on Jul. 1, 2010, provisional application No. 61/350,922, filed on Jun. 3, 2010, provisional application No. 61/071,588, filed on May 7, 2008, provisional application No. 61/071,072, filed on Apr. 11, 2008, provisional application No. 61/064,748, filed on Mar. 25, 2008, provisional application No. 61/150,980, filed on Feb. 9, 2009.

(51) Int. Cl.
*H01L 21/00* (2006.01)
(52) U.S. Cl. ......... 438/118; 438/122; 257/706; 257/707
(58) Field of Classification Search .................. 438/118, 438/122; 257/706, 707
See application file for complete search history.

(56) References Cited

U.S. PATENT DOCUMENTS
3,689,993 A  9/1972  Tolar .............................. 438/380
(Continued)

FOREIGN PATENT DOCUMENTS
JP  2005-166775  6/2005

*Primary Examiner* — Phat X Cao
(74) *Attorney, Agent, or Firm* — Jackson IPG PLLC

(57) ABSTRACT

A method of making a semiconductor chip assembly includes providing a post, a base, an ESD protection layer and a metal layer, wherein the post extends above the base and the ESD protection layer is sandwiched between the base and the metal layer, mounting an adhesive on the base including inserting the post into an opening in the adhesive, mounting a conductive layer on the adhesive including aligning the post with an aperture in the conductive layer, then flowing the adhesive upward between the post and the conductive layer, solidifying the adhesive, then providing a conductive trace that includes a pad, a terminal and a selected portion of the conductive layer, providing a heat spreader that includes the post, the base, the ESD protection layer and an underlayer that includes at least a portion of the metal layer, then mounting a semiconductor device on the post, electrically connecting the semiconductor device to the conductive trace and thermally connecting the semiconductor device to the heat spreader.

51 Claims, 50 Drawing Sheets

U.S. PATENT DOCUMENTS

| | | | |
|---|---|---|---|
| 3,969,199 A | 7/1976 | Berdan et al. | 205/177 |
| 4,420,767 A | 12/1983 | Hodge et al. | 257/713 |
| 4,509,096 A | 4/1985 | Baldwin et al. | 257/706 |
| 5,012,386 A | 4/1991 | McShane et al. | 361/386 |
| 5,102,829 A | 4/1992 | Cohn | 437/217 |
| 5,379,187 A | 1/1995 | Lee et al. | 361/707 |
| 5,457,605 A | 10/1995 | Wagner et al. | 361/720 |
| 5,543,586 A | 8/1996 | Crane, Jr. et al. | 174/262 |
| 5,644,163 A | 7/1997 | Tsuji | 257/706 |
| 5,991,156 A | 11/1999 | Bond et al. | 361/707 |
| 6,057,601 A | 5/2000 | Lau et al. | 257/738 |
| 6,107,683 A | 8/2000 | Castro et al. | 257/700 |
| 6,160,705 A | 12/2000 | Stearns et al. | 361/704 |
| 6,162,664 A | 12/2000 | Kim | 438/126 |
| 6,281,568 B1 | 8/2001 | Glenn et al. | 257/684 |
| 6,313,525 B1 | 11/2001 | Sasano | 257/704 |
| 6,453,549 B1 | 9/2002 | Bhatt et al. | 29/837 |
| 6,495,914 B1 | 12/2002 | Sekine et al. | 257/723 |
| 6,498,355 B1 | 12/2002 | Harrah et al. | 257/99 |
| 6,507,102 B2 | 1/2003 | Juskey et al. | 257/406 |
| 6,528,882 B2 | 3/2003 | Ding et al. | 257/738 |
| 6,541,832 B2 | 4/2003 | Coyle | 257/415 |
| 6,583,444 B2 | 6/2003 | Fjelstad | 257/82 |
| 6,603,209 B1 | 8/2003 | DiStefano et al. | 257/781 |
| 6,608,376 B1 | 8/2003 | Liew et al. | 257/698 |
| 6,625,028 B1 | 9/2003 | Dove et al. | 361/707 |
| 6,670,219 B2 | 12/2003 | Lee et al. | 438/107 |
| 6,683,795 B1 | 1/2004 | Yoo | 361/816 |
| 6,700,077 B2 | 3/2004 | Chiang | 174/262 |
| 6,720,651 B2 | 4/2004 | Gaku et al. | 257/707 |
| 6,744,135 B2 | 6/2004 | Hasebe et al. | 257/712 |
| 6,861,750 B2 | 3/2005 | Zhao et al. | 257/739 |
| 6,900,535 B2 | 5/2005 | Zhou | 257/707 |
| 6,906,414 B2 | 6/2005 | Zhao et al. | 257/707 |
| 6,936,855 B1 | 8/2005 | Harrah | 257/88 |
| 6,964,877 B2 | 11/2005 | Chen et al. | 438/20 |
| 7,038,311 B2 | 5/2006 | Woodall et al. | 257/706 |
| 7,196,403 B2 | 3/2007 | Karim | 257/675 |
| 7,205,613 B2 | 4/2007 | Fjelstad et al. | 257/355 |
| 7,274,048 B2 | 9/2007 | Wu | 257/173 |
| 7,279,724 B2 | 10/2007 | Collins, III et al. | 257/103 |
| 7,335,522 B2 | 2/2008 | Wang et al. | 438/26 |
| 7,470,935 B2 | 12/2008 | Lee et al. | 257/98 |
| 7,495,322 B2 | 2/2009 | Hashimoto et al. | 257/676 |
| 7,582,951 B2 | 9/2009 | Zhao et al. | 257/660 |
| 7,642,137 B2 | 1/2010 | Lin et al. | 438/127 |
| 7,649,723 B2 | 1/2010 | Chiu et al. | 361/56 |
| 7,690,817 B2 | 4/2010 | Sanpei et al. | 362/294 |
| 7,741,158 B2 | 6/2010 | Leung et al. | 438/122 |
| 7,781,266 B2 | 8/2010 | Zhao et al. | 438/123 |
| 7,808,087 B2 | 10/2010 | Zhao et al. | 257/670 |
| 7,812,360 B2 | 10/2010 | Yano | 257/98 |
| 7,821,027 B2 * | 10/2010 | Shin et al. | 257/100 |
| 7,956,372 B2 | 6/2011 | Kamada et al. | 257/98 |
| 8,030,676 B2 | 10/2011 | Lin | 257/99 |
| 8,071,998 B2 | 12/2011 | Chen | 257/99 |
| 2003/0189830 A1 | 10/2003 | Sugimoto et al. | 362/294 |
| 2004/0061433 A1 | 4/2004 | Izuno et al. | 313/498 |
| 2004/0065894 A1 | 4/2004 | Hashimoto et al. | 257/100 |
| 2005/0024834 A1 | 2/2005 | Newby | 361/719 |
| 2005/0135105 A1 | 6/2005 | Teixeira et al. | 362/294 |
| 2005/0185880 A1 | 8/2005 | Asai | 385/14 |
| 2005/0274959 A1 | 12/2005 | Kim et al. | 257/79 |
| 2006/0012967 A1 | 1/2006 | Asai et al. | 361/764 |
| 2006/0054915 A1 | 3/2006 | Chang | 257/100 |
| 2006/0109632 A1 | 5/2006 | Berlin et al. | 361/719 |
| 2006/0131735 A1 | 6/2006 | Ong et al. | 257/706 |
| 2007/0063213 A1 | 3/2007 | Hsieh et al. | 257/99 |
| 2007/0077416 A1 | 4/2007 | Ito et al. | 428/339 |
| 2007/0090522 A1 | 4/2007 | Alhayek et al. | 257/723 |
| 2007/0252166 A1 | 11/2007 | Chang et al. | 257/98 |
| 2007/0267642 A1 | 11/2007 | Erchak et al. | 257/98 |
| 2007/0290322 A1 | 12/2007 | Zhao et al. | 257/690 |
| 2008/0019133 A1 | 1/2008 | Kim et al. | 362/294 |
| 2008/0099770 A1 | 5/2008 | Mendendorp et al. | 257/79 |
| 2008/0102631 A1 | 5/2008 | Andryushchenko et al. | 438/686 |
| 2008/0173884 A1 | 7/2008 | Chitnis et al. | 257/98 |
| 2008/0180824 A1 | 7/2008 | Endoh et al. | 359/894 |
| 2009/0309213 A1 | 12/2009 | Takahashi et al. | 257/707 |
| 2010/0149756 A1 | 6/2010 | Rowcliffe et al. | 361/714 |
| 2010/0291737 A1 | 11/2010 | Ikeguchi et al. | 438/108 |
| 2011/0133204 A1 | 6/2011 | Lai | 257/76 |

\* cited by examiner

METHOD OF MAKING A SEMICONDUCTOR CHIP ASSEMBLY WITH A POST/BASE HEAT SPREADER WITH AN ESD PROTECTION LAYER

CROSS-REFERENCE TO RELATED APPLICATIONS

This application is a divisional of U.S. application Ser. No. 12/975,429 filed Dec. 22, 2010, which is a continuation-in-part of U.S. application Ser. No. 12/616,773 filed Nov. 11, 2009 now U.S. Pat. No. 8,067,784 and a continuation-in-part of U.S. application Ser. No. 12/616,775 filed Nov. 11, 2009, each of which is incorporated by reference. U.S. application Ser. No. 12/975,429 filed Dec. 22, 2010 also claims the benefit of U.S. Provisional Application Ser. No. 61/360,497 filed Jul. 1, 2010 and U.S. Provisional Application Ser. No. 61/350,922 filed Jun. 3, 2010, each of which is incorporated by reference.

U.S. application Ser. No. 12/616,773 filed Nov. 11, 2009 and U.S. application Ser. No. 12/616,775 filed Nov. 11, 2009 are each a continuation-in-part of U.S. application Ser. No. 12/557,540 filed Sep. 11, 2009 and a continuation-in-part of U.S. application Ser. No. 12/557,541 filed Sep. 11, 2009.

U.S. application Ser. No. 12/557,540 filed Sep. 11, 2009 and U.S. application Ser. No. 12/557,541 filed Sep. 11, 2009 are each a continuation-in-part of U.S. application Ser. No. 12/406,510 filed Mar. 18, 2009, which claims the benefit of U.S. Provisional Application Ser. No. 61/071,589 filed May 7, 2008, U.S. Provisional Application Ser. No. 61/071,588 filed May 7, 2008, U.S. Provisional Application Ser. No. 61/071,072 filed Apr. 11, 2008, and U.S. Provisional Application Ser. No. 61/064,748 filed Mar. 25, 2008, each of which is incorporated by reference. U.S. application Ser. No. 12/557,540 filed Sep. 11, 2009 and U.S. application Ser. No. 12/557,541 filed Sep. 11, 2009 also claim the benefit of U.S. Provisional Application Ser. No. 61/150,980 filed Feb. 9, 2009, which is incorporated by reference.

BACKGROUND OF THE INVENTION

1. Field of the Invention

The present invention relates to semiconductor chip assembly, and more particularly to a semiconductor chip assembly with a semiconductor device, a conductive trace, an adhesive and a heat spreader with electrostatic discharge (ESD) protection and its method of manufacture.

2. Description of the Related Art

Semiconductor devices such as packaged and unpackaged semiconductor chips have high voltage, high frequency and high performance applications that require substantial power to perform the specified functions. As the power increases, the semiconductor device generates more heat. Furthermore, the heat build-up is aggravated by higher packing density and smaller profile sizes which reduce the surface area to dissipate the heat.

Semiconductor devices are susceptible to performance degradation as well as short life span and immediate failure at high operating temperatures. The heat not only degrades the chip, but also imposes thermal stress on the chip and surrounding elements due to thermal expansion mismatch. As a result, the heat must be dissipated rapidly and efficiently from the chip to ensure effective and reliable operation. A high thermal conductivity path typically requires heat conduction and heat spreading to a much larger surface area than the chip or a die pad it is mounted on.

Light emitting diodes (LEDs) have recently become popular alternatives to incandescent, fluorescent and halogen light sources. LEDs provide energy efficient, cost effective, long term lighting for medical, military, signage, signal, aircraft, maritime, automotive, portable, commercial and residential applications. For instance, LEDs provide light sources for lamps, flashlights, headlights, flood lights, traffic lights and displays.

LEDs include high power chips that generate high light output and considerable heat. Unfortunately, LEDs exhibit color shifts and low light output as well as short lifetimes and immediate failure at high operating temperatures. Furthermore, LED light output and reliability are constrained by heat dissipation limits. LEDs underscore the critical need for providing high power chips with adequate heat dissipation.

LED packages usually include an LED chip, a submount, electrical contacts and a thermal contact. The submount is thermally connected to and mechanically supports the LED chip. The electrical contacts are electrically connected to the anode and cathode of the LED chip. The thermal contact is thermally connected to the LED chip by the submount but requires adequate heat dissipation by the underlying carrier to prevent the LED chip from overheating.

Packages and thermal boards for high power chips have been developed extensively in the industry with a wide variety of designs and manufacturing techniques in attempts to meet performance demands in an extremely cost-competitive environment.

Plastic ball grid array (PBGA) packages have a chip and a laminated substrate enclosed in a plastic housing and are attached to a printed circuit board (PCB) by solder balls. The laminated substrate includes a dielectric layer that often includes fiberglass. The heat from the chip flows through the plastic and the dielectric layer to the solder balls and then the PCB. However, since the plastic and the dielectric layer typically have low thermal conductivity, the PBGA provides poor heat dissipation.

Quad-Flat-No Lead (QFN) packages have the chip mounted on a copper die pad which is soldered to the PCB. The heat from the chip flows through the die pad to the PCB. However, since the lead frame type interposer has limited routing capability, the QFN package cannot accommodate high input/output (I/O) chips or passive elements.

Thermal boards provide electrical routing, thermal management and mechanical support for semiconductor devices. Thermal boards usually include a substrate for signal routing, a heat spreader or heat sink for heat removal, pads for electrical connection to the semiconductor device and terminals for electrical connection to the next level assembly. The substrate can be a laminated structure with single layer or multi-layer routing circuitry and one or more dielectric layers. The heat spreader can be a metal base, a metal slug or an embedded metal layer.

Thermal boards interface with the next level assembly. For instance, the next level assembly can be a light fixture with a printed circuit board and a heat sink. In this instance, an LED package is mounted on the thermal board, the thermal board is mounted on the heat sink, the thermal board/heat sink subassembly and the printed circuit board are mounted in the light fixture and the thermal board is electrically connected to the printed circuit board by wires. The substrate routes electrical signals to the LED package from the printed circuit board and the heat spreader spreads and transfers heat from the LED package to the heat sink. The thermal board thus provides a critical thermal path for the LED chip.

U.S. Pat. No. 6,507,102 to Juskey et al. discloses an assembly in which a composite substrate with fiberglass and cured thermosetting resin includes a central opening, a heat slug with a square or rectangular shape resembling the central opening is attached to the substrate at sidewalls of the central opening, top and bottom conductive layers are attached to the top and bottom of the substrate and electrically connected to one another by plated through-holes through the substrate, a chip is mounted on the heat slug and wire bonded to the top conductive layer, an encapsulant is molded on the chip and solder balls are placed on the bottom conductive layer.

During manufacture, the substrate is initially a prepreg with B-stage resin placed on the bottom conductive layer, the heat slug is inserted into the central opening and on the bottom conductive layer and spaced from the substrate by a gap, the top conductive layer is mounted on the substrate, the conductive layers are heated and pressed towards one another so that the resin melts, flows into the gap and solidifies, the conductive layers are patterned to form circuit traces on the substrate and expose the excess resin flash on the heat slug, and the excess resin flash is removed to expose the heat slug. The chip is then mounted on the heat slug, wire bonded and encapsulated.

The heat flows from the chip through the heat slug to the PCB. However, manually dropping the heat slug into the central opening is prohibitively cumbersome and expensive for high volume manufacture. Furthermore, since the heat slug is difficult to accurately position in the central opening due to tight lateral placement tolerance, voids and inconsistent bond lines arise between the substrate and the heat slug. The substrate is therefore partially attached to the heat slug, fragile due to inadequate support by the heat slug and prone to delamination. In addition, the wet chemical etch that removes portions of the conductive layers to expose the excess resin flash also removes portions of the heat slug exposed by the excess resin flash. The heat slug is therefore non-planar and difficult to bond to. As a result, the assembly suffers from high yield loss, poor reliability and excessive cost.

U.S. Pat. No. 6,528,882 to Ding et al. discloses a thermal enhanced ball grid array package in which the substrate includes a metal core layer. The chip is mounted on a die pad region at the top surface of the metal core layer, an insulating layer is formed on the bottom surface of the metal core layer, blind vias extend through the insulating layer to the metal core layer, thermal balls fill the blind vias and solder balls are placed on the substrate and aligned with the thermal balls. The heat from the chip flows through the metal core layer to the thermal balls to the PCB. However, the insulating layer sandwiched between the metal core layer and the PCB limits the heat flow to the PCB.

U.S. Pat. No. 6,670,219 to Lee et al. discloses a cavity down ball grid array (CDBGA) package in which a ground plate with a central opening is mounted on a heat spreader to form a thermal dissipating substrate. A substrate with a central opening is mounted on the ground plate using an adhesive with a central opening. A chip is mounted on the heat spreader in a cavity defined by the central opening in the ground plate and solder balls are placed on the substrate. However, since the solder balls extend above the substrate, the heat spreader does not contact the PCB. As a result, the heat spreader releases the heat by thermal convection rather than thermal conduction which severely limits the heat dissipation.

U.S. Pat. No. 7,038,311 to Woodall et al. discloses a thermal enhanced BGA package in which a heat sink with an inverted T-like shape includes a pedestal and an expanded base, a substrate with a window opening is mounted on the expanded base, an adhesive attaches the pedestal and the expanded base to the substrate, a chip is mounted on the pedestal and wire bonded to the substrate, an encapsulant is molded on the chip and solder balls are placed on the substrate. The pedestal extends through the window opening, the substrate is supported by the expanded base and the solder balls are located between the expanded base and the perimeter of the substrate. The heat from the chip flows through the pedestal to the expanded base to the PCB. However, since the expanded base must leave room for the solder balls, the expanded base protrudes below the substrate only between the central window and the innermost solder ball. Consequently, the substrate is unbalanced and wobbles and warps during manufacture. This creates enormous difficulties with chip mounting, wire bonding and encapsulant molding. Furthermore, the expanded base may be bent by the encapsulant molding and may impede soldering the package to the next level assembly as the solder balls collapse. As a result, the package suffers from high yield loss, poor reliability and excessive cost.

U.S. Patent Application Publication No. 2007/0267642 to Erchak et al. discloses a light emitting device assembly in which a base with an inverted T-like shape includes a substrate, a protrusion and an insulative layer with an aperture, electrical contacts are mounted on the insulative layer, a package with an aperture and a transparent lid is mounted on the electrical contacts and an LED chip is mounted on the protrusion and wire bonded to the substrate. The protrusion is adjacent to the substrate and extends through the apertures in the insulative layer and the package into the package, the insulative layer is mounted on the substrate, the electrical contacts are mounted on the insulative layer and the package is mounted on the electrical contacts and spaced from the insulative layer. The heat from the chip flows through the protrusion to the substrate to a heat sink. However, the electrical contacts are difficult to mount on the insulating layer, difficult to electrically connect to the next level assembly and fail to provide multi-layer routing.

Conventional packages and thermal boards thus have major deficiencies. For instance, dielectrics with low thermal conductivity such as epoxy limit heat dissipation, whereas dielectrics with higher thermal conductivity such as epoxy filled with ceramic or silicon carbide have low adhesion and are prohibitively expensive for high volume manufacture. The dielectric may delaminate during manufacture or prematurely during operation due to the heat. The substrate may have single layer circuitry with limited routing capability or multi-layer circuitry with thick dielectric layers which reduce heat dissipation. The heat spreader may be inefficient, cumbersome or difficult to thermally connect to the next level assembly. The manufacturing process may be unsuitable for low cost, high volume manufacture.

In view of the various development stages and limitations in currently available packages and thermal boards for high power semiconductor devices, there is a need for a semiconductor chip assembly that is cost effective, reliable, manufacturable, versatile, provides flexible signal routing and has excellent heat spreading and dissipation.

SUMMARY OF THE INVENTION

The present invention provides a semiconductor chip assembly that includes a semiconductor device, a heat spreader, a conductive trace and an adhesive. The heat spreader includes a post, a base, an ESD protection layer and an underlayer. The conductive trace includes a pad and a terminal. The semiconductor device is electrically connected to the conductive trace, electrically isolated from the underlayer and thermally connected to the heat spreader. The post extends upwardly from the base into an opening in the adhesive, the base extends laterally from the post and the ESD protection layer is sandwiched between the base and the underlayer. The conductive trace provides signal routing between the pad and the terminal.

In accordance with an aspect of the present invention, a semiconductor chip assembly includes a semiconductor device, an adhesive, a heat spreader and a conductive trace. The adhesive includes an opening. The heat spreader includes a post, a base, an ESD protection layer and an underlayer, wherein (i) the post is adjacent to the base and extends above the base in an upward direction, (ii) the base extends below the post in a downward direction opposite the upward direction and extends laterally from the post in lateral directions orthogonal to the upward and downward directions, (iii) the ESD protection layer is a thermally conductive, electrically insulative material that contacts and is sandwiched between and thermally connects and electrically isolates the base and the underlayer, extends below the base and extends laterally beyond the post, and (iv) the underlayer extends below the ESD protection layer and extends laterally beyond the post. The conductive trace includes a pad and a terminal.

The semiconductor device overlaps the post, the base, the ESD protection layer and the underlayer, is electrically connected to the pad and thereby electrically connected to the terminal, is electrically isolated from the underlayer and is thermally connected to the post and thereby thermally connected to the underlayer. The adhesive is mounted on and extends above the base, extends laterally from the post to or beyond the terminal and is sandwiched between the base and the pad. The post extends into the opening and the underlayer extends below the semiconductor device and the pad.

In accordance with another aspect of the present invention, a semiconductor chip assembly includes a semiconductor device, an adhesive, a heat spreader, a substrate and a conductive trace. The adhesive includes an opening. The heat spreader includes a post, a base, an ESD protection layer and an underlayer, wherein (i) the post is adjacent to and integral with the base and extends above the base in an upward direction, (ii) the base extends below the post in a downward direction opposite the upward direction and extends laterally from the post in lateral directions orthogonal to the upward and downward directions, (iii) the ESD protection layer is a thermally conductive, electrically insulative material that contacts and is sandwiched between and thermally connects and electrically isolates the base and the underlayer, extends below the base and extends laterally beyond the post, and (iv) the underlayer extends below the ESD protection layer and extends laterally beyond the post. The substrate includes a dielectric layer and an aperture extends through the substrate. The conductive trace includes a pad and a terminal.

The semiconductor device overlaps the post, the base, the ESD protection layer and the underlayer, is electrically connected to the pad and thereby electrically connected to the terminal, is electrically isolated from the underlayer and is thermally connected to the post and thereby thermally connected to the underlayer. The adhesive is mounted on and extends above the base, extends laterally from the post to or beyond the terminal and is sandwiched between the base and the pad. The substrate is mounted on the adhesive and extends above the base. The post extends into the opening and the aperture and the underlayer extends below the semiconductor device and the pad.

The heat spreader can include a cap that extends above and is adjacent to and covers in the upward direction and extends laterally from a top of the post. For instance, the cap can have a rectangular or square shape and the top of the post can have a circular shape. In this instance, the cap can be sized and shaped to accommodate a thermal contact surface of the semiconductor device whereas the top of the post is not sized and shaped to accommodate the thermal contact surface of the semiconductor device. The cap can also contact and cover a portion of the adhesive that is coplanar with and adjacent to the post. The cap can also contact and overlap the dielectric layer. The cap can also be coplanar with the pad above the adhesive and the dielectric layer at a top surface that faces in the upward direction. Furthermore, the cap and the pad can have the same thickness where closest to one another and different thickness where the cap is adjacent to the post. In addition, the cap can be thermally connected to the underlayer by the post, the base and the ESD protection layer.

The heat spreader can include the post, the base, the cap, the ESD protection layer and the underlayer. The heat spreader can also include the terminal as well as any other terminals on the thermal board. The heat spreader can also consist essentially of copper, aluminum or copper/nickel/aluminum and the ESD protection layer. The heat spreader can also include a buried copper, aluminum or copper/nickel/aluminum core shared by the post, the base and the cap and plated surface contacts that consist of gold, silver and/or nickel at the cap and the underlayer. In any case, the heat spreader provides heat dissipation and spreading from the semiconductor device to the next level assembly.

The semiconductor device can be mounted on the heat spreader and the conductive trace. For instance, the semiconductor device can be mounted on and overlap the post and the pad, be electrically connected to the pad using a first solder joint and be thermally connected to the heat spreader using a second solder joint. Alternatively, the semiconductor device can be mounted on and overlap the post but not the conductive trace, be electrically connected to the pad using a wire bond and be thermally connected to the heat spreader using a die attach.

The semiconductor device can be a packaged or unpackaged semiconductor chip. For instance, the semiconductor device can be an LED package that includes an LED chip, is mounted on the cap and the pad, overlaps the post and the pad, is electrically connected to the pad using a first solder joint and is thermally connected to the cap using a second solder joint. Alternatively, the semiconductor device can be a semiconductor chip such as an LED chip that is mounted on the cap but not the pad, overlaps the post but not the pad, is electrically connected to the pad using a wire bond and is thermally connected to the cap using a die attach.

The adhesive can contact the post and the dielectric layer in a gap in the aperture between the post and the substrate, extend across the dielectric layer in the gap and contact the base and the dielectric layer outside the gap. The adhesive can also cover and surround the post in the lateral directions, cover the underlayer outside the post in the upward direction and cover the cap outside the post in the downward direction. The adhesive can also conformally coat the sidewalls of the post and top surface portions of the base. The adhesive can also fill the space between the post and the dielectric layer and between the base and the substrate. The adhesive can also extend below the post.

The adhesive can extend laterally from the post to or beyond the terminal. For instance, the adhesive and the terminal can extend to peripheral edges of the assembly. In this instance, the adhesive extends laterally from the post to the terminal. Alternatively, the adhesive can extend to peripheral edges of the assembly and the terminal can be spaced from the peripheral edges of the assembly. In this instance, the adhesive extends laterally from the post beyond the terminal.

The adhesive alone can intersect an imaginary horizontal line between the post and the dielectric layer, an imaginary vertical line between the base and the cap and an imaginary vertical line between the base and the dielectric layer.

The post can be integral with the base. For instance, the post and the base can be a single-piece metal or include a single-piece metal at their interface, and the single-piece metal can be copper. The post can also be coplanar with the adhesive above the dielectric layer at the cap and below the dielectric layer at the base. The post can also have a cut-off conical or pyramidal shape in which its diameter decreases as it extends upwardly from the base to its top.

The base can cover the post in the downward direction, support the substrate and the adhesive and extend to or be spaced from the peripheral edges of the assembly. The base can also be thicker than the pad, the terminal and the underlayer.

The ESD protection layer can cover the post in the downward direction and extend to or be spaced from the peripheral edges of the assembly. Furthermore, the ESD protection layer can be various thermally conductive, electrically insulative organic or inorganic materials such as epoxy or polyimide filled with aluminum oxide or aluminum nitride, or diamond-like carbon (DLC).

The underlayer can cover the post in the downward direction and extend to or be spaced from the peripheral edges of the assembly. Furthermore, the terminal and the underlayer can have the same thickness where closest to one another and be coplanar with one another below the ESD protection layer at a bottom surface that faces in the downward direction.

The substrate can be spaced from the heat spreader. The substrate can also be a laminated structure.

The conductive trace can include a routing line that extends above the base, the adhesive, the dielectric layer and the ESD protection layer in an electrically conductive path between the pad and the terminal. Likewise, the conductive trace can include a plated through-hole that extends through the base, the adhesive, the dielectric layer and the ESD protection layer in an electrically conductive path between the pad and the terminal. For instance, the pad can extend above the base, the adhesive, the dielectric layer and the ESD protection layer, the terminal can extend below the base, adhesive, the dielectric layer and the ESD protection layer and the plated through-hole can extend through the base, the adhesive, the dielectric layer and the ESD protection layer and electrically connect the pad and the terminal. Likewise, the pad and the routing line can extend above the base, the adhesive, the dielectric layer and the ESD protection layer, the terminal can extend below the base, the adhesive, the dielectric layer and the ESD protection layer and the plated through-hole can extend through the base, the adhesive, the dielectric layer and the ESD protection layer and electrically connect the routing line and the terminal.

The conductive trace can contact the heat spreader where the terminal contacts the ESD protection layer. For instance, the pad can contact the dielectric layer and be spaced from the base, the adhesive and the ESD protection layer, the terminal can contact the ESD protection layer and be spaced from the base, the adhesive and the dielectric layer and the plated through-hole extend through the base, the adhesive, the dielectric layer and the ESD protection layer to provide vertical signal routing between the pad and the terminal. Likewise, the pad and the routing line can contact the dielectric layer and be spaced from the base, the adhesive and the ESD protection layer, the terminal can contact the ESD protection layer and be spaced from the base, the adhesive and the dielectric layer and the plated through-hole can extend through the base, the adhesive, the dielectric layer and the ESD protection layer to provide horizontal signal routing between the pad and the plated through-hole and vertical signal routing between the routing line and the terminal. Furthermore, the plated through-hole can extend to a peripheral edge of the assembly or be spaced from the peripheral edges of the assembly.

The conductive trace can be integral with the heat spreader. For instance, the pad and the cap can be merged into a single unitary dual-purpose pad that overlaps and is adjacent to and thermally connected to the post. In this instance, the pad is shared by the conductive trace and the heat spreader and serves as the pad for the conductive trace and the cap for the heat spreader.

The conductive trace can consist of the pad, the terminal and the plated through-hole. The conductive trace can also consist essentially of copper. The conductive trace can also include a buried copper core and plated surface contacts that consist of gold, silver and/or nickel at the pad and the terminal. In any case, the conductive trace provides signal routing between the pad and the terminal.

The pad can be an electrical contact for the semiconductor device, the terminal can be an electrical contact for the next level assembly, and the pad and the terminal can provide signal routing between the semiconductor device and the next level assembly.

The pad, the terminal, the cap, the plated through-hole and the underlayer can be the same metals and the post and the base can be the same metal. For instance, the pad, the terminal, the cap, the plated through-hole and the underlayer can include a gold, silver or nickel surface layer and a buried copper core and be primarily copper and the post and the base can be copper. In this instance, a plated contact can include a gold or silver surface layer and a buried nickel layer that contacts and is sandwiched between the surface layer and the buried copper core or a nickel surface layer that contacts the buried copper core.

The heat spreader can include a copper core shared by the post, the base and the cap and the conductive trace can include a copper core shared by the pad, the terminal and the plated through-hole. For instance, the heat spreader can include a gold, silver or nickel surface layer at the cap and the underlayer, a buried copper core at the cap, the post and the base and be primarily copper outside the ESD protection layer. In this instance, the cap can include a plated contact as its surface layer and the underlayer can include a plated contact as its surface layer. Likewise, the conductive trace can include a gold, silver or nickel surface layer at the pad and the terminal, a buried copper core at the pad, the terminal and the plated through-hole and be primarily copper. In this instance, the pad can include a plated contact as its surface layer and the terminal can include a plated contact as its surface layer.

The assembly can be a first-level or second-level single-chip or multi-chip device. For instance, the assembly can be a first-level package that contains a single chip or multiple chips. Alternatively, the assembly can be a second-level module that contains a single LED package or multiple LED packages, and each LED package can contain a single LED chip or multiple LED chips.

The present invention provides a method of making a semiconductor chip assembly that includes providing a post, a base, an ESD protection layer and a metal layer, wherein the post extends above the base and the ESD protection layer is sandwiched between the base and the metal layer, mounting an adhesive on the base including inserting the post into an opening in the adhesive, mounting a conductive layer on the adhesive including aligning the post with an aperture in the conductive layer, then flowing the adhesive upward between the post and the conductive layer, solidifying the adhesive, then providing a conductive trace that includes a pad, a terminal and a selected portion of the conductive layer, providing a heat spreader that includes the post, the base, the ESD protection layer and an underlayer that includes at least a portion of the metal layer, then mounting a semiconductor device on the post, electrically connecting the semiconductor device to the conductive trace and thermally connecting the semiconductor device to the heat spreader.

In accordance with an aspect of the present invention, a method of making a semiconductor chip assembly includes (1) providing a post, a base, an ESD protection layer, a metal layer, an adhesive and a conductive layer, wherein (a) the post is adjacent to the base, extends above the base in an upward direction, extends into an opening in the adhesive and is aligned with an aperture in the conductive layer, (b) the base extends below the post in a downward direction opposite the upward direction and extends laterally from the post in lateral directions orthogonal to the upward and downward directions, (c) the ESD protection layer is a thermally conductive, electrically insulative material that contacts and is sandwiched between the base and the metal layer, extends below the base and extends laterally beyond the post, (d) the metal layer extends below the ESD protection layer and extends laterally beyond the post, (e) the adhesive is mounted on and extends above the base, is sandwiched between the base and the conductive layer and is non-solidified, and (f) the conductive layer is mounted on and extends above the adhesive, then (2) flowing the adhesive into and upward in a gap located in the aperture between the post and the conductive layer, (3) solidifying the adhesive, then (4) providing a conductive trace that includes a pad, a terminal and a selected portion of the conductive layer, (5) providing a heat spreader that includes the post, the base, the ESD protection layer and an underlayer that includes at least a portion of the metal layer, then (6) mounting a semiconductor device on the post, wherein the semiconductor device overlaps the post, the base, the ESD protection layer and the underlayer and is electrically isolated from the underlayer, (7) electrically connecting the semiconductor device to the pad, thereby electrically connecting the semiconductor device to the terminal, and (8) thermally connecting the semiconductor device to the post, thereby thermally connecting the semiconductor device to the underlayer.

In accordance with another aspect of the present invention, a method of making a semiconductor chip assembly includes (1) providing a post, a base, an ESD protection layer and a metal layer, wherein (a) the post is adjacent to and integral with the base and extends above the base in an upward direction, (b) the base extends below the post in a downward direction opposite the upward direction and extends laterally from the post in lateral directions orthogonal to the upward and downward directions, (c) the ESD protection layer is a thermally conductive, electrically insulative material that contacts and is sandwiched between the base and the metal layer, extends below the base and extends laterally beyond the post and (d) the metal layer extends below the ESD protection layer and extends laterally beyond the post, (2) providing an adhesive, wherein an opening extends through the adhesive, (3) providing a conductive layer, wherein an aperture extends through the conductive layer, (4) mounting the adhesive on the base, including inserting the post into the opening, wherein the adhesive extends above the base and the post extends into the opening, (5) mounting the conductive layer on the adhesive, including aligning the post with the aperture, wherein the conductive layer extends above the adhesive and the adhesive is sandwiched between the base and the conductive layer and is non-solidified, then (6) applying heat to melt the adhesive, (7) moving the base and the conductive layer towards one another, thereby moving the post upward in the aperture and applying pressure to the molten adhesive between the base and the conductive layer, wherein the pressure forces the molten adhesive to flow into and upward in a gap located in the aperture between the post and the conductive layer, (8) applying heat to solidify the molten adhesive, thereby mechanically attaching the post and the base to the conductive layer, then (9) providing a conductive trace that includes a pad, a terminal and a selected portion of the conductive layer, (10) providing a heat spreader that includes the post, the base, the ESD protection layer and an underlayer that includes at least a portion of the metal layer, then (11) mounting a semiconductor device on the post, wherein the semiconductor device overlaps the post, the base, the ESD protection layer and the underlayer and is electrically isolated from the underlayer, (12) electrically connecting the semiconductor device to the pad, thereby electrically connecting the semiconductor device to the terminal, and (13) thermally connecting the semiconductor device to the post, thereby thermally connecting the semiconductor device to the underlayer.

Mounting the conductive layer can include mounting the conductive layer alone on the adhesive, or alternatively, attaching the conductive layer to a carrier, then mounting the conductive layer and the carrier on the adhesive such that the carrier overlaps the conductive layer and the conductive layer contacts the adhesive and is sandwiched between the adhesive and the carrier, and then, after solidifying the adhesive, removing the carrier and then providing the conductive trace. As another alternative, mounting the conductive layer can include mounting the conductive layer and a dielectric layer on the adhesive such that the conductive layer overlaps the dielectric layer and is spaced from the adhesive and the dielectric layer contacts and is sandwiched between the conductive layer and the adhesive.

In accordance with another aspect of the present invention, a method of making a semiconductor chip assembly includes (1) providing a post, a base, an ESD protection layer, a metal layer, an adhesive and a substrate, wherein (a) the post is adjacent to the base, extends above the base in an upward direction, extends into an opening in the adhesive and is aligned with an aperture in the substrate, (b) the base extends below the post in a downward direction opposite the upward direction and extends laterally from the post in lateral directions orthogonal to the upward and downward directions, (c) the ESD protection layer is a thermally conductive, electrically insulative material that contacts and is sandwiched between the base and the metal layer, extends below the base and extends laterally beyond the post, (d) the metal layer extends below the ESD protection layer and extends laterally beyond the post, (e) the adhesive is mounted on and extends above the base, is sandwiched between the base and the substrate and is non-solidified, and (f) the substrate is mounted on and extends above the adhesive, wherein the substrate includes a conductive layer and a dielectric layer and the conductive layer extends above the dielectric layer, then (2) flowing the adhesive into and upward in a gap located in the aperture between the post and the substrate, (3) solidifying the adhesive, then (4) providing a plated through-hole that extends through the base, the adhesive, the dielectric layer and the ESD protection layer and is spaced from the base, then (5) providing a conductive trace that includes a pad, a terminal and the plated through-hole, wherein the pad includes a selected portion of the conductive layer, the terminal includes a selected portion of the metal layer and an electrically conductive path between the pad and the terminal includes the plated through-hole, (6) providing a heat spreader that includes the post, the base, the ESD protection layer and an underlayer that includes a selected portion of the metal layer, then (7) mounting a semiconductor device on the post, wherein the semiconductor device overlaps the post, the base, the ESD protection layer and the underlayer and is electrically isolated from the underlayer, (8) electrically connecting the semiconductor device to the pad, thereby electrically connecting the semiconductor device to the terminal, and (9) thermally connecting the semiconductor device to the post, thereby thermally connecting the semiconductor device to the underlayer.

In accordance with another aspect of the present invention, a method of making a semiconductor chip assembly includes (1) providing a post, a base, an ESD protection layer and a metal layer, wherein (a) the post is adjacent to and integral with the base and extends above the base in an upward direction, (b) the base extends below the post in a downward direction opposite the upward direction and extends laterally from the post in lateral directions orthogonal to the upward and downward directions, (c) the ESD protection layer is a thermally conductive, electrically insulative material that contacts and is sandwiched between the base and the metal layer, extends below the base and extends laterally beyond the post and (d) the metal layer extends below the ESD protection layer and extends laterally beyond the post, (2) providing an adhesive, wherein an opening extends through the adhesive, (3) providing a substrate that includes a conductive layer and a dielectric layer, wherein an aperture extends through the substrate, (4) mounting the adhesive on the base, including inserting the post through the opening, wherein the adhesive extends above the base and the post extends through the opening, (5) mounting the substrate on the adhesive, including inserting the post into the aperture, wherein the substrate extends above the adhesive, the conductive layer extends above the dielectric layer, the post extends through the opening into the aperture and the adhesive is sandwiched between the base and the substrate and is non-solidified, then (6) applying heat to melt the adhesive, (7) moving the base and the substrate towards one another, thereby moving the post upward in the aperture and applying pressure to the molten adhesive between the base and the substrate, wherein the pressure forces the molten adhesive to flow into and upward in a gap located in the aperture between the post and the substrate, (8) applying heat to solidify the molten adhesive, thereby mechanically attaching the post and the base to the substrate, then (9) providing a plated through-hole that extends through the base, the adhesive, the dielectric layer and the ESD protection layer and is spaced from the base, then (10) providing a conductive trace that includes a pad, a terminal and the plated through-hole, wherein the pad includes a selected portion of the conductive layer, the terminal includes a selected portion of the metal layer and an electrically conductive path between the pad and the terminal includes the plated through-hole, (11) providing a heat spreader that includes the post, the base, the ESD protection layer, a cap and an underlayer, wherein the cap is above and adjacent to and covers in the upward direction and extends laterally from a top of the post and includes a selected portion of the conductive layer and the underlayer includes a selected portion of the metal layer, then (12) mounting a semiconductor device on the cap, wherein the semiconductor device overlaps the post, the base, the cap, the ESD protection layer and the underlayer and is electrically isolated from the underlayer, (13) electrically connecting the semiconductor device to the pad, thereby electrically connecting the semiconductor device to the terminal, and (14) thermally connecting the semiconductor device to the cap, thereby thermally connecting the semiconductor device to the underlayer.

Providing the post, the base, the ESD protection layer and the metal layer can include providing a metal plate, attaching the ESD protection layer and the metal layer to the metal plate and then providing the post and the base by etching the metal plate.

Attaching the ESD protection layer and the metal layer to the metal plate can include laminating the metal plate to the metal layer using the ESD protection layer or depositing the ESD protection layer on the metal plate and then depositing the metal layer on the ESD protection layer. For instance, uncured epoxy or polyimide filled with aluminum oxide or aluminum nitride can be sandwiched between the metal plate and the metal layer and then cured, thereby laminating the metal plate to the metal layer. Alternatively, DLC can be deposited on the metal plate by vacuum coating or spray coating and then the metal layer can be deposited on the DLC by sputtering or electroless plating and then electroplating.

Providing the post and the base can include forming an etch mask on the metal plate that selectively exposes the metal plate and defines the post, etching the metal plate in a pattern defined by the etch mask, thereby forming a recess in the metal plate that extends into but not through the metal plate, wherein the post is an unetched portion of the metal plate that protrudes above the base and is laterally surrounded by the recess and the base is an unetched portion of the metal plate below the post and the recess and then removing the etch mask.

Providing the adhesive can include providing a prepreg with uncured epoxy, flowing the adhesive can include melting the uncured epoxy and compressing the uncured epoxy between the base and the substrate, and solidifying the adhesive can include curing the molten uncured epoxy.

Providing the heat spreader can include providing a cap on the post that extends above and is adjacent to and covers in the upward direction and extends laterally from a top of the post after solidifying the adhesive and before mounting the semiconductor device.

Providing the pad can include removing selected portions of the conductive layer after solidifying the adhesive. The removing can include applying a wet chemical etch to the conductive layer using an etch mask that defines the pad such that the pad includes a selected portion of the conductive layer.

Providing the cap can include removing selected portions of the conductive layer after solidifying the adhesive. The removing can include applying a wet chemical etch to the conductive layer using an etch mask that defines the cap such that the cap includes a selected portion of the conductive layer.

Providing the terminal can include removing selected portions of the metal layer after solidifying the adhesive. The removing can include applying a wet chemical etch to the metal layer using an etch mask that defines the terminal such that the terminal includes a selected portion of the metal layer.

Providing the underlayer can include removing selected portions of the metal layer after solidifying the adhesive. The removing can include applying a wet chemical etch to the metal layer using an etch mask that defines the underlayer such that the underlayer includes a selected portion of the metal layer.

Providing the pad and the cap can include removing selected portions of the conductive layer using an etch mask that defines the pad and the cap. Thus, the pad and the cap can be formed simultaneously using the same etch mask and wet chemical etch.

Providing the terminal and the underlayer can include removing selected portions of the metal layer using an etch mask that defines the terminal and the underlayer. Thus, the terminal and the underlayer can be formed simultaneously using the same etch mask and wet chemical etch.

Providing the pad can include grinding the post, the adhesive and the conductive layer after solidifying the adhesive such that the post, the adhesive and the conductive layer are laterally aligned with one another at a top lateral surface that faces in the upward direction, and then removing selected portions of the conductive layer such that the pad includes a selected portion of the conductive layer. The grinding can include grinding the adhesive without grinding the post and then grinding the post, the adhesive and the conductive layer. The removing can include applying a wet chemical etch to the conductive layer using an etch mask that defines the pad.

Providing the terminal can include grinding the adhesive and the metal layer after solidifying the adhesive such that the adhesive and the metal layer are laterally aligned with one another at a bottom lateral surface that faces in the downward direction, and then removing selected portions of the metal layer such that the terminal includes a selected portion of the metal layer. The grinding can include grinding the adhesive without grinding the metal layer and then grinding the adhesive and the metal layer. The removing can include applying a wet chemical etch to the metal layer using an etch mask that defines the terminal.

Providing the pad and the cap can include depositing a plated layer on the post, the adhesive and the conductive layer after the grinding and then removing selected portions of the conductive layer and the plated layer such that the pad and the cap include selected portions of the conductive layer and the plated layer. Depositing the plated layer can include electrolessly plating a first plated layer on the post, the adhesive and the conductive layer and then electroplating a second plated layer on the first plated layer. The removing can include applying the wet chemical etch to the conductive layer and the plated layer using the etch mask to define the pad and the cap.

Providing the terminal and the underlayer can include depositing a plated layer on the metal layer after solidifying the adhesive and then removing selected portions of the metal layer and the plated layer such that the terminal and the underlayer include selected portions of the metal layer and the plated layer. Depositing the plated layer can include electrolessly plating a first plated layer on the metal layer and then electroplating a second plated layer on the first plated layer. The removing can include applying the wet chemical etch to the metal layer and the plated layer using the etch mask to define the terminal and the underlayer.

Providing the conductive trace can include providing the pad, the terminal and a plated through-hole in an electrically conductive path between the pad and the terminal. The plated through-hole can be formed before the pad and the terminal and extend through the conductive layer, the dielectric layer, the adhesive, the base, the ESD protection layer and the metal layer.

Providing the pad and the plated through-hole can include providing a hole that extends through the base, the adhesive, the dielectric layer, the conductive layer, the metal layer and the ESD protection after solidifying the adhesive, then depositing a plated layer on the conductive layer and into the hole, wherein the plated layer forms an upper plated layer that covers the post in the upward direction and the plated through-hole in the hole, then forming an etch mask on the upper plated layer that defines the pad, etching the conductive layer and the upper plated layer in a pattern defined by the etch mask and then removing the etch mask.

Providing the terminal and the plated through-hole can include providing a hole that extends through the base, the adhesive, the dielectric layer, the conductive layer, the metal layer and the ESD protection after solidifying the adhesive, then depositing a plated layer on the metal layer and into the hole, wherein the plated layer forms a lower plated layer that covers the post in the downward direction and the plated through-hole in the hole, then forming an etch mask on the lower plated layer that defines the terminal, etching the metal layer and the lower plated layer in a pattern defined by the etch mask and then removing the etch mask.

Providing the pad, the terminal, the plated through-hole and the underlayer can include providing a hole that extends through the base, the adhesive, the dielectric layer, the conductive layer, the metal layer and the ESD protection after solidifying the adhesive, then depositing a plated layer on the conductive layer and the metal layer, wherein the plated layer forms an upper plated layer that covers the post in the upward direction, a lower plated layer that covers the post in the downward direction and the plated through-hole in the hole, then forming a first etch mask on the upper plated layer that defines the pad, etching the conductive layer and the upper plated layer in a pattern defined by the first etch mask, forming a second etch mask on the lower plated layer that defines the terminal and the underlayer, etching the metal layer and the lower plated layer in a pattern defined by the second etch mask and removing the etch masks.

Providing the pad, the terminal, the plated through-hole, the cap and the underlayer can include providing a hole that extends through the base, the adhesive, the dielectric layer, the conductive layer, the metal layer and the ESD protection after solidifying the adhesive, then depositing a plated layer on the post, the conductive layer and the metal layer, wherein the plated layer forms an upper plated layer that covers the post in the upward direction, a lower plated layer that covers the post in the downward direction and the plated through-hole in the hole, then forming a first etch mask on the upper plated layer that defines the pad and the cap, etching the conductive layer and the upper plated layer in a pattern defined by the first etch mask, forming a second etch mask on the lower plated layer that defines the terminal and the underlayer, etching the metal layer and the lower plated layer in a pattern defined by the second etch mask and removing the etch masks.

Providing the hole can include providing an inner hole that extends through and is coaxial with an outer hole. For instance, providing the hole can include forming an outer hole that extends through the base, the metal layer and the ESD protection, then flowing the adhesive into the outer hole, then solidifying the adhesive and then forming an inner hole that extends through the base, the adhesive, the dielectric layer, the conductive layer, the metal layer and the ESD protection layer and also extends through the outer hole, thereby providing the hole as the inner hole. In this instance, the adhesive can fill the outer hole or an insulative filler be deposited into and fill the remaining space in the outer hole. Alternatively, providing the hole can include forming an outer hole that extends through the base, the adhesive, the dielectric layer, the conductive layer, the metal layer and the ESD protection after solidifying the adhesive, then depositing an insulative filler into the outer hole and then forming an inner hole that extends through the base, the adhesive, the dielectric layer, the conductive layer, the metal layer, the ESD protection layer and the insulative filler and also extends through the outer hole, thereby providing the hole as the inner hole. Furthermore, the inner hole and outer hole can each be formed in a single step by mechanical drilling or laser drilling or multiple steps in which the base, the conductive layer and/or the metal layer are opened by wet chemical etching and the adhesive, the dielectric layer, the ESD protection layer and/or the insulative filler are opened by laser drilling or plasma etching.

Etching the conductive layer and the upper plated layer can include exposing the dielectric layer in the upward direction without exposing the adhesive or the ESD protection layer in the upward direction, and etching the metal layer and the lower plated layer can include exposing the ESD protection layer in the downward direction without exposing the adhesive or the dielectric layer in the downward direction.

The pad can be formed before, during or after the terminal is formed. Thus, the pad and the terminal can be formed simultaneously using the same wet chemical etch and different etch masks or sequentially using different etch masks. Likewise, the cap can be formed before, during or after the underlayer is formed. Thus, the cap and the underlayer can be formed simultaneously using the same wet chemical etch and different etch masks or sequentially using different etch masks. Similarly, the pad, the terminal, the cap and the underlayer can be formed simultaneously or sequentially.

Flowing the adhesive can include filling the gap with the adhesive. Flowing the adhesive can also include squeezing the adhesive through the gap, above the post and the substrate and on top surface portions of the post and the substrate adjacent to the gap.

Solidifying the adhesive can include mechanically bonding the post and the base to the substrate.

Mounting the semiconductor device on the post can include mounting the semiconductor device on the cap and thus the post. Mounting the semiconductor device can also include positioning the semiconductor device above and overlapping the post, the cap, the adhesive and the dielectric layer without overlapping the plated through-hole, or alternatively, positioning the semiconductor device above and overlapping the post, the cap, the opening and the aperture without overlapping the adhesive, the dielectric layer and the plated through-hole.

Mounting the semiconductor device can include providing a first solder joint between an LED package that includes an LED chip and the pad and a second solder joint between the LED package and the post, electrically connecting the semiconductor device can include providing the first solder joint between the LED package and the pad, and thermally connecting the semiconductor device can include providing the second solder joint between the LED package and the post.

Mounting the semiconductor device can include providing a die attach between a semiconductor chip such as an LED chip and the post, electrically connecting the semiconductor device can include providing a wire bond between the chip and the pad, and thermally connecting the semiconductor device can include providing the die attach between the chip and the post.

The semiconductor device can be encapsulated by providing an encapsulant on the thermal board that covers the semiconductor device in the upward direction.

The adhesive can contact the post, the base, the cap, the dielectric layer and the plated through-hole, be spaced from the terminal and the underlayer, cover the substrate in the downward direction, cover and surround the post in the lateral directions and extend to peripheral edges of the assembly after the assembly is manufactured and detached from other assemblies in a batch.

The base can cover the semiconductor device, the post, the cap and the dielectric layer but not the terminal, the underlayer, the ESD protection layer and the plated through-hole in the downward direction, support the substrate and the adhesive and extend to peripheral edges of the assembly after the assembly is manufactured and detached from other assemblies in a batch.

The ESD protection layer can cover the semiconductor device, the post, the base, the cap and the dielectric layer but not the terminal, the underlayer and the plated through-hole in the downward direction and extend to peripheral edges of the assembly after the assembly is manufactured and detached from other assemblies in a batch.

The underlayer can cover the semiconductor device, the post and the cap but not the base, the terminal, the adhesive, the dielectric layer, the ESD protection layer and the plated through-hole in the downward direction and be spaced from peripheral edges of the assembly after the assembly is manufactured and detached from other assemblies in a batch.

The present invention has numerous advantages. The heat spreader can provide excellent heat spreading and heat dissipation without heat flow through the adhesive. As a result, the adhesive can be a low cost dielectric with low thermal conductivity and not prone to delamination. The post and the base can be integral with one another, thereby enhancing reliability. The post can provide thermal expansion matching with a semiconductor device mounted thereon, thereby increasing reliability. The cap can be customized for the semiconductor device, thereby enhancing the thermal connection. The adhesive can be sandwiched between the post and the substrate and between the base and the substrate, thereby providing a robust mechanical bond between the heat spreader and the substrate. The ESD protection layer can protect the semiconductor device from electrostatic discharge in the underlayer. The conductive trace can provide signal routing with simple circuitry patterns or flexible multi-layer signal routing with complex circuitry patterns. The conductive trace can also provide vertical signal routing between the pad above the base and the terminal below the base. The plated through-hole can be formed after the adhesive is solidified and remain a hollow tube or be split at a peripheral edge of the assembly. As a result, a solder joint subsequently reflowed on the terminal can wet and flow into the plated through-hole without creating a buried void in the solder joint beneath the plated through-hole that might otherwise occur if the plated through-hole is filled with the adhesive or another non-wettable insulator, thereby increasing reliability. The base can provide mechanical support for the substrate, thereby preventing warping. The assembly can be manufactured using low temperature processes which reduces stress and improves reliability. The assembly can also be manufactured using well-controlled processes which can be easily implemented by circuit board, lead frame and tape manufacturers.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE INVENTION

Figure 1A:
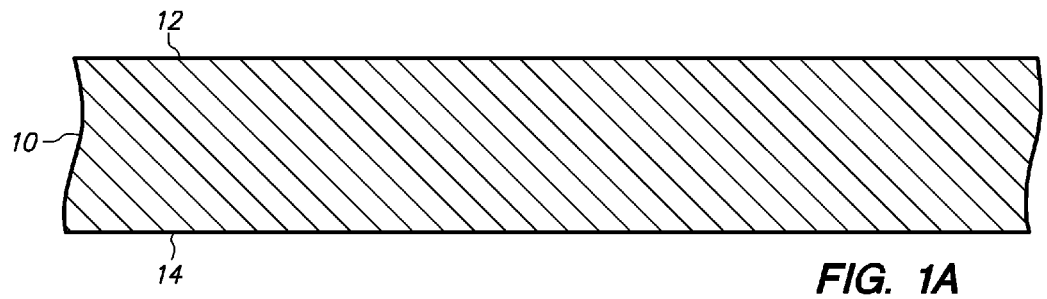
FIGS. 1A-1F are cross-sectional views showing a method of making a post, a base, an ESD protection layer and a metal layer in accordance with an embodiment of the present invention.
Figure 1B:
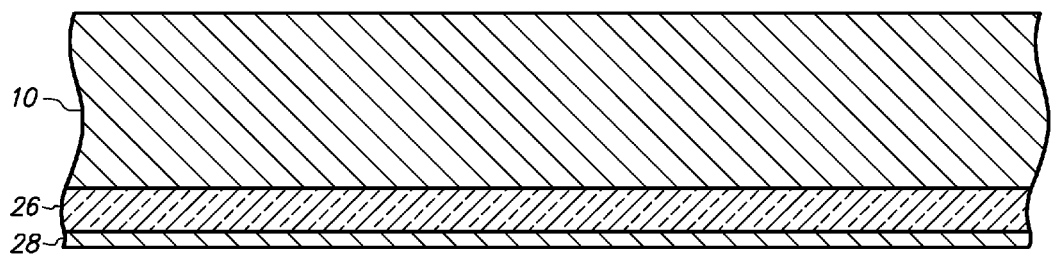
Figure 1C:
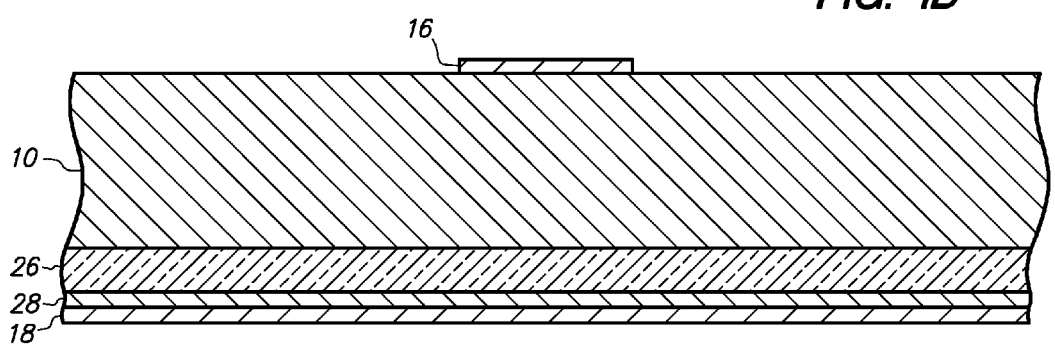
Figure 1D:
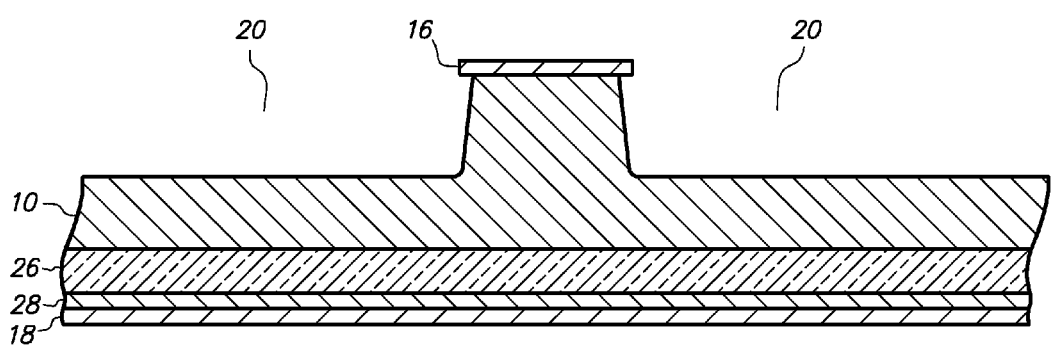
Figure 1E:
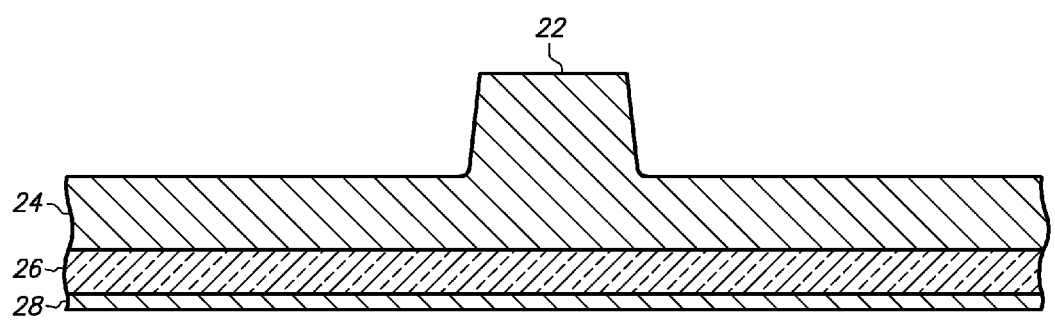
Figure 1F:
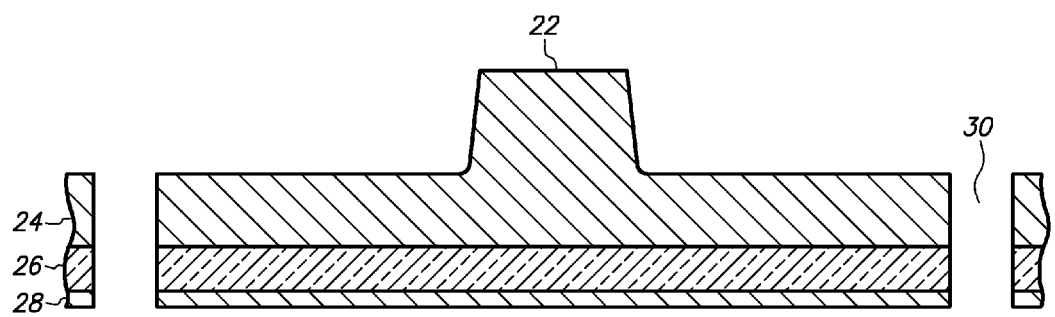
Figure 1G:
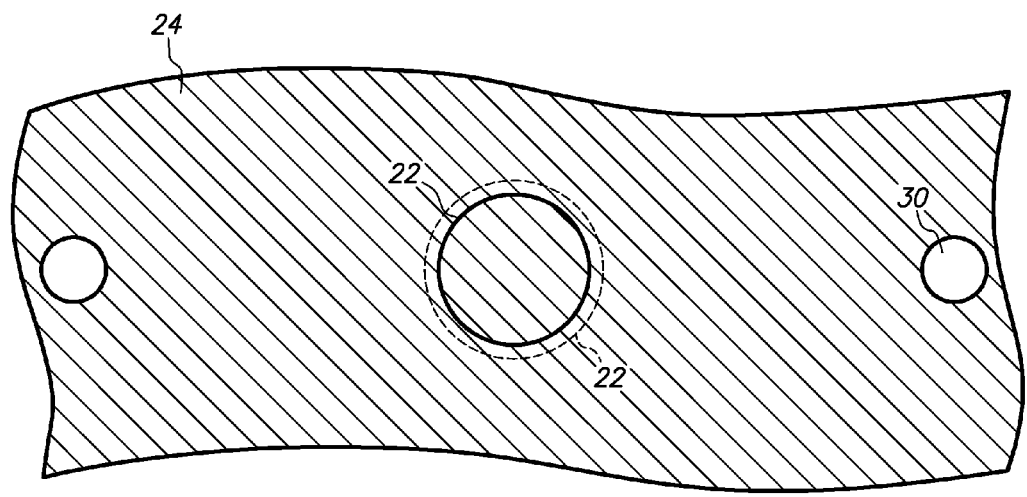
FIGS. 1G and 1H are top and bottom views, respectively, corresponding to FIG. 1F.
Figure 1H:
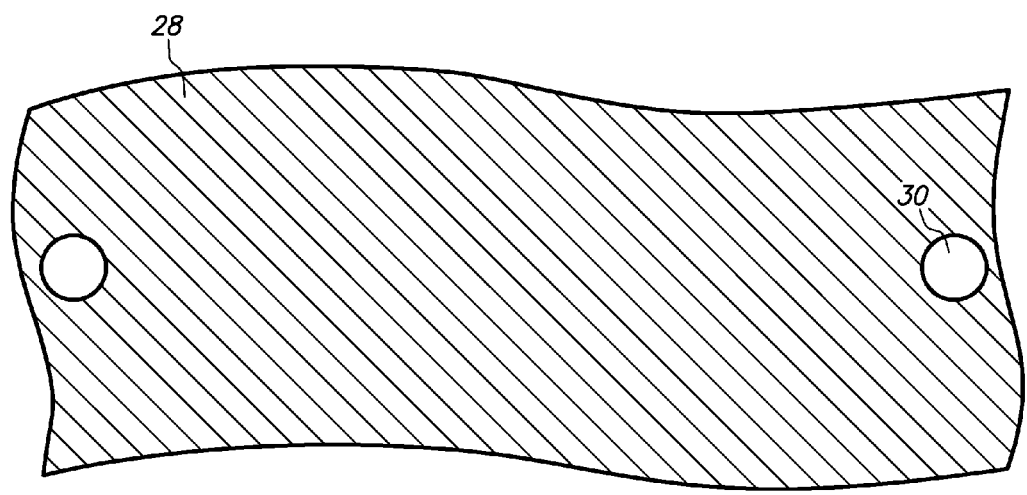

FIGS. 1A-1F are cross-sectional views showing a method of making a post, a base, an ESD protection layer and a metal layer in accordance with an embodiment of the present invention, and FIGS. 1G and 1H are top and bottom views, respectively, corresponding to FIG. 1F.

FIG. 1A. is a cross-sectional view of metal plate 10 which includes opposing major surfaces 12 and 14. Metal plate 10 is illustrated as a copper plate with a thickness of 400 microns. Copper has high thermal conductivity, good bondability and low cost. Metal plate 10 can be various metals such as copper, aluminum, alloy 42, iron, nickel, silver, gold, combinations thereof, and alloys thereof.

Metal plate 10 provides the foundation for a unified structure that includes post 22, base 24, ESD protection layer 26 and metal layer 28 as described below.

FIG. 1B. is a cross-sectional view of ESD protection layer 26 and metal layer 28 attached to metal plate 10.

ESD (electrostatic discharge) protection layer 26 is an electrical insulator with high thermal conductivity. ESD protection layer 26 is illustrated as epoxy filled with aluminum nitride. Thus, the filler is aluminum nitride particles dispersed in the epoxy. ESD protection layer 26 is an unpatterned dielectric sheet with a thickness of 100 microns.

Metal layer 28 is an electrical conductor with high thermal conductivity and is illustrated as an unpatterned copper sheet with a thickness of 30 microns.

FIG. 1C is a cross-sectional view of etch mask 16 and cover mask 18 formed on metal plate 10 and metal layer 28. Etch mask 16 and cover mask 18 are illustrated as photoresist layers which are deposited on metal plate 10 and metal layer 28, respectively, using dry film lamination in which hot rolls simultaneously press photoresist layers 16 and 18 onto metal plate 10 and metal layer 28, respectively. Wet spin coating and curtain coating are also suitable deposition techniques. A reticle (not shown) is positioned proximate to photoresist layer 16. Thereafter, photoresist layer 16 is patterned by selectively applying light through the reticle so that the photoresist portions exposed to the light are rendered insoluble, applying a developer solution to remove the photoresist portions that are unexposed to the light and remain soluble and then hard baking, as is conventional. As a result, photoresist layer 16 has a pattern that selectively exposes surface 12 in the upward direction, and photoresist layer 18 remains unpatterned and covers metal layer 28 in the downward direction.

FIG. 1D is a cross-sectional view of recess 20 formed into but not through metal plate 10 by etching metal plate 10 in the pattern defined by etch mask 16. The etching is illustrated as a frontside wet chemical etch. For instance, the structure can be inverted so that etch mask 16 faces downward and cover mask 18 faces upward as a bottom spray nozzle (not shown) that faces etch mask 16 upwardly sprays the wet chemical etch on metal plate 10 and etch mask 16 while a top spray nozzle (not shown) that faces cover mask 18 is deactivated so that gravity assists with removing the etched byproducts. Alternatively, the structure can be dipped in the wet chemical etch since cover mask 18 provides backside protection. The wet chemical etch is highly selective of copper and etches 200 microns into metal plate 10. As a result, recess 20 extends from surface 12 into but not through metal plate 10, is spaced from surface 14 by 200 microns and has a depth of 200 microns. The wet chemical etch also laterally undercuts metal plate 10 beneath etch mask 16. A suitable wet chemical etch can be provided by a solution containing alkaline ammonia or a dilute mixture of nitric and hydrochloric acid. Likewise, the wet chemical etch can be acidic or alkaline. The optimal etch time for forming recess 20 without excessively exposing metal plate 10 to the wet chemical etch can be established through trial and error.

FIG. 1E is a cross-sectional view of post 22, base 24, ESD protection layer 26 and metal layer 28 after etch mask 16 and cover mask 18 are removed. The photoresist layers are stripped using a solvent, such as a strong alkaline solution containing potassium hydroxide with a pH of 14, that is highly selective of photoresist with respect to copper and epoxy.

Metal plate 10 as etched includes post 22 and base 24.

Post 22 is an unetched portion of metal plate 10 defined by etch mask 16. Post 22 is adjacent to and integral with and protrudes above base 24, is laterally surrounded by recess 20 and is spaced from ESD protection layer 26 and metal layer 28. Post 22 has a height of 200 microns (recess 20 depth), a diameter at its top surface (circular portion of surface 12) of 1000 microns and a diameter at its bottom (circular portion adjacent to base 24) of 1200 microns. Thus, post 22 has a cut-off conical shape (resembling a frustum) with tapered sidewalls in which its diameter decreases as it extends upwardly from base 24 to its flat circular top surface. The tapered sidewalls arise from the lateral undercutting by the wet chemical etch beneath etch mask 16. The top surface is concentrically disposed within a periphery of the bottom (shown in phantom in FIG. 1G).

Base 24 is an unetched portion of metal plate 10 that is located below post 22, covers post 22 in the downward direction, extends laterally from post 22 in a lateral plane (with lateral directions such as left and right) and has a thickness of 200 microns (400–200). Base 24 is located above ESD protection layer 26.

ESD protection layer 26 contacts and is sandwiched between and thermally connects and electrically isolates base 24 and metal layer 28, covers post 22 in the downward direction and extends laterally beyond post 22.

Metal layer 28 is located below ESD protection layer 26, covers post 22 in the downward direction and extends laterally beyond post 22.

Post 22 and base 24 are illustrated as a subtractively formed single-piece metal (copper). Post 22 and base 24 can also be a stamped single-piece metal formed by stamping metal plate 10 with a contact piece with a recess or hole that defines post 22. Post 22 can also be formed additively by depositing post 22 on base 24 using electroplating, chemical vapor deposition (CVD), physical vapor deposition (PVD) and so on, for instance by electroplating a solder post 22 on a copper base 24, in which case post 22 and base 24 have a metallurgical interface and are adjacent to but not integral with one another. Post 22 can also be formed semi-additively, for instance by depositing upper portions of post 22 on etch-defined lower portions of post 22. Post 22 can also be formed semi-additively by depositing conformal upper portions of post 22 on etch-defined lower portions of post 22. Post 22 can also be sintered to base 24.

Post 22, base 24 and metal layer 28 can be treated to improve bondability to epoxy and solder. For instance, post 22, base 24 and metal layer 28 can be chemically oxidized or microetched to provide rougher surfaces.

FIGS. 1F, 1G and 1H are cross-sectional, top and bottom views, respectively, of the structure with outer hole 30. Outer hole 30 is a through-hole that extends through base 24, ESD protection layer 26 and metal layer 28 and has a diameter of 500 microns. Outer hole 30 is formed by mechanical drilling although other techniques such as laser drilling, plasma etching and wet chemical etching can be used.

Figure 2A:
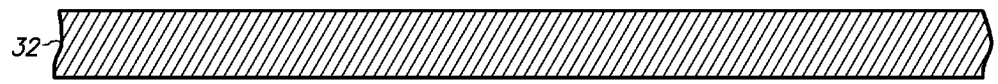
FIGS. 2A and 2B are cross-sectional views showing a method of making an adhesive in accordance with an embodiment of the present invention.
Figure 2B:
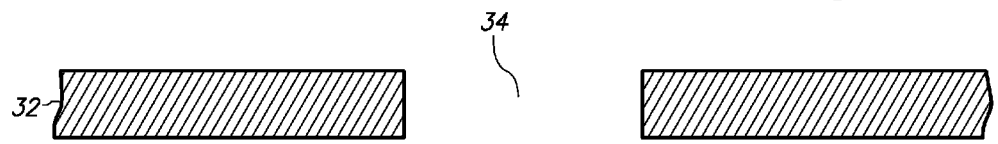
Figure 2C:
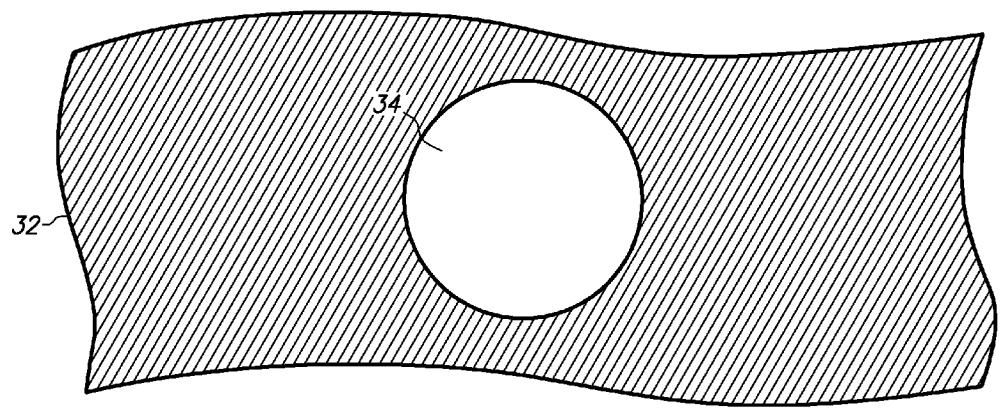
FIGS. 2C and 2D are top and bottom views, respectively, corresponding to FIG. 2B.
Figure 2D:
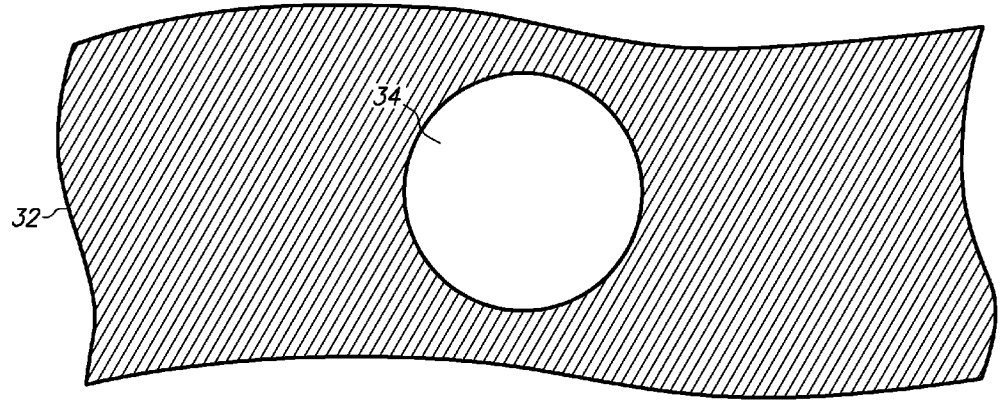

FIGS. 2A and 2B are cross-sectional views showing a method of making an adhesive in accordance with an embodiment of the present invention, and FIGS. 2C and 2D are top and bottom views, respectively, corresponding to FIG. 2B.

FIG. 2A is a cross-sectional view of adhesive 32. Adhesive 32 is illustrated as a prepreg with B-stage uncured epoxy provided as a non-solidified unpatterned sheet with a thickness of 130 microns.

Adhesive 32 can be various dielectric films or prepregs formed from numerous organic or inorganic electrical insulators. For instance, adhesive 32 can initially be a prepreg in which thermosetting epoxy in resin form impregnates a reinforcement and is partially cured to an intermediate stage. The epoxy can be FR-4 although other epoxies such as polyfunctional and bismaleimide triazine (BT) are suitable. For specific applications, cyanate esters, polyimide and PTFE are also suitable. The reinforcement can be E-glass although other reinforcements such as S-glass, D-glass, quartz, kevlar aramid and paper are suitable. The reinforcement can also be woven, non-woven or random microfiber. A filler such as silica (powdered fused quartz) can be added to the prepreg to improve thermal conductivity, thermal shock resistance and thermal expansion matching. Commercially available prepregs such as SPEEDBOARD C prepreg by W.L. Gore & Associates of Eau Claire, Wis. are suitable.

FIGS. 2B, 2C and 2D are cross-sectional, top and bottom views, respectively, of adhesive 32 with opening 34. Opening 34 is a window that extends through adhesive 32 and has a diameter of 1250 microns. Opening 34 is formed by mechanical drilling through the prepreg and can be formed by other techniques such as punching and stamping.

Figure 3A:
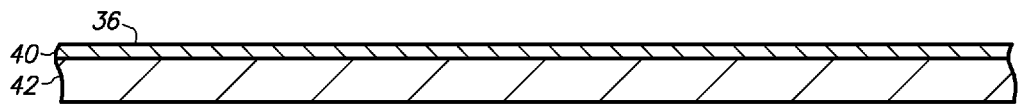
FIGS. 3A and 3B are cross-sectional views showing a method of making a substrate in accordance with an embodiment of the present invention.
Figure 3B:
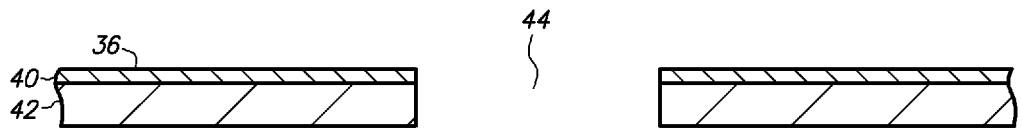
Figure 3C:
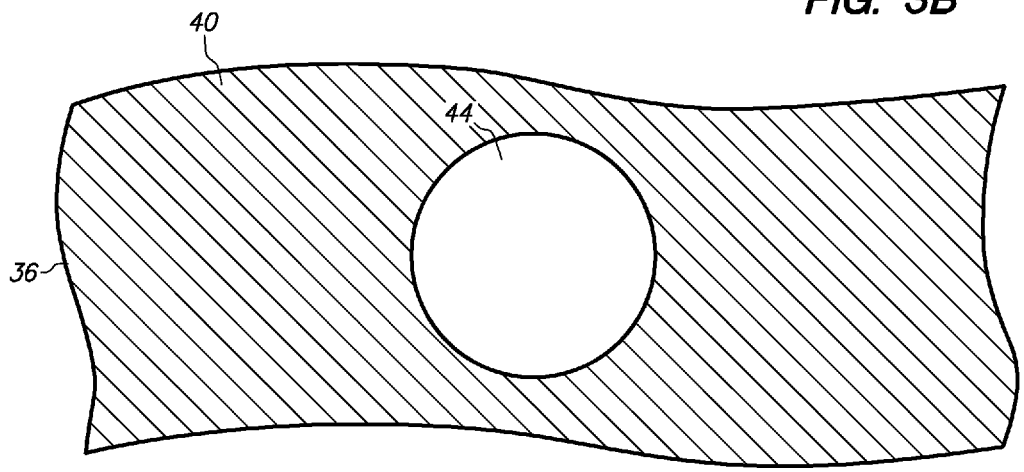
FIGS. 3C and 3D are top and bottom views, respectively, corresponding to FIG. 3B.
Figure 3D:
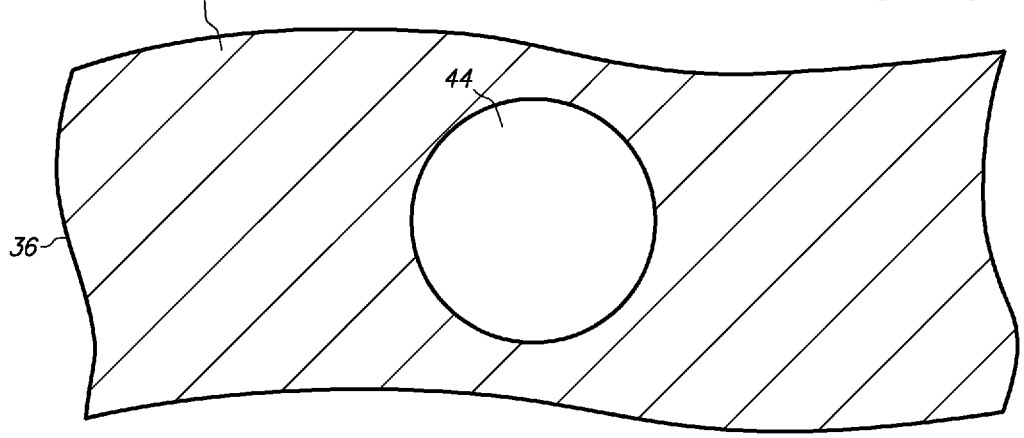

FIGS. 3A and 3B are cross-sectional views showing a method of making a substrate in accordance with an embodiment of the present invention, and FIGS. 3C and 3D are top and bottom views, respectively, corresponding to FIG. 3B.

FIG. 3A is a cross-sectional view of substrate 36 that includes conductive layer 40 and dielectric layer 42. Conductive layer 40 is an electrical conductor that contacts and extends above dielectric layer 42, and dielectric layer 42 is an electrical insulator. For instance, conductive layer 40 is an unpatterned copper sheet with a thickness of 30 microns, and dielectric layer 42 is epoxy with a thickness of 100 microns.

FIGS. 3B, 3C and 3D are cross-sectional, top and bottom views, respectively, of substrate 36 with aperture 44. Aperture 44 is a window that extends through substrate 36 and has a diameter of 1250 microns. Aperture 44 is formed by mechanical drilling through conductive layer 40 and dielectric layer 42 and can be formed with other techniques such as punching and stamping. Preferably, opening 34 and aperture 44 have the same diameter and are formed in the same manner with the same drill bit at the same drilling station.

Substrate 36 is illustrated as a laminated structure. Substrate 36 can be other electrical interconnects such as a ceramic board or a printed circuit board. Likewise, substrate 36 can include additional layers of embedded circuitry.

Figure 4A:
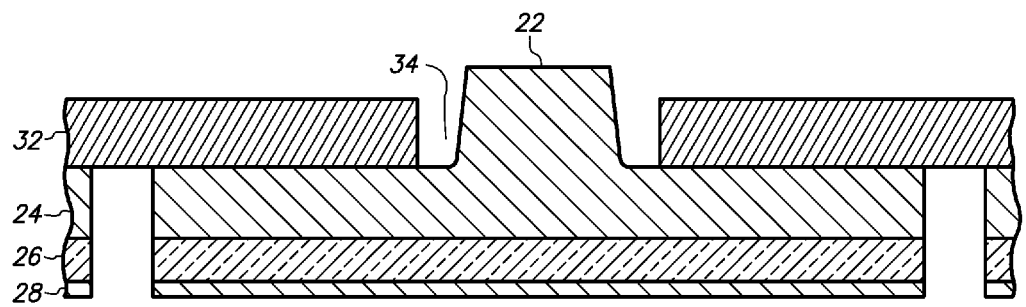
FIGS. 4A-4L are cross-sectional views showing a method of making a thermal board in accordance with an embodiment of the present invention.
Figure 4B:
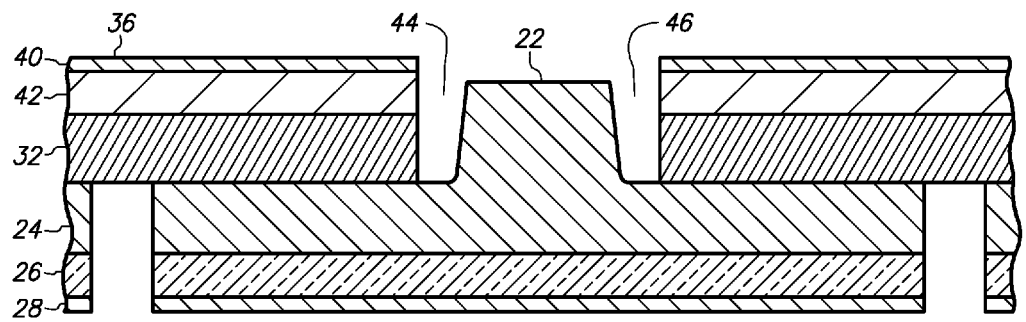
Figure 4C:
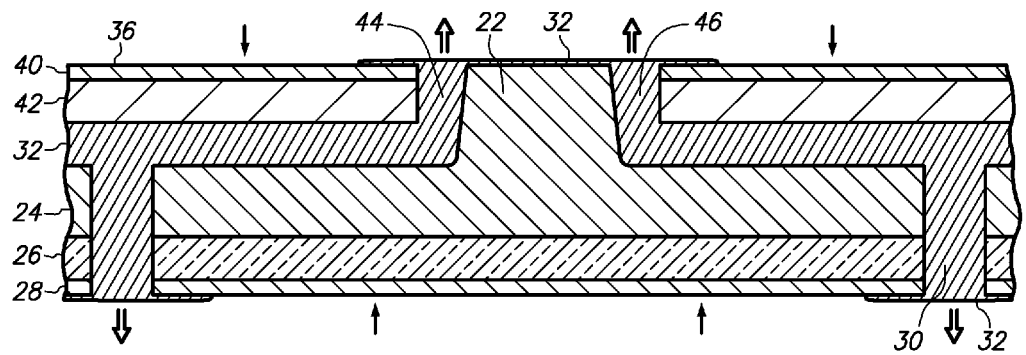
Figure 4D:
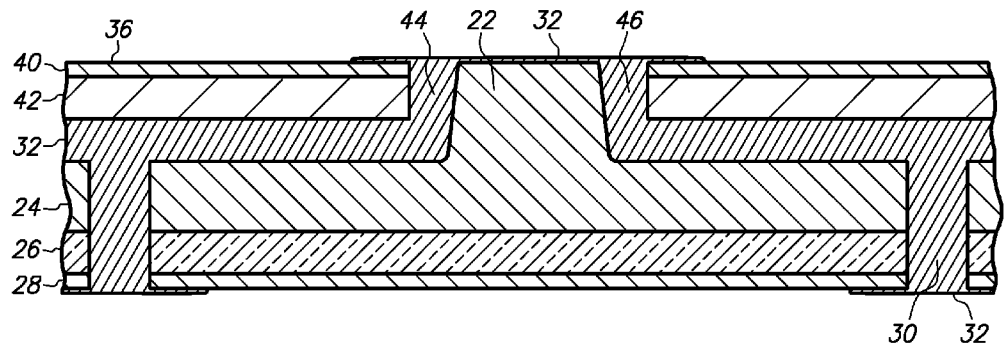
Figure 4E:
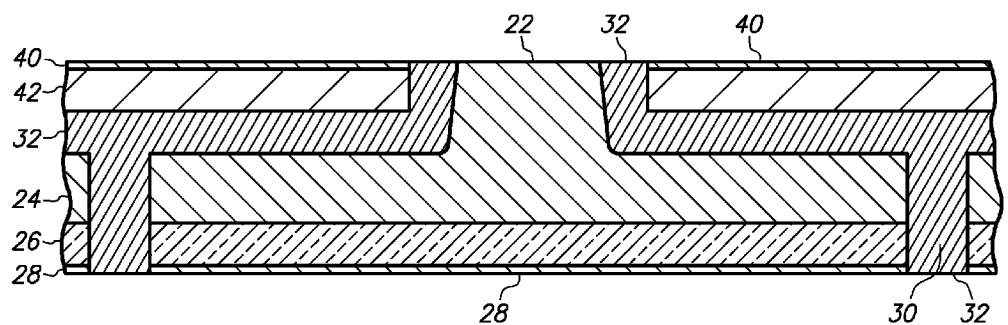
Figure 4F:
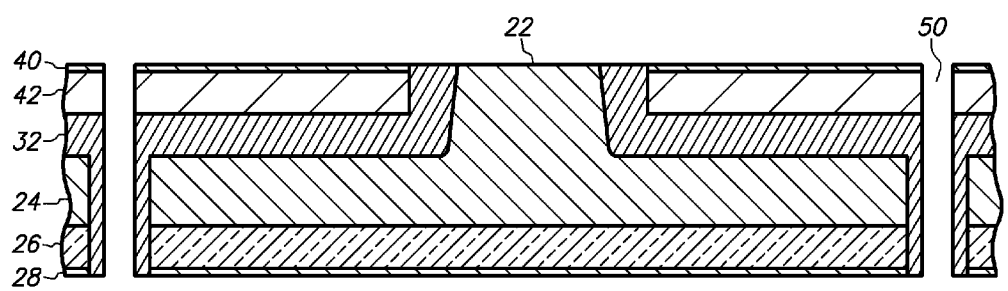
Figure 4G:
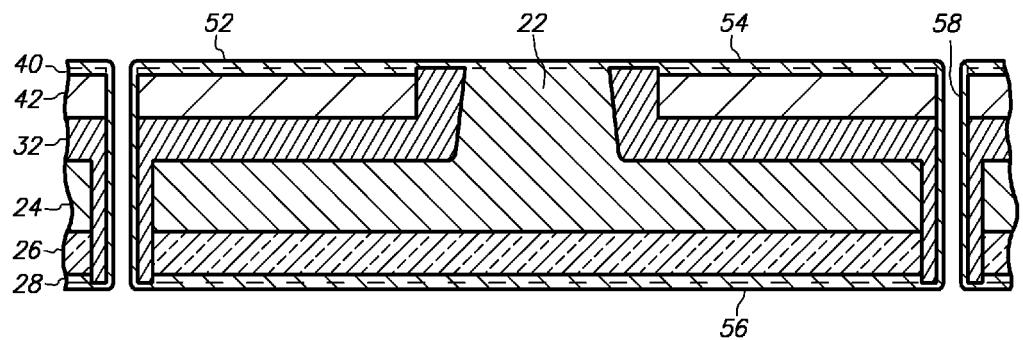
Figure 4H:
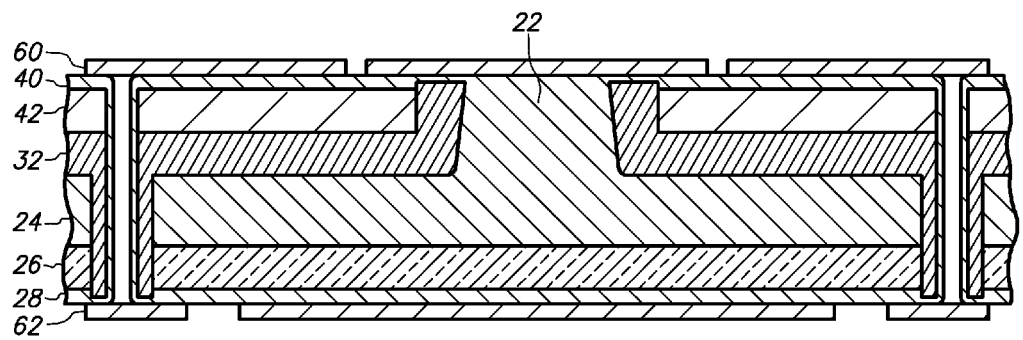
Figure 4I:
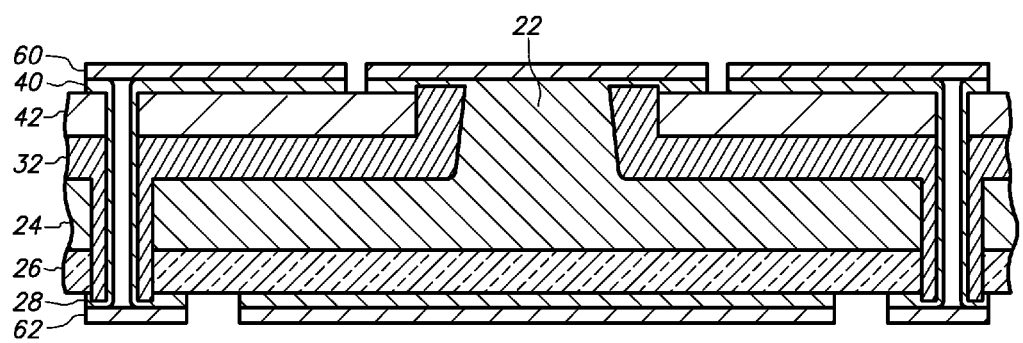
Figure 4J:
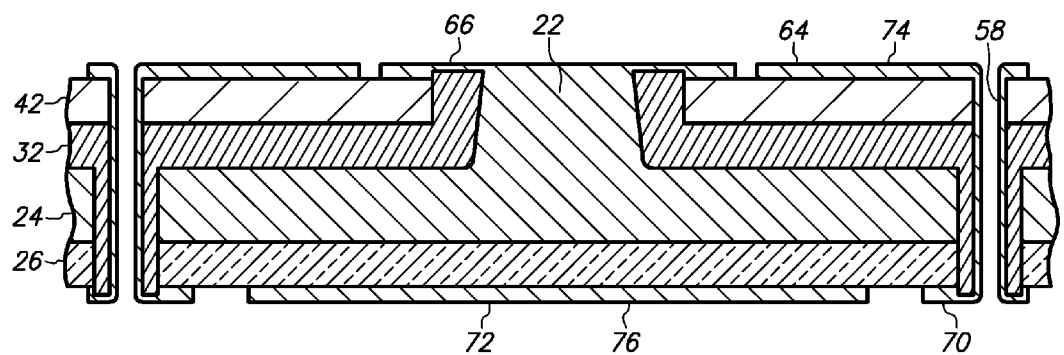
Figure 4K:
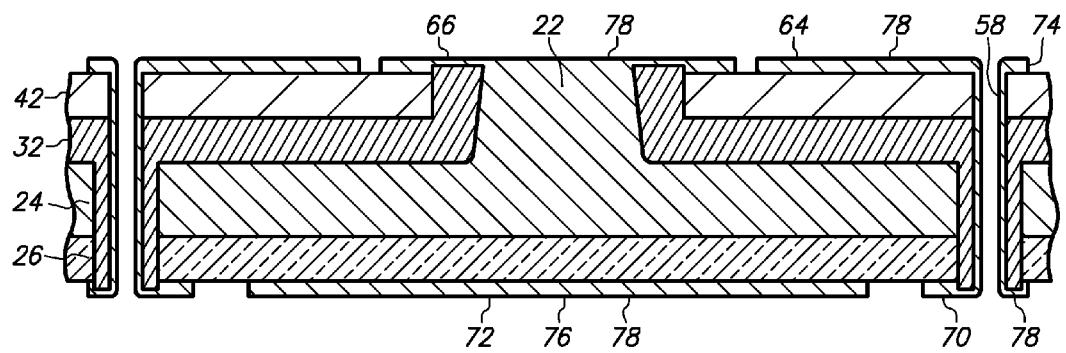
Figure 4L:
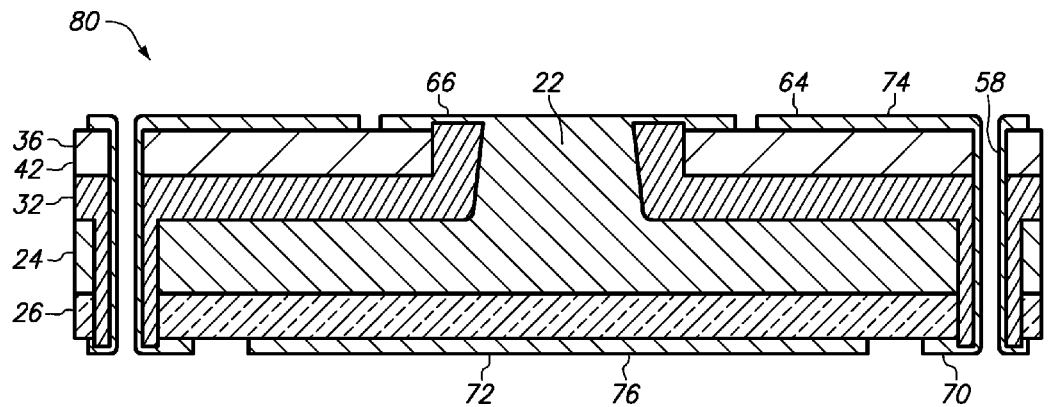
Figure 4M:
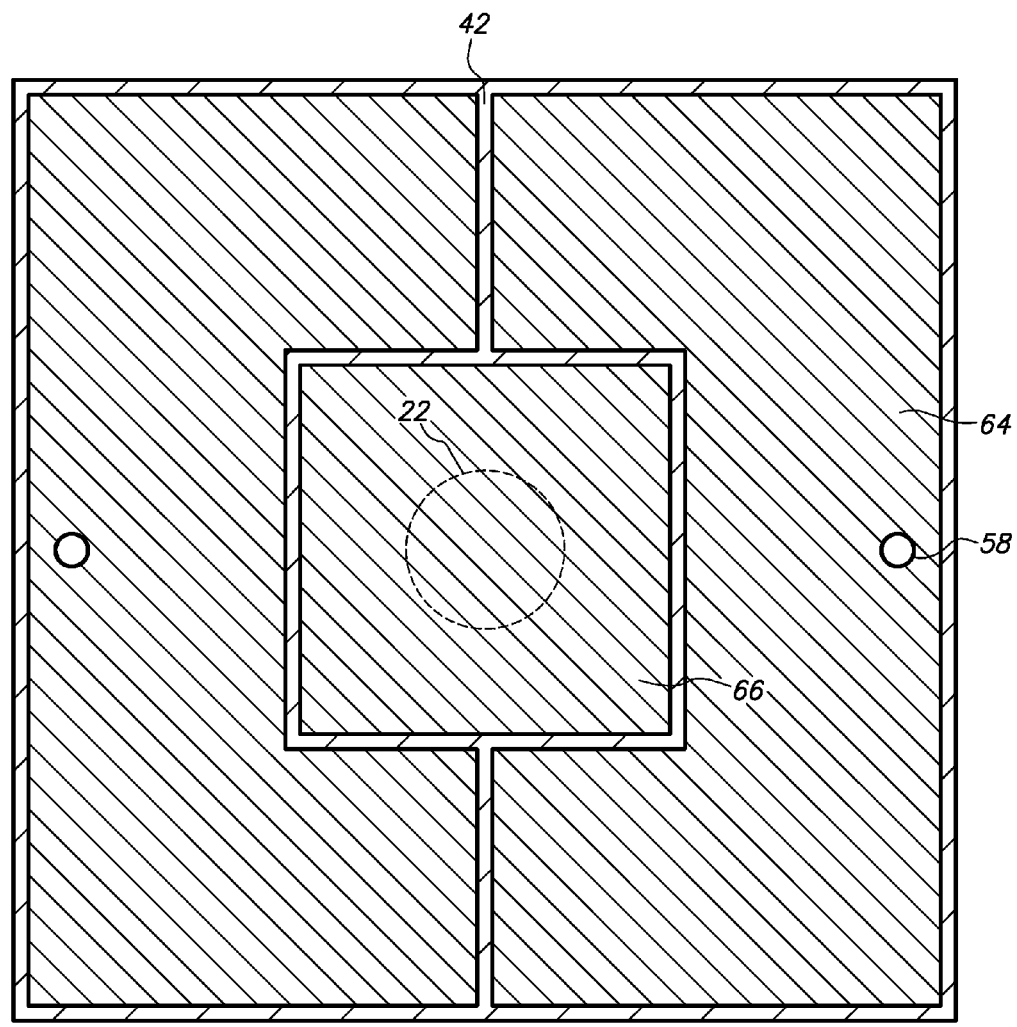
FIGS. 4M and 4N are top and bottom views, respectively, corresponding to FIG. 4L.
Figure 4N:
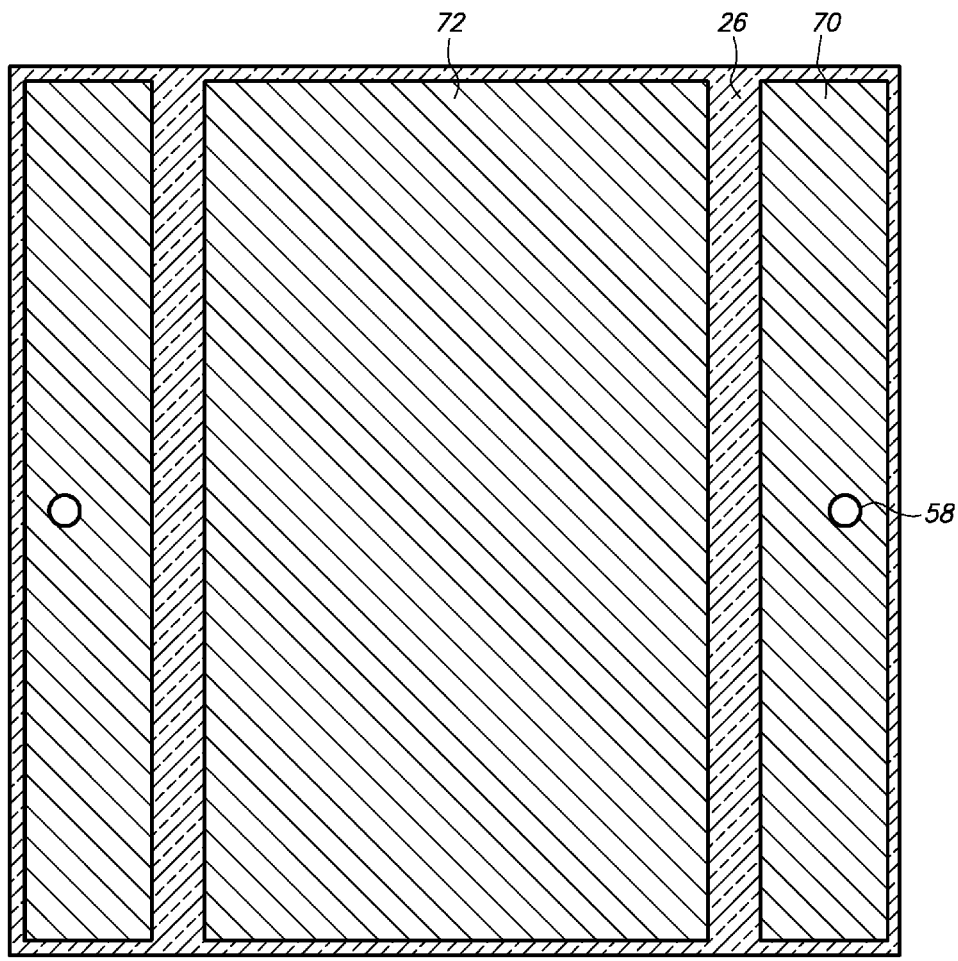

FIGS. 4A-4L are cross-sectional views showing a method of making a thermal board that includes post 22, base 24, ESD protection layer 26, metal layer 28, adhesive 32 and substrate 36 in accordance with an embodiment of the present invention, and FIGS. 4M and 4N are top and bottom views, respectively, corresponding to FIG. 4L.

FIG. 4A is a cross-sectional view of the structure with adhesive 32 mounted on base 24. Adhesive 32 is mounted by lowering it onto base 24 as post 22 is inserted into and through and upwards in opening 34. Adhesive 32 eventually contacts and rests on base 24. Preferably, post 22 is inserted into and extends through opening 34 without contacting adhesive 32 and is aligned with and centrally located within opening 34.

FIG. 4B is a cross-sectional view of the structure with substrate 36 mounted on adhesive 32. Substrate 36 is mounted by lowering it onto adhesive 32 as post 22 is inserted into and upwards in aperture 44. Substrate 36 eventually contacts and rests on adhesive 32.

Post 22 is inserted into but not through aperture 44 without contacting substrate 36 and is aligned with and centrally located within aperture 44. As a result, gap 46 is located in aperture 44 between post 22 and substrate 36. Gap 46 laterally surrounds post 22 and is laterally surrounded by substrate 36. In addition, opening 34 and aperture 44 are precisely aligned with one another and have the same diameter.

At this stage, substrate 36 is mounted on and contacts and extends above adhesive 32. Post 22 extends through opening 34 into aperture 44 to dielectric layer 42, is 60 microns below the top surface of conductive layer 40 and is exposed through aperture 44 in the upward direction. Adhesive 32 contacts and is sandwiched between base 24 and substrate 36, contacts dielectric layer 42 but is spaced from conductive layer 40 and remains a non-solidified prepreg with B-stage uncured epoxy, and gap 46 is filled with air.

FIG. 4C is a cross-sectional view of the structure with adhesive 32 in outer hole 30 and gap 46. Adhesive 32 is flowed into outer hole 30 and gap 46 by applying heat and pressure. In this illustration, adhesive 32 is forced into outer hole 30 and gap 46 by applying downward pressure to conductive layer 40 and/or upward pressure to metal layer 28, thereby moving base 24 and substrate 36 towards one another and applying pressure to adhesive 32 while simultaneously applying heat to adhesive 32. Adhesive 32 becomes compliant enough under the heat and pressure to conform to virtually any shape. As a result, adhesive 32 sandwiched between base 24 and substrate 36 is compressed, forced out of its original shape and flows into and upward in gap 46 and into and downward in outer hole 30. Base 24 and substrate 36 continue to move towards one another and adhesive 32 eventually fills outer hole 30 and gap 46. Moreover, adhesive 32 remains sandwiched between and continues to fill the reduced space between base 24 and substrate 36.

For instance, metal layer 28 and conductive layer 40 can be disposed between top and bottom platens (not shown) of a press. In addition, a top cull plate and top buffer paper (not shown) can be sandwiched between conductive layer 40 and the top platen, and a bottom cull plate and bottom buffer paper (not shown) can be sandwiched between metal layer 28 and the bottom platen. The stack includes the top platen, top cull plate, top buffer paper, substrate 36, adhesive 32, base 24, ESD protection layer 26, metal layer 28, bottom buffer paper, bottom cull plate and bottom platen in descending order. Furthermore, the stack may be positioned on the bottom platen by tooling pins (not shown) that extend upward from the bottom platen through registration holes (not shown) in base 24, ESD protection layer 26 and metal layer 28.

The platens are heated and move towards one another, thereby applying heat and pressure to adhesive 32. The cull plates disperse the heat from the platens so that it is more uniformly applied to metal layer 28 and substrate 36 and thus adhesive 32, and the buffer papers disperse the pressure from the platens so that it is more uniformly applied to metal layer 28 and substrate 36 and thus adhesive 32. Initially, dielectric layer 42 contacts and presses down on adhesive 32.

As the platen motion and heat continue, adhesive 32 between base 24 and substrate 36 is compressed, melted and flows into and upward in gap 46 and across dielectric layer 42 to conductive layer 40 as well as into and downward in outer hole 30 across base 24 and ESD protection layer 26 to metal layer 28. For instance, the uncured epoxy is melted by the heat and the molten uncured epoxy is squeezed by the pressure into outer hole 30 and gap 46, however the reinforcement and the filler remain between base 24 and substrate 36.

Adhesive 32 elevates more rapidly than post 22 in aperture 44 and fills gap 46. Adhesive 32 also rises slightly above gap 46 and overflows onto the top surfaces of post 22 and conductive layer 40 adjacent to gap 46 before the platen motion stops. This may occur due to the prepreg being slightly thicker than necessary. As a result, adhesive 32 creates a thin coating on the top surfaces of post 22 and conductive layer 40. The platen motion is eventually blocked by post 22 and the platens become stationary but continue to apply heat to adhesive 32.

Adhesive 32 descends in and fills outer hole 30. Adhesive 32 also extends slightly below outer hole 30 and overflows onto the bottom surface of metal layer 28 adjacent to outer hole 30 before the platen motion stops. This may occur due to the prepreg being slightly thicker than necessary. As a result, adhesive 32 creates a thin coating on the bottom surface of metal layer 28.

The upward flow of adhesive 32 in gap 46 is shown by the thick upward arrows, the downward flow of adhesive 32 in outer hole 30 is shown by the thick downward arrows, the upward motion of post 22, base 24, ESD protection layer 26 and metal layer 28 relative to substrate 36 is shown by the thin upward arrows, and the downward motion of substrate 36 relative to post 22, base 24, ESD protection layer 26 and metal layer 28 is shown by the thin downward arrows.

FIG. 4D is a cross-sectional view of the structure with adhesive 32 solidified.

For instance, the platens continue to clamp post 22 and metal layer 28 and apply heat after the platen motion stops, thereby converting the B-stage molten uncured epoxy into C-stage cured or hardened epoxy. Thus, the epoxy is cured in a manner similar to conventional multi-layer lamination. After the epoxy is cured, the platens move away from one another and the structure is released from the press.

Adhesive 32 as solidified provides a secure robust mechanical bond between post 22 and substrate 36 and between base 24 and substrate 36. Adhesive 32 can withstand normal operating pressure without distortion or damage and is only temporarily distorted under unusually high pressure. Furthermore, adhesive 32 can absorb thermal expansion mismatch between post 22 and substrate 36 and between base 24 and substrate 36.

At this stage, post 22 and conductive layer 40 are essentially coplanar with one another and adhesive 32 and conductive layer 40 extend to a top surface that faces in the upward direction. For instance, adhesive 32 between base 24 and dielectric layer 42 has a thickness of 70 microns which is 60 microns less than its initial thickness of 130 microns, post 22 ascends 60 microns in aperture 44 and substrate 36 descends 60 microns relative to post 22. The 200 micron height of post 22 is essentially the same as the combined height of conductive layer 40 (30 microns), dielectric layer 42 (100 microns) and the underlying adhesive 32 (70 microns). Furthermore, post 22 continues to be centrally located in opening 34 and aperture 44 and spaced from substrate 36 and adhesive 32 fills the space between post 22 and substrate 36, fills the space between base 24 and substrate 36 and fills outer hole 30 and gap 46. For instance, gap 46 (as well as adhesive 32 between post 22 and substrate 36) has a width of 125 microns ((1250−1000)/2) at the top surface of post 22.

Adhesive 32 extends across conductive layer 40 and dielectric layer 42 in gap 46. That is, adhesive 32 in gap 46 extends in the upward and downward directions across the thickness of conductive layer 40 and dielectric layer 42 at the outer sidewall of gap 46. Adhesive 32 also includes a thin top portion above gap 46 that contacts the top surfaces of post 22 and conductive layer 40 and extends above post 22 by 10 microns.

Adhesive 32 extends across base 24, ESD protection layer 26 and metal layer 28 in outer hole 30. That is, adhesive 32 in hole 30 extends in the upward and downward directions across the thickness of base 24, ESD protection layer 26 and metal layer 28 at the sidewall of outer hole 30. Adhesive 32 also includes a thin bottom portion below outer hole 30 that contacts the bottom surface of metal layer 28 and extends below metal layer 28 by 10 microns.

Substrate 36 covers outer hole 30 in the upward direction.

FIG. 4E is a cross-sectional view of the structure after upper portions of post 22, adhesive 32 and conductive layer 40 are removed and lower portions of metal layer 28 and adhesive 32 are removed.

Post 22, adhesive 32 and conductive layer 40 have their upper portions removed by grinding. For instance, a rotating diamond sand wheel and distilled water are applied to the top of the structure. Initially, the diamond sand wheel grinds only adhesive 32. As the grinding continues, adhesive 32 becomes thinner as its grinded surface migrates downwardly. Eventually the diamond sand wheel contacts post 22 and conductive layer 40 (not necessarily at the same time), and as a result, begins to grind post 22 and conductive layer 40 as well. As the grinding continues, post 22, adhesive 32 and conductive layer 40 become thinner as their grinded surfaces migrate downwardly. The grinding continues until the desired thickness has been removed. Thereafter, the structure is rinsed in distilled water to remove contaminants.

The grinding removes a 25 micron thick upper portion of adhesive 32, a 15 micron thick upper portion of post 22 and a 15 micron thick upper portion of conductive layer 40. The decreased thickness does not appreciably affect post 22 or adhesive 32. However, it substantially reduces the thickness of conductive layer 40 from 30 microns to 15 microns.

Metal layer 28 and adhesive 32 have their lower portions removed by grinding. For instance, a rotating diamond sand wheel and distilled water are applied to the bottom of the structure. Initially, the diamond sand wheel grinds only adhesive 32. As the grinding continues, adhesive 32 becomes thinner as its grinded surface migrates upwardly. Eventually the diamond sand wheel contacts metal layer 28, and as a result, begins to grind metal layer 28 as well. As the grinding continues, metal layer 28 and adhesive 32 become thinner as their grinded surfaces migrate upwardly. The grinding continues until the desired thickness has been removed. Thereafter, the structure is rinsed in distilled water to remove contaminants.

The grinding removes a 25 micron lower portion of adhesive 32 and a 15 micron thick lower portion of metal layer 28. The decreased thickness does not appreciably affect adhesive 32. However, it substantially reduces the thickness of metal layer 28 from 30 microns to 15 microns.

At this stage, post 22, adhesive 32 and conductive layer 40 are coplanar with one another at a smoothed lapped lateral top surface that is above dielectric layer 42 and faces in the upward direction. Likewise, metal layer 28 and adhesive 32 are coplanar with one another at a smoothed lapped lateral bottom surface that is below ESD protection layer 26 and faces in the downward direction.

FIG. 4F is a cross-sectional view of the structure with inner hole 50. Inner hole 50 is a through-hole that extends through base 24, ESD protection layer 26, metal layer 28, adhesive 32, conductive layer 40 and dielectric layer 42 and has a diameter of 300 microns. Inner hole 50 also extends through and is coaxial with outer hole 30. Inner hole 50 has its sidewall at adhesive 32, conductive layer 40 and dielectric layer 42 is spaced from base 24, ESD protection layer 26 and metal layer 28 by 100 microns ((500−300)/2). Inner hole 50 is formed by mechanical drilling although other techniques such as laser drilling, plasma etching and wet chemical etching can be used.

FIG. 4G is a cross-sectional view of the structure with plated layer 52 deposited on post 22, metal layer 28, adhesive 32, conductive layer 40 and dielectric layer 42. Plated layer 52 forms upper plated layer 54, lower plated layer 56 and plated through-hole 58.

Upper plated layer 54 is deposited on and contacts post 22, adhesive 32 and conductive layer 40 at the lateral top surface and covers them in the upward direction. Upper plated layer 54 is an unpatterned copper layer with a thickness of 20 microns.

Lower plated layer 56 is deposited on and contacts metal layer 28 and adhesive 32 at the lateral bottom surface and covers them in the downward direction. Lower plated layer 56 is an unpatterned copper layer with a thickness of 20 microns.

Plated through-hole 58 is deposited on and contacts adhesive 32, conductive layer 40 and dielectric layer 42 in inner hole 50 and covers the sidewall in the lateral directions. Plated through-hole 58 is a copper tube with a thickness of 20 microns and is adjacent to and integral with and electrically connects plated layers 54 and 56. Furthermore, plated through-hole 58 contacts adhesive 32, conductive layer 40 and dielectric layer 42 and is spaced from base 24, ESD protection layer 26 and metal layer 28 by 100 microns ((500−300)/2).

For instance, the structure is dipped in an activator solution to render adhesive 32 and dielectric layer 42 catalytic to electroless copper, then a first copper layer is electrolessly plated on post 22, metal layer 28, adhesive 32, conductive layer 40 and dielectric layer 42, and then a second copper layer is electroplated on the first copper layer. The first copper layer has a thickness of 2 microns, the second copper layer has a thickness of 18 microns, and plated layer 52 (and plated layers 54 and 56 and plated through-hole 58) has a thickness of 20 microns. As a result, metal layer 28 essentially grows and has a thickness of 35 microns (15+20) and conductive layer 40 essentially grows and has a thickness of 35 microns (15+20).

Upper plated layer 54 serves as a cover layer for post 22 and adhesive 32 and a build-up layer for conductive layer 40, lower plated layer 56 serves as a cover layer for adhesive 32 and a build-up layer for metal layer 28 and plated through-hole 58 serves as an electrical interconnect between plated layers 54 and 56 and thus metal layer 28 and conductive layer 40.

Post 22, conductive layer 40, upper plated layer 54 and plated through-hole 58 are shown as a single layer for convenience of illustration. Likewise, metal layer 28, lower plated layer 56 and plated through-hole 58 are shown as a single layer for convenience of illustration. The boundary (shown in phantom) between post 22 and upper plated layer 54, between conductive layer 40 and upper plated layer 54, between conductive layer 40 and plated through-hole 58 and between metal layer 28 and lower plated layer 56 may be difficult or impossible to detect since copper is plated on copper. However, the boundary between adhesive 32 and upper plated layer 54 outside inner hole 50, between adhesive 32 and lower plated layer 56 outside inner hole 50, between adhesive 32 and plated through-hole 58 in inner hole 50 and between dielectric layer 42 and plated through-hole 58 in inner hole 50 is clear.

FIG. 4H is a cross-sectional view of the structure with etch masks 60 and 62 formed on plated layers 54 and 56, respectively. Etch masks 60 and 62 are illustrated as photoresist layers similar to photoresist layer 16. Photoresist layer 60 has a pattern that selectively exposes upper plated layer 54, and photoresist layer 62 has a pattern that selectively exposes lower plated layer 56.

FIG. 4I is a cross-sectional view of the structure with selected portions of conductive layer 40 and upper plated layer 54 removed by etching conductive layer 40 and upper plated layer 54 in the pattern defined by etch mask 60, and selected portions of metal layer 28 and lower plated layer 56 removed by etching metal layer 28 and lower plated layer 56 in the pattern defined by etch mask 62. The etching is a frontside and backside wet chemical etch similar to the etch applied to metal plate 10. For instance, a top spray nozzle (not shown) and a bottom spray nozzle (not shown) can spray the wet chemical etch on the top and bottom of the structure, or the structure can be dipped in the wet chemical etch. The wet chemical etch etches through conductive layer 40 and upper plated layer 54 to expose dielectric layer 42 in the upward direction without exposing base 24 or adhesive 32 in the upward direction and converts conductive layer 40 and upper plated layer 54 from unpatterned into patterned layers. The wet chemical etch also etches through metal layer 28 and lower plated layer 56 expose ESD protection layer 26 in the downward direction without exposing base 24 or adhesive 32 in the downward direction.

FIG. 4J is a cross-sectional view of the structure after etch masks 60 and 62 are removed. Photoresist layers 60 and 62 can be stripped in the same manner as photoresist layers 16 and 18.

Conductive layer 40 and upper plated layer 54 as etched include pad 64 and cap 66. Pad 64 and cap 66 are unetched portions of conductive layer 40 and upper plated layer 54 defined by etch mask 60. Thus, conductive layer 40 and upper plated layer 54 are a patterned layer that includes pad 64 and cap 66. Pad 64 is an unetched portion of conductive layer 40 and upper plated layer 54 defined by etch mask 60 that is adjacent to and extends laterally from and is electrically connected to plated through-hole 58. Cap 66 is an unetched portion of conductive layer 40 and upper plated layer 54 defined by etch mask 60 that is adjacent to and extends laterally from and is thermally connected to post 22. Pad 64 has a thickness of 35 microns (20+15). Cap 66 has a thickness of 20 microns where it is adjacent to post 22 and a thickness of 35 microns (15+20) where it is adjacent to dielectric layer 42. Cap 66 also has a thickness of 20 microns where it is adjacent to adhesive 32 and spaced from dielectric layer 42 and a thickness of 35 microns where it is adjacent to a corner-shaped interface between a side surface of adhesive 32 and a top surface of dielectric layer 42. Thus, pad 64 and cap 66 contact and extend above dielectric layer 42, have the same thickness where they overlap dielectric layer 42 and are closest to one another, have different thickness where cap 66 is adjacent to post 22 and are spaced from and coplanar with one another.

Metal layer 28 and lower plated layer 56 as etched include terminal 70 and underlayer 72. Terminal 70 and underlayer 72 are unetched portions of metal layer 28 and lower plated layer 56 defined by etch mask 62. Thus, metal layer 28 and lower plated layer 56 are a patterned layer that includes terminal 70 and underlayer 72. Terminal 70 is an unetched portion of metal layer 28 and lower plated layer 56 defined by etch mask 62 that is adjacent to and extends laterally from and is electrically connected to plated through-hole 58. Underlayer 72 is an unetched portion of metal layer 28 and lower plated layer 56 defined by etch mask 62 that is spaced from and extends laterally beyond post 22. Terminal 70 has a thickness of 20 microns where it is adjacent to plated through-hole 58 and a thickness of 35 microns (15+20) where it is adjacent to ESD protection layer 26. Terminal 70 also has a thickness of 20 microns where it is adjacent to adhesive 32 and spaced from ESD protection layer 26 and a thickness of 35 microns where it is adjacent to a corner-shaped interface between a side surface of adhesive 32 and a bottom surface of ESD protection layer 26. Underlayer 72 has a thickness of 35 microns (20+15). Thus, terminal 70 and underlayer 72 contact and extend below ESD protection layer 26, have the same thickness where they are closest to one another, have different thickness where terminal 70 is adjacent to plated through-hole 58 and are spaced from and coplanar with one another.

Conductive trace 74 is provided by plated through-hole 58, pad 64 and terminal 70. Similarly, an electrically conductive path between pad 64 and terminal 70 is plated through-hole 58.

Heat spreader 76 includes post 22, base 24, ESD protection layer 26, cap 66 and underlayer 72. Post 22 overlaps and is centrally located within the peripheries of base 24, ESD protection layer 26 and underlayer 72. Post 22 and base 24 are integral with one another. Cap 66 extends above and is adjacent to and covers in the upward direction and extends laterally in the lateral directions from post 22. ESD protection layer 26 and underlayer 72 are below and spaced from and cover in the downward direction and extends laterally in the lateral directions beyond post 22 and cap 66. Furthermore, post 22, base 24 and cap 66 are essentially a heat slug that includes a pedestal (post 22), upper wings that extend laterally from the pedestal (cap 66) and lower wings that extend laterally from the pedestal (base 24) and are thermally connected to and electrically isolated from underlayer 72 by ESD protection layer 26.

FIG. 4K is a cross-sectional view of the structure with plated contacts 78 formed on conductive trace 74 and heat spreader 76.

Plated contacts 78 are thin spot plated metal coatings that contact the exposed copper surfaces. Thus, plated contacts 78 contact plated through-hole 58, pad 64 and cap 66 and cover them in the upward direction and contact plated through-hole 58, terminal 70 and underlayer 72 and cover them in the downward direction. For instance, a nickel layer is electrolessly plated on the exposed copper surfaces, and then a silver layer is electrolessly plated on the nickel layer. The buried nickel layer has a thickness of 3 microns, the silver surface layer has a thickness of 0.5 microns, and plated contacts 78 have a thickness of 3.5 microns.

Pad 64, cap 66, terminal 70 and underlayer 72 treated with plated contacts 78 as a surface finish have several advantages. The buried nickel layer provides the primary mechanical and electrical and/or thermal connection, and the silver surface layer provides a wettable surface to facilitate solder reflow and accommodates a solder joint and a wire bond. Plated contacts 78 also protect conductive trace 74 and heat spreader 76 from corrosion. Plated contacts 78 can include a wide variety of metals to accommodate the external connection media. For instance, a gold surface layer can be plated on a buried nickel layer or a nickel surface layer alone can be employed.

Conductive trace 74 and heat spreader 76 treated with plated contacts 78 are shown as single layers for convenience of illustration. The boundary (not shown) in conductive trace 74 with plated contacts 78 and in heat spreader 76 with plated contacts 78 occurs at the copper/nickel interface.

At this stage, the manufacture of thermal board 80 can be considered complete.

FIGS. 4L, 4M and 4N are cross-sectional, top and bottom views, respectively, of thermal board 80 after it is detached at peripheral edges along cut lines from a support frame and/or adjacent thermal boards in a batch.

Thermal board 80 includes adhesive 32, substrate 36, conductive trace 74 and heat spreader 76. Substrate 36 includes dielectric layer 42. Conductive trace 74 includes plated through-hole 58, pad 64 and terminal 70. Heat spreader 76 includes post 22, base 24, ESD protection layer 26, cap 66 and underlayer 72.

Post 22 extends into and remains centrally located within opening 34 and aperture 44, remains centrally located within the peripheries of base 24, ESD protection layer 26, adhesive 32, dielectric layer 42 and underlayer 72 and is coplanar at its top with an adjacent portion of adhesive 32 that contacts cap 66. Post 22 retains its cut-off conical shape with tapered sidewalls in which its diameter decreases as it extends upwardly from base 24 to its flat circular top adjacent to cap 66. Post 22 is also coplanar with adhesive 32 at their tops at cap 66 but adhesive 32 extends below post 22 in outer hole 30.

Base 24 is located below post 22, covers post 22 in the downward direction and extends laterally from post 22 to the peripheral edges of thermal board 80. Furthermore, base 24 is thicker than pad 64, cap 66, terminal 70 and underlayer 72.

ESD protection layer 26 is located below base 24, contacts and is sandwiched between base 24 and terminal 70, contacts and is sandwiched between base 24 and underlayer 72, covers post 22 in the downward direction and extends laterally beyond post 22 to the peripheral edges of thermal board 80.

Underlayer 72 is located below ESD protection layer 26, covers post 22 in the downward direction, extends laterally beyond post 22 and is spaced from the peripheral edges of thermal board 80.

Adhesive 32 is mounted on and extends above base 24, extends across base 24 and ESD protection layer 26 in outer hole 30, extends across dielectric layer 42 in gap 46, contacts and is sandwiched between and fills the space between post 22 and dielectric layer 42, contacts and is sandwiched between base 24 and dielectric layer 42, contacts and is sandwiched between post 22 and plated through-hole 58, contacts and is sandwiched between base 24 and cap 66, is sandwiched between base 24 and pad 64, contacts ESD protection layer 26 and terminal 70 and is spaced from pad 64. Adhesive 32 also extends laterally from post 22 beyond and overlaps terminal 70, covers base 24, ESD protection layer 26, terminal 70 and underlayer 72 outside the periphery of post 22 in the upward direction, covers cap 66 outside the periphery of post 22 in the downward direction, covers dielectric layer 42 and pad 64 in the downward direction, covers and surrounds post 22 in the lateral directions, fills most of the space between substrate 36 and heat spreader 76 and is solidified.

Adhesive 32 alone can intersect an imaginary horizontal line between post 22 and dielectric layer 42, an imaginary horizontal line between post 22 and plated through-hole 58, an imaginary vertical line between base 24 and dielectric layer 42 and an imaginary vertical line between base 24 and cap 66. Thus, an imaginary horizontal line exists that intersects only adhesive 32 as the line extends from post 22 to dielectric layer 42, an imaginary vertical line exists that intersects only adhesive 32 as the line extends from base 24 to dielectric layer 42 and so on.

Substrate 36 is mounted on and contacts adhesive 32, extends above the underlying adhesive 32, is located above and spaced from base 24, ESD protection layer 26, terminal 70 and underlayer 72 and is spaced from post 22. Substrate 36 includes pad 64 but does not include terminal 70. Furthermore, dielectric layer 42 contacts and is sandwiched between adhesive 32 and pad 64 and between adhesive 32 and cap 66.

Plated through-hole 58 contacts and extends above and below and through adhesive 32 and dielectric layer 42 in inner hole 50 and is spaced from and extends above and below and through base 24 and ESD protection layer 26 in inner hole 50. Plated through-hole 58 also retains its tubular shape with straight vertical inner and outer sidewalls in which its diameter is constant as it extends vertically from pad 64 to terminal 70.

Pad 64 and cap 66 have the same thickness where they are closest to one another and contact dielectric layer 42, have different thickness where cap 66 is adjacent to post 22 and are coplanar with one another above adhesive 32 and dielectric layer 42 at a top surface that faces in the upward direction.

Terminal 70 and underlayer 72 have the same thickness where they are closest to one another and contact ESD protection layer 26, have different thickness where terminal 70 is adjacent to plated through-hole 58 and are coplanar with one another below ESD protection layer 26 and adhesive 32 at a bottom surface that faces in the downward direction.

Base 24, ESD protection layer 26, adhesive 32 and dielectric layer 42 extend to straight vertical peripheral edges of thermal board 80 after it is detached or singulated from a batch of identical simultaneously manufactured thermal boards.

Pad 64 is customized as an electrical interface for a semiconductor device such as an LED chip that is subsequently mounted on cap 66, terminal 70 is customized as an electrical interface for the next level assembly such as a solderable wire from a printed circuit board, cap 66 is customized as a thermal interface for the semiconductor device, and underlayer 72 is customized as a thermal interface for the next level assembly such as the printed circuit board or a heat sink for an electronic device.

Pad 64 and terminal 70 are horizontally and vertically offset from one another and exposed at the top and bottom surfaces, respectively, of thermal board 80, thereby providing horizontal and vertical signal routing between the semiconductor device and the next level assembly.

Conductive trace 74 provides horizontal (fan-out) routing by pad 64 to plated through-hole 58 and vertical (top to bottom) routing from pad 64 to terminal 70 by plated through-hole 58. Conductive trace 74 is not limited to this configuration. For instance, pad 64 can be electrically connected to plated through-hole 58 by a routing line above dielectric layer 42 as defined by etch mask 60, and terminal 70 can be electrically connected to plated through-hole 58 by a routing line below ESD protection layer 26 as defined by etch mask 62. Pad 64 can be electrically connected to terminal 70 by separate plated through-holes 58 in separate electrically conductive paths. Furthermore, the electrically conductive path can include vias that extend through dielectric layer 42 and routing lines (above and/or below adhesive 32 and/or dielectric layer 42) as well as passive components such as resistors and capacitors mounted on additional pads.

Conductive trace 74 is shown in cross-section as a continuous circuit trace for convenience of illustration. However, conductive trace 74 can provide horizontal signal routing in both the X and Y directions. That is, pad 64 and terminal 70 can be laterally offset from one another in the X and Y directions. Furthermore, plated through-hole 58 can be located between terminal 70 and underlayer 72 or between terminal 70 and a corner of thermal board 80.

Conductive trace 74 and heat spreader 76 contact one another where ESD protection layer 26 contacts terminal 70. As a result, conductive trace 74 and heat spreader 76 are mechanically attached and electrically isolated from one another.

Heat spreader 76 provides heat spreading and heat dissipation from a semiconductor device that is subsequently mounted on cap 66 to the next level assembly that thermal board 80 is subsequently mounted on. The semiconductor device generates heat that flows into cap 66, from cap 66 into post 22, through post 22 into base 24, through base 24 into ESD protection layer 26 and through ESD protection layer 26 into underlayer 72, where it is spread out relative to post 22 and dissipated in the downward direction, for instance to an underlying heat sink.

Moreover, since ESD protection layer 26 contacts and is sandwiched between base 24 and terminal 70, the heat also flows through base 24 into ESD protection layer 26 and through ESD protection layer 26 into terminal 70, where it is spread out relative to post 22 and dissipated in the downward direction, for instance to an underlying electrical contact. As a result, terminal 70 is shared by conductive trace 74 and heat spreader 76 and provides another thermal path below ESD protection layer 26. However, since underlayer 72 is beneath post 22 whereas terminal 70 is not, underlayer 72 provides better thermal performance than terminal 70.

Plated contacts 78 occupy 85 to 95 percent of the top surface of thermal board 80 and thus provide a highly reflective top surface which is particularly useful if an LED device is subsequently mounted on cap 66.

Post 22 and base 24 are copper. Plated through-hole 58, pad 64, cap 66, terminal 70 and underlayer 72 are copper/nickel/silver. Plated through-hole 58, pad 64, cap 66, terminal 70 and underlayer 72 consist of a silver surface layer, a buried copper core and a buried nickel layer that contacts and is sandwiched between the silver surface layer and the buried copper core. Plated through-hole 58, pad 64, cap 66, terminal 70 and underlayer 72 are also primarily copper at the buried copper core. Plated contacts 78 provide the silver surface layer and the buried nickel layer and various combinations of metal plate 10, metal layer 28, conductive layer 40 and plated layer 52 provide the buried copper core.

Conductive trace 74 includes a buried copper core shared by plated through-hole 58, pad 64 and terminal 70 and heat spreader 76 includes a buried copper core shared by post 22, base 24 and cap 66. Furthermore, conductive trace 74 includes a plated contact 78 at plated through-hole 58, pad 64 and terminal 70 and heat spreader 76 includes a plated contact 78 at cap 66 and spaced from post 22 and base 24 and another plated contact 78 at underlayer 72 and spaced from post 22 and cap 66. Moreover, conductive trace 74 consists of copper/nickel/silver and is primarily copper at the buried copper core and heat spreader 76 consists of copper/nickel/silver and is primarily copper outside ESD protection layer 26.

Thermal board 80 does not expose post 22 or base 24 in the upward or downward direction. Post 22 is shown in phantom in FIG. 4M for convenience of illustration.

Thermal board 80 can include multiple conductive traces 74 with a plated through-hole 58, pad 64 and terminal 70. A single conductive trace 74 is described and labeled for convenience of illustration. In conductive traces 74, plated through-holes 58, pads 64 and terminals 70 generally have similar shapes and sizes. For instance, some conductive traces 74 may be spaced and separated and electrically isolated from one another whereas other conductive traces 74 can intersect or route to the same pad 64 or terminal 70 and be electrically connected to one another. Likewise, some pads 64 may receive independent signals whereas other pads 64 share a common signal, power or ground.

Thermal board 80 can be adapted for an LED package with blue, green and red LED chips, with each LED chip including an anode and a cathode and each LED package including a corresponding anode terminal and cathode terminal. In this instance, thermal board 80 can include six pads 64 and four terminals 70 so that each anode is routed from a separate pad 64 to a separate terminal 70 whereas each cathode is routed from a separate pad 64 to a common ground terminal 70.

A brief cleaning step can be applied to the structure at various manufacturing stages to remove oxides and debris that may be present on the exposed metal. For instance, a brief oxygen plasma cleaning step can be applied to the structure. Alternatively, a brief wet chemical cleaning step using a solution containing potassium permanganate can be applied to the structure. Likewise, the structure can be rinsed in distilled water to remove contaminants. The cleaning step cleans the desired surfaces without appreciably affecting or damaging the structure.

Advantageously, there is no plating bus or related circuitry that need be disconnected or severed from conductive traces 74 after they are formed. A plating bus can be disconnected during the wet chemical etch that forms pad 64 and cap 66.

Thermal board 80 can include registration holes (not shown) that are drilled or sliced through base 24, ESD protection layer 26, adhesive 32 and substrate 36 so that thermal board 80 can be positioned by inserting tooling pins through the registration holes when it is subsequently mounted on an underlying carrier.

Thermal board 80 can accommodate multiple semiconductor devices rather than one with a single post 22 or multiple posts 22. Thus, multiple semiconductor devices can be mounted on a single post 22 or separate semiconductor devices can be mounted on separate posts 22.

Thermal board 80 with a single post 22 for multiple semiconductor devices can be accomplished by drilling additional holes to define additional plated through-holes 58, adjusting etch mask 60 to define additional pads 64 and adjusting etch mask 62 to define additional terminals 70. The plated through-holes 58, pads 64 and terminals 70 can be laterally repositioned to provide a 2×2 array for four semiconductor devices. In addition, the topography (lateral shape) can be adjusted for pads 64 and terminals 70.

Thermal board 80 with multiple posts 22 for multiple semiconductor devices can be accomplished by adjusting etch mask 16 to define additional posts 22, adjusting adhesive 32 to include additional openings 34, adjusting substrate 36 to include additional apertures 36, drilling additional holes to define additional plated through-holes 58, adjusting etch mask 60 to define additional pads 64 and caps 66 and adjusting etch mask 62 to define additional terminals 70 and underlayers 72. These elements can be laterally repositioned to provide a 2×2 array for four semiconductor devices. In addition, the topography (lateral shape) can be adjusted for posts 22, pads 64, caps 66, terminals 70 and underlayers 72. Furthermore, posts 22 can have separate underlayers 72 or share a single underlayer 72 as defined by etch mask 62.

Figure 5A:
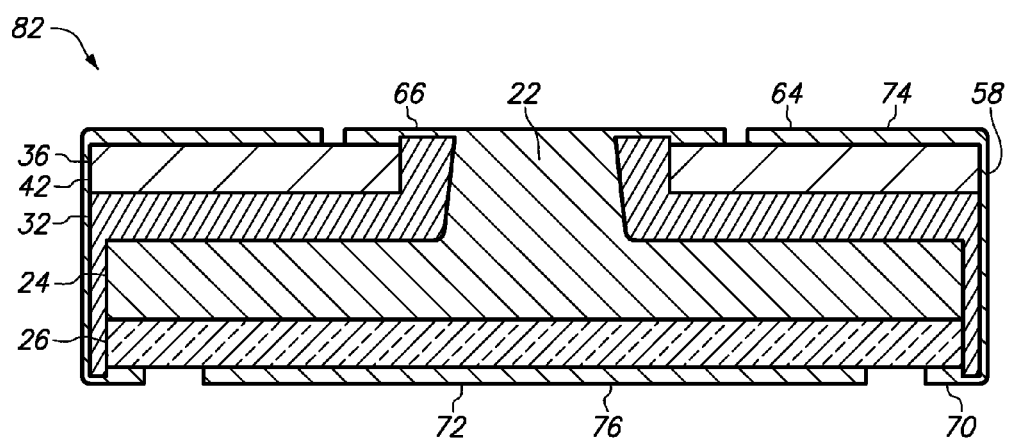
FIGS. 5A, 5B and 5C are cross-sectional, top and bottom views, respectively, of a thermal board with a plated through-hole at a peripheral edge in accordance with an embodiment of the present invention.
Figure 5B:
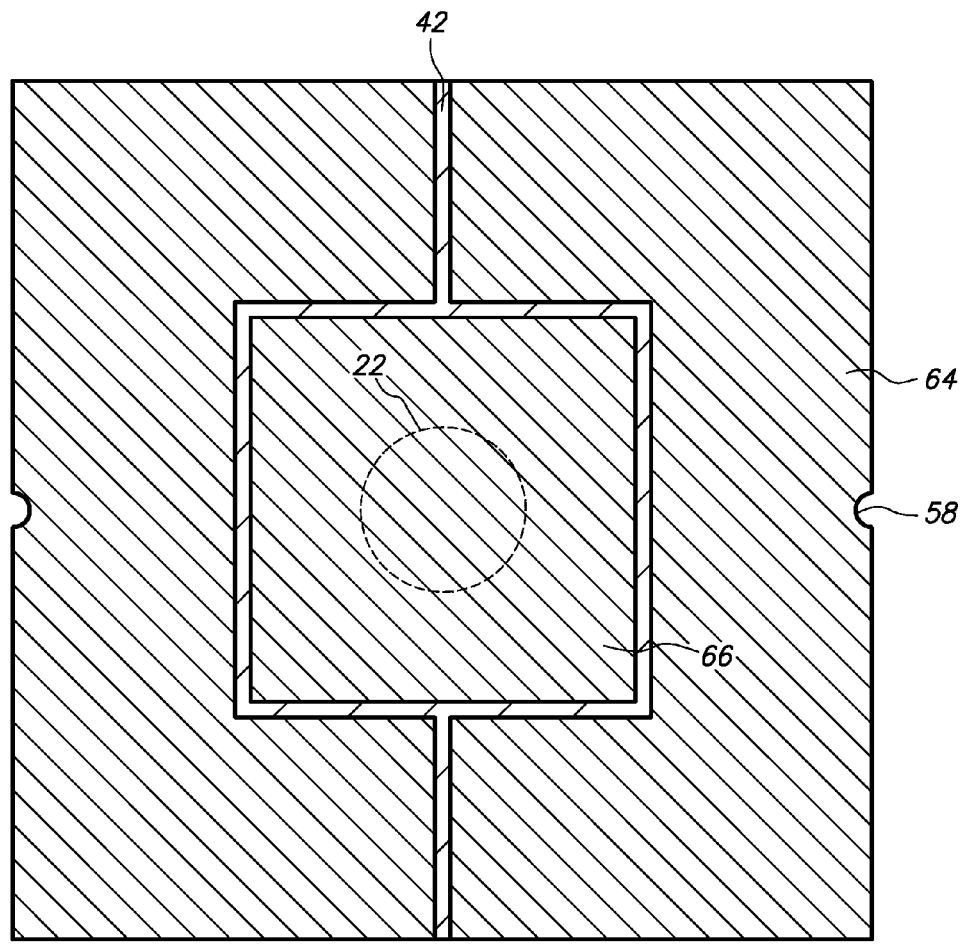
Figure 5C:
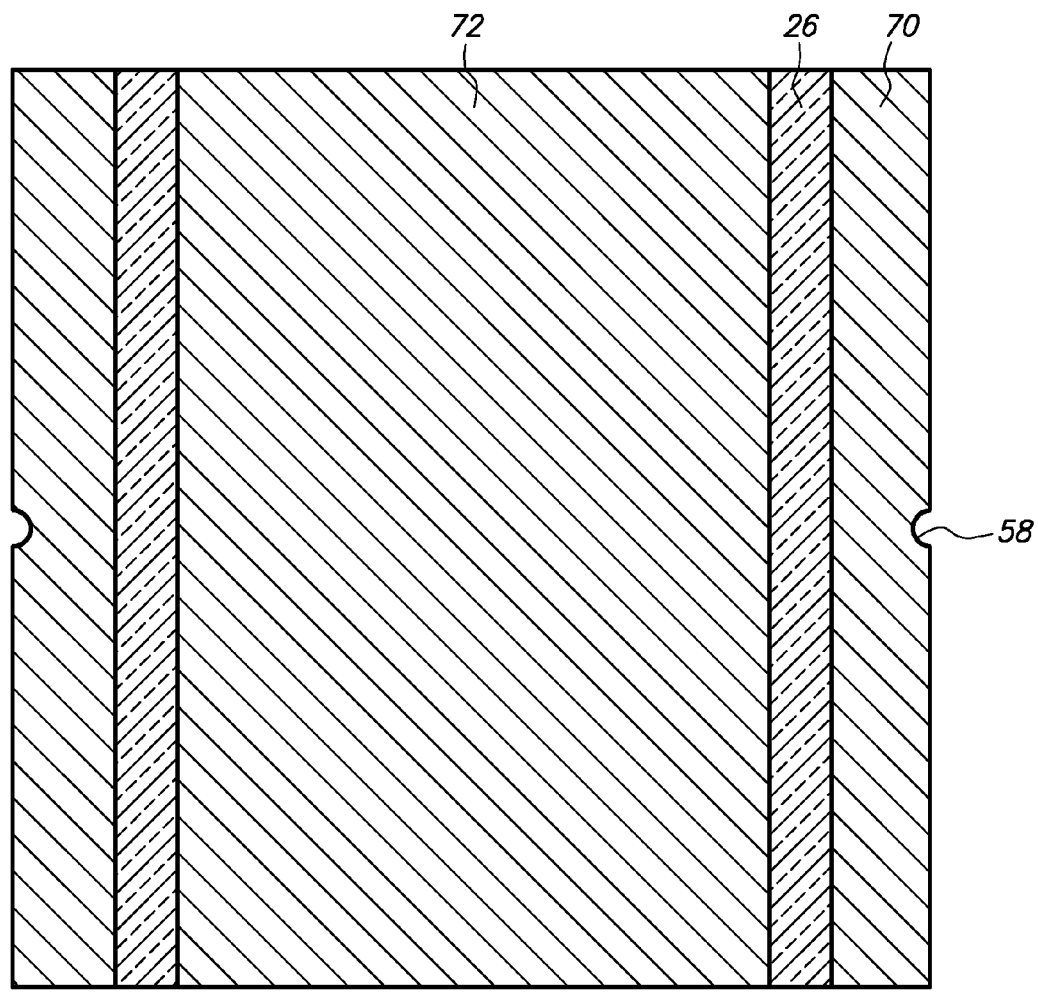

FIGS. 5A, 5B and 5C are cross-sectional, top and bottom views, respectively, of a thermal board with a plated through-hole at a peripheral edge in accordance with an embodiment of the present invention.

In this embodiment, the plated through-hole is located at a peripheral edge where the thermal board is detached. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 82 includes adhesive 32, substrate 36, conductive trace 74 and heat spreader 76. Substrate 36 includes dielectric layer 42. Conductive trace 74 includes plated through-hole 58, pad 64 and terminal 70. Heat spreader 76 includes post 22, base 24, ESD protection layer 26, cap 66 and underlayer 72.

Plated through-hole 58 is located at a peripheral edge of thermal board 82 rather than spaced from the peripheral edges of thermal board 82. As a result, thermal board 82 is more compact than thermal board 80. Furthermore, plated through-hole 58 has a semi-tubular shape with a semi-circular circumference rather than a tubular shape with a circular circumference and adhesive 32 extends laterally from post 22 to but not beyond terminal 70.

Thermal board 82 can be manufactured in a manner similar to thermal board 80 with suitable adjustments for plated through-hole 58. For instance, adhesive 32 is mounted on base 24, substrate 36 is mounted on adhesive 32, heat and pressure are applied to flow and solidify adhesive 32, grinding is applied to planarize the top and bottom surfaces, inner hole 50 is drilled through the structure and then plated layers 54 and 56 and plated through-hole 58 are deposited on the structure as previously described. Thereafter, conductive layer 40 and plated layer 54 are etched to form pad 64 and cap 66, metal layer 28 and plated layer 56 are etched to form terminal 70 and underlayer 72 and then plated contacts 78 provide a surface finish for pad 64, cap 66, terminal 70 and underlayer 72. Thereafter, base 24, ESD protection layer 26, adhesive 32, substrate 36, plated through-hole 58, pad 64, terminal 70 and underlayer 72 are cut or cracked at the peripheral edges of thermal board 82 to detach it from the batch. As a result, a semi-tubular portion of plated through-hole 58 is detached from the peripheral edge while another semi-tubular portion of plated through-hole 58 at the peripheral edge remains intact.

Figure 6A:
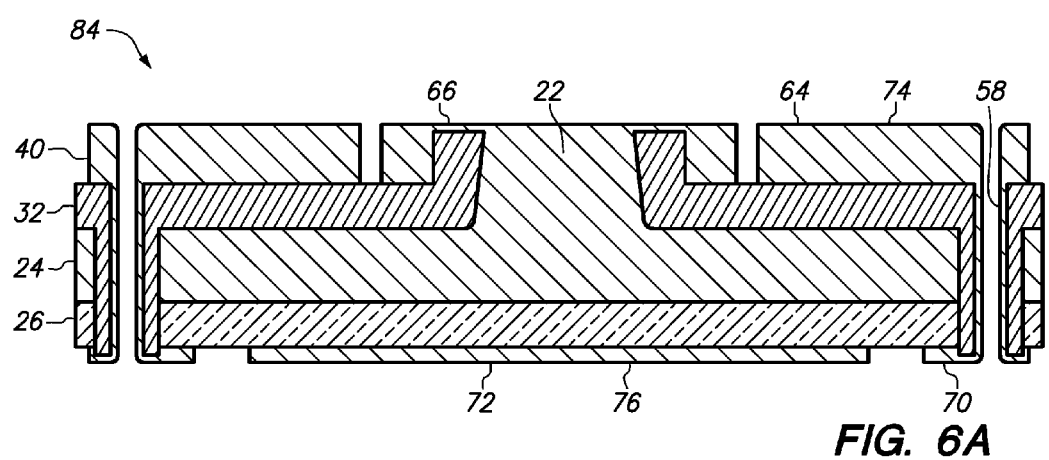
FIGS. 6A, 6B and 6C are cross-sectional, top and bottom views, respectively, of a thermal board with a conductive trace on an adhesive in accordance with an embodiment of the present invention.
Figure 6B:
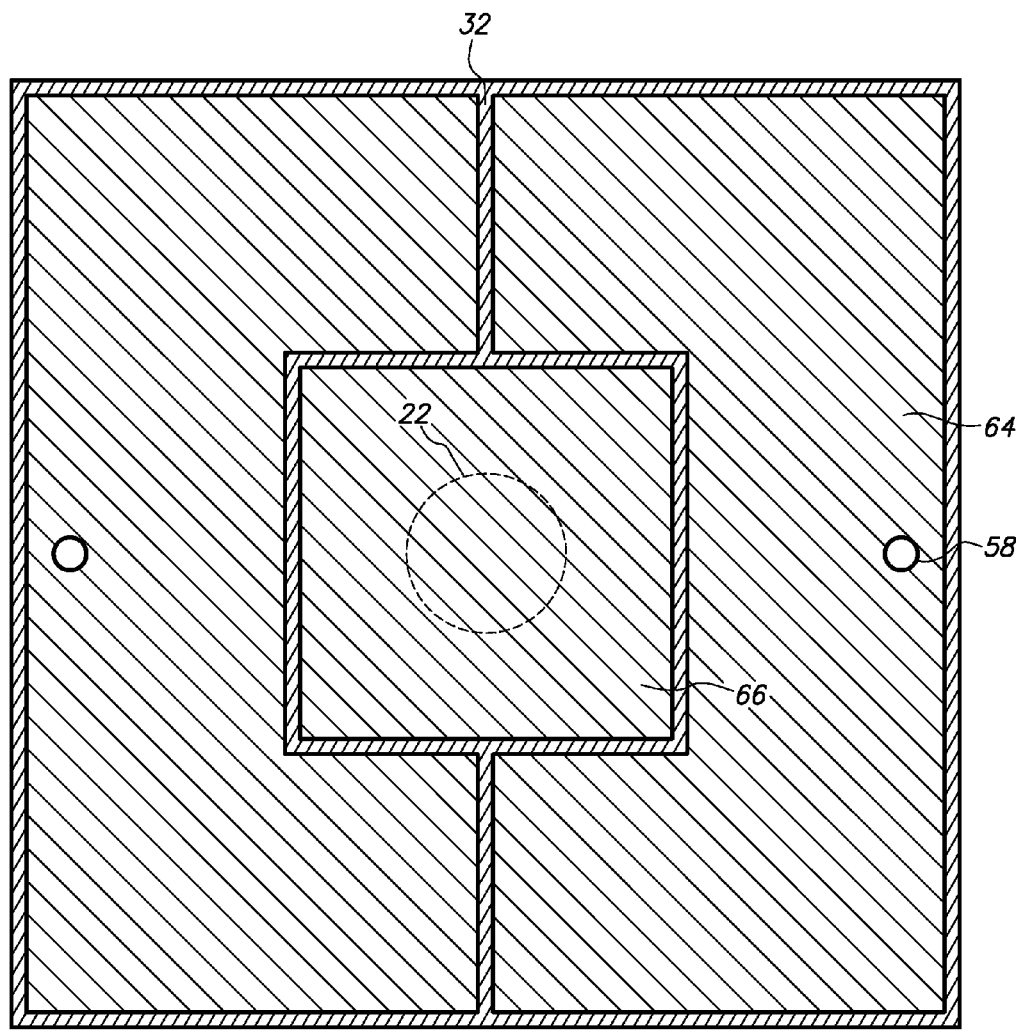
Figure 6C:
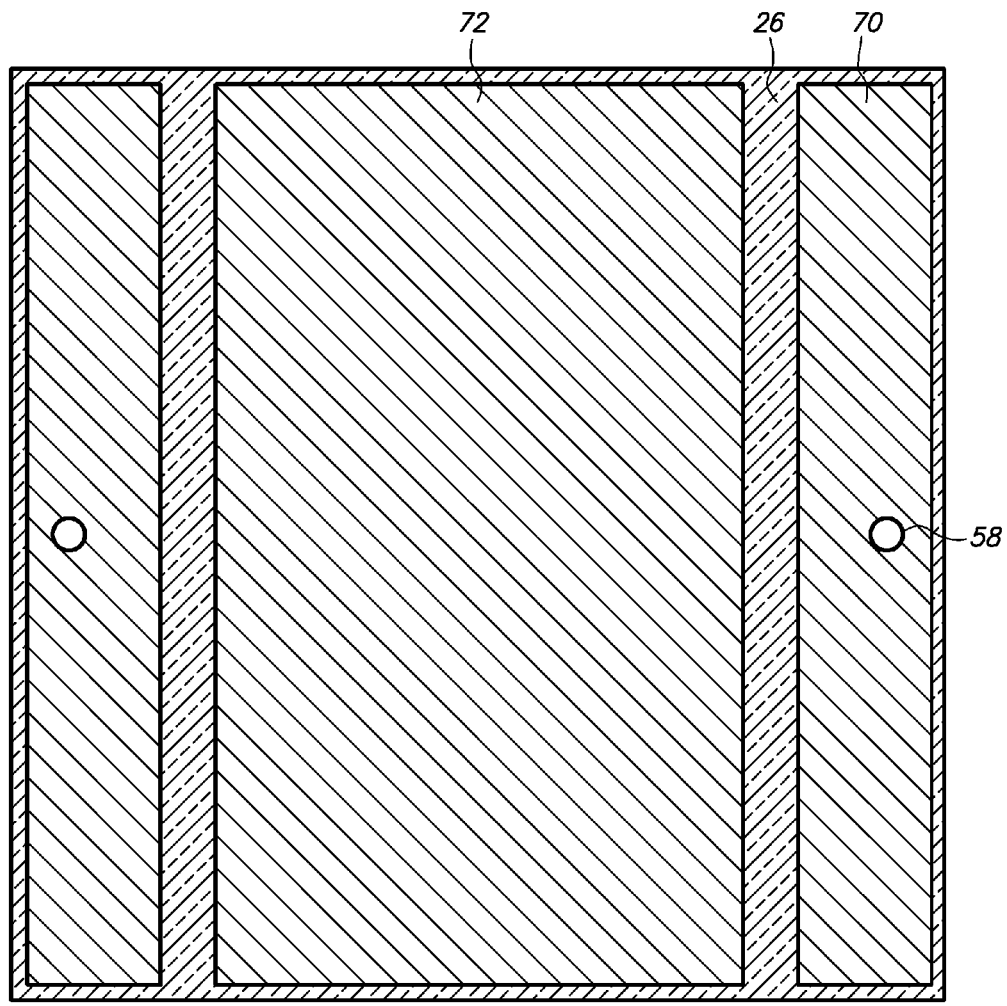

FIGS. 6A, 6B and 6C are cross-sectional, top and bottom views, respectively, of a thermal board with a conductive trace on an adhesive in accordance with an embodiment of the present invention.

In this embodiment, the conductive trace contacts the adhesive and the dielectric layer is omitted. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 84 includes adhesive 32, conductive trace 74 and heat spreader 76. Conductive trace 74 includes plated through-hole 58, pad 64 and terminal 70. Heat spreader 76 includes post 22, base 24, ESD protection layer 26, cap 66 and underlayer 72.

Conductive layer 40 is thicker in this embodiment than the previous embodiment. For instance, conductive layer 40 has a thickness of 130 microns (rather than 30 microns) so that it can be handled without warping or wobbling. Pad 64 and cap 66 are therefore thicker, and thermal board 84 is devoid of a dielectric layer corresponding to dielectric layer 42.

Thermal board 84 can be manufactured in a manner similar to thermal board 80 with suitable adjustments for conductive layer 40. For instance, adhesive 32 is mounted on base 24, conductive layer 40 alone is mounted on adhesive 32, heat and pressure are applied to flow and solidify adhesive 32, grinding is applied to planarize the top and bottom surfaces, inner hole 50 is drilled through the structure and then plated layers 54 and 56 and plated through-hole 58 are deposited on the structure as previously described. Thereafter, conductive layer 40 and plated layer 54 are etched to form pad 64 and cap 66, metal layer 28 and plated layer 56 are etched to form terminal 70 and underlayer 72 and then plated contacts 78 provide a surface finish for pad 64, cap 66, terminal 70 and underlayer 72. Thereafter, base 24, ESD protection layer 26 and adhesive 32 are cut or cracked at the peripheral edges of thermal board 84 to detach it from the batch.

Figure 7A:
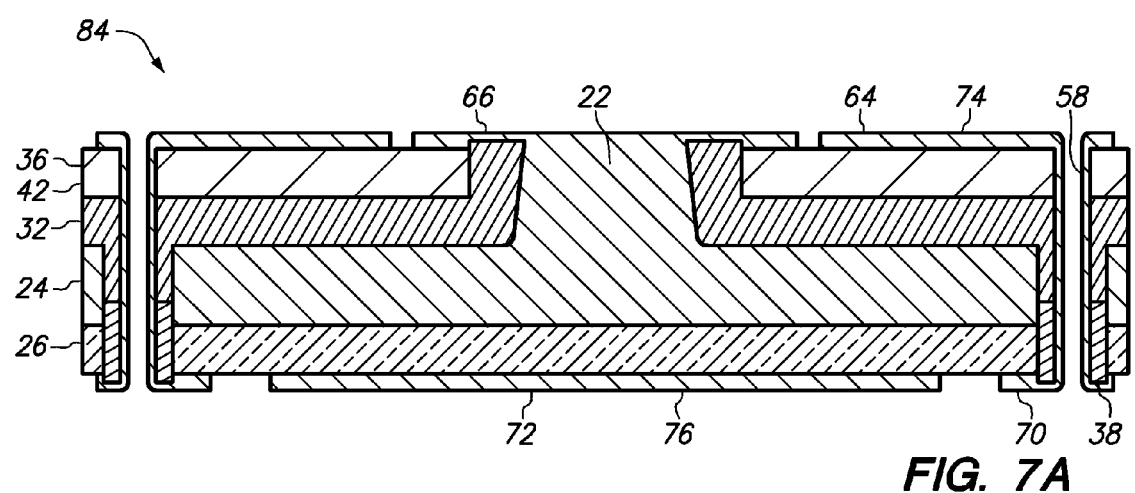
FIGS. 7A, 7B and 7C are cross-sectional, top and bottom views, respectively, of a thermal board with an adhesive and an insulative filler in an outer hole in accordance with an embodiment of the present invention.
Figure 7B:
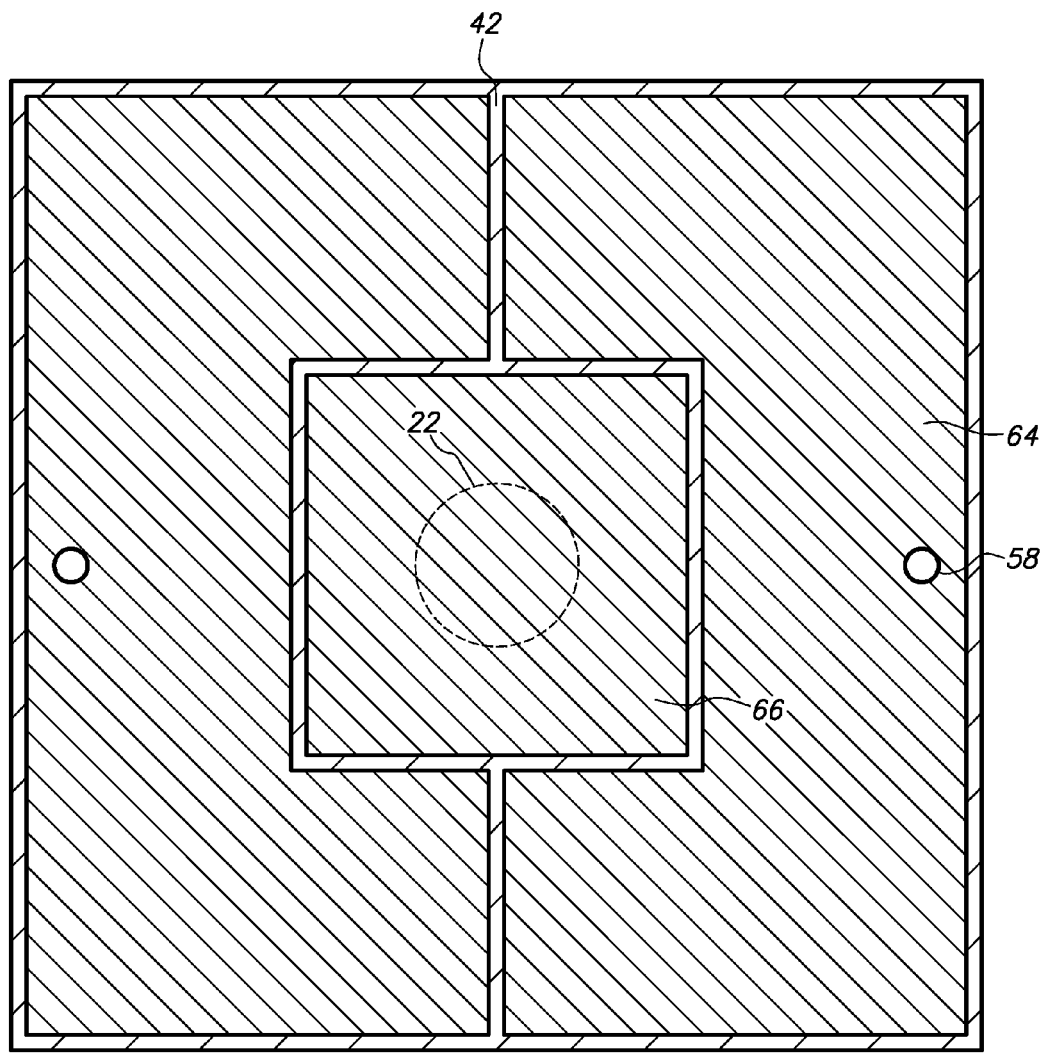
Figure 7C:
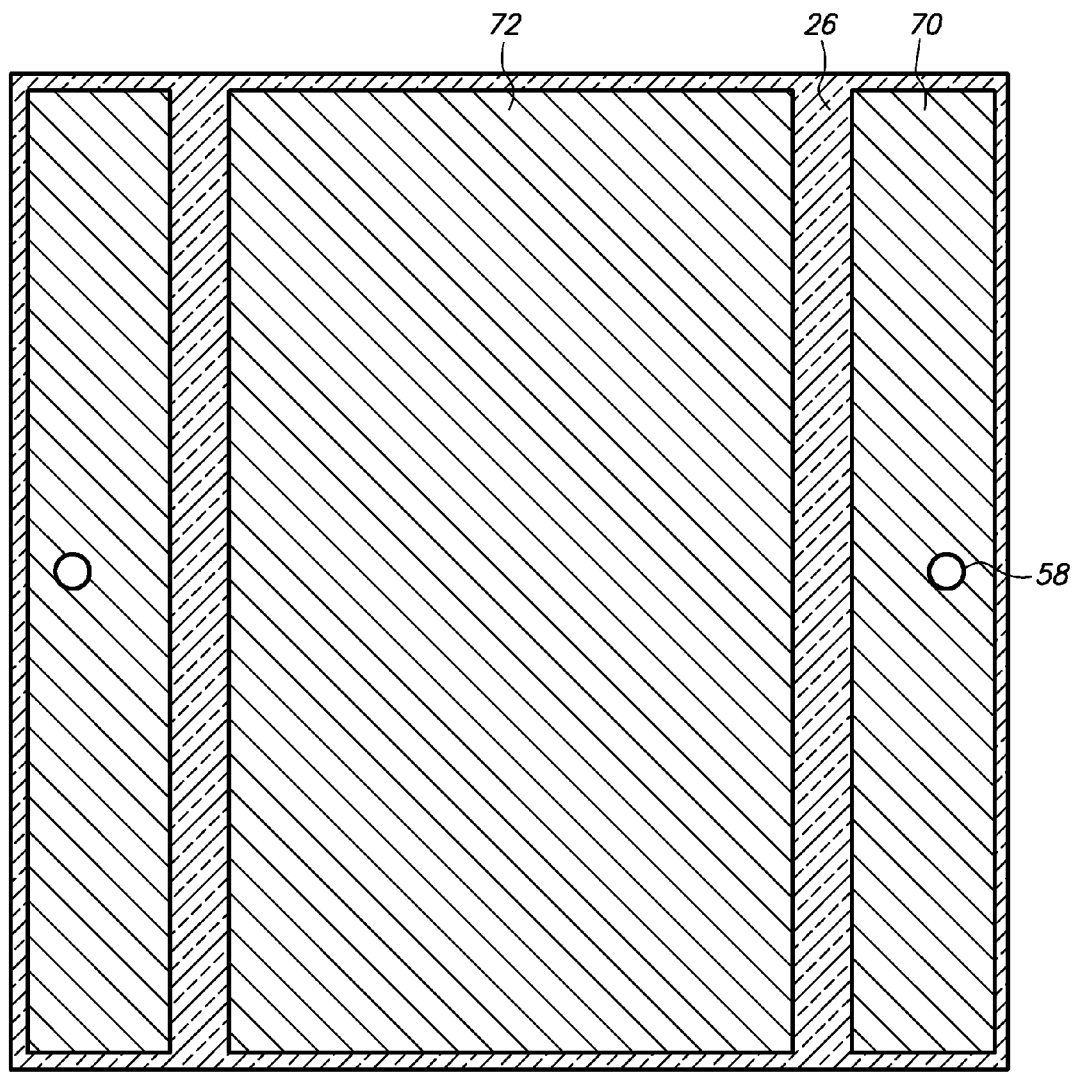

FIGS. 7A, 7B and 7C are cross-sectional, top and bottom views, respectively, of a thermal board with an adhesive and an insulative filler in an outer hole in accordance with an embodiment of the present invention.

In this embodiment, the adhesive and the insulative filler extend into the outer hole. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 86 includes adhesive 32, insulative filler 38, substrate 36, conductive trace 74 and heat spreader 76. Substrate 36 includes dielectric layer 42. Conductive trace 74 includes plated through-hole 58, pad 64 and terminal 70. Heat spreader 76 includes post 22, base 24, ESD protection layer 26, cap 66 and underlayer 72.

Adhesive 32 contacts base 24 and insulative filler 38 in outer hole 30 and is spaced from ESD protection layer 26 and terminal 70. Insulative filler 38 is located within outer hole 30 below adhesive 32, contacts base 24, ESD protection layer 26, adhesive 32 and terminal 70 in outer hole 30 and is spaced from dielectric layer 42 and pad 66. Likewise, plated through-hole 58 contacts and extends through adhesive 32 and insulative filler 38 in inner hole 50.

Insulative filler 38 can be various dielectric films formed from numerous organic and inorganic electrical insulators. For instance, insulative filler 38 can be polyimide or FR-4 epoxy although other epoxies such as polyfunctional and bismaleimide triazine (BT) are suitable.

Thermal board 86 can be manufactured in a manner similar to thermal board 80 with suitable adjustments for insulative filler 38. For instance, adhesive 32 is mounted on base 24, substrate 36 is mounted on adhesive 32 and heat and pressure are applied to flow and solidify adhesive 32. Adhesive 32 extends into but does not fill outer hole 30. Thereafter, insulative filler 38 is deposited into and fills the remaining space in outer hole 30 and then grinding is applied to planarize the top and bottom surfaces, inner hole 50 is drilled through the adhesive 32, insulative filler 38, conductive layer 40 and dielectric layer 42 and then plated layers 54 and 56 and plated through-hole 58 are deposited on the structure as previously described. Thereafter, conductive layer 40 and plated layer 54 are etched to form pad 64 and cap 66, metal layer 28 and plated layer 56 are etched to form terminal 70 and underlayer 72 and then plated contacts 78 provide a surface finish for pad 64, cap 66, terminal 70 and underlayer 72. Thereafter, base 24, ESD protection layer 26, adhesive 32 and substrate 36 are cut or cracked at the peripheral edges of thermal board 86 to detach it from the batch.

Insulative filler 38 is initially an epoxy paste that is selectively screen printed into outer hole 30. Thereafter, the epoxy paste is heated and hardened at a relatively low temperature such as 190° C.

Figure 8A:
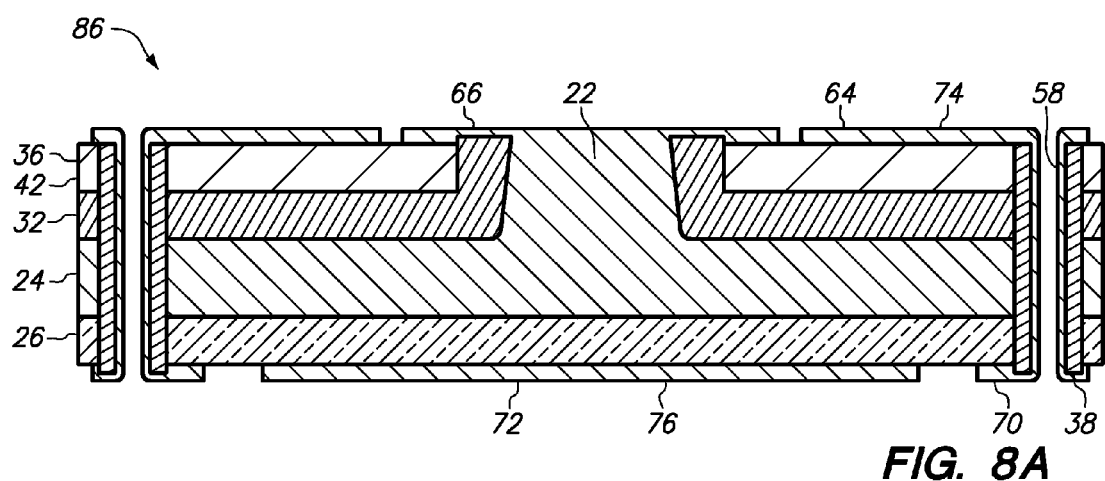
FIGS. 8A, 8B and 8C are cross-sectional, top and bottom views, respectively, of a thermal board with an insulative filler in an outer hole in accordance with an embodiment of the present invention.
Figure 8B:
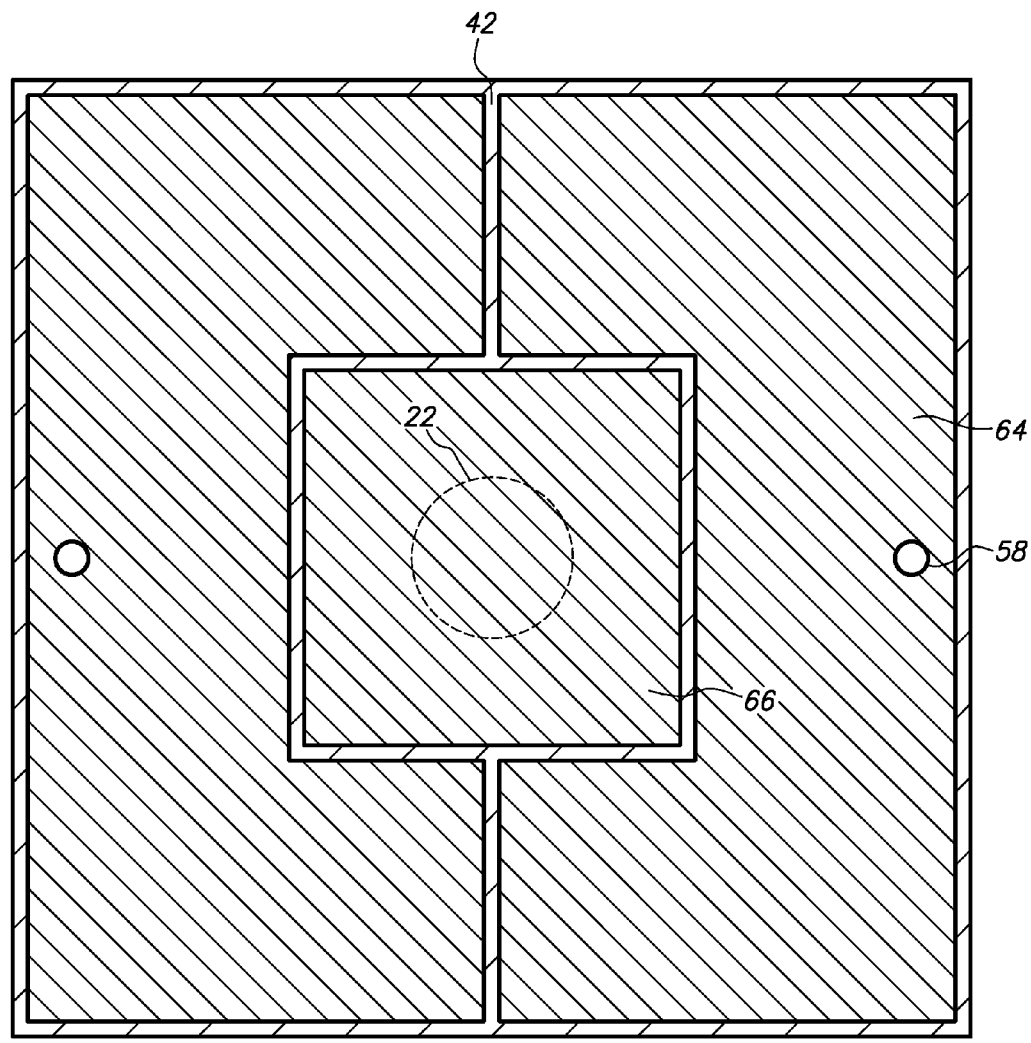
Figure 8C:
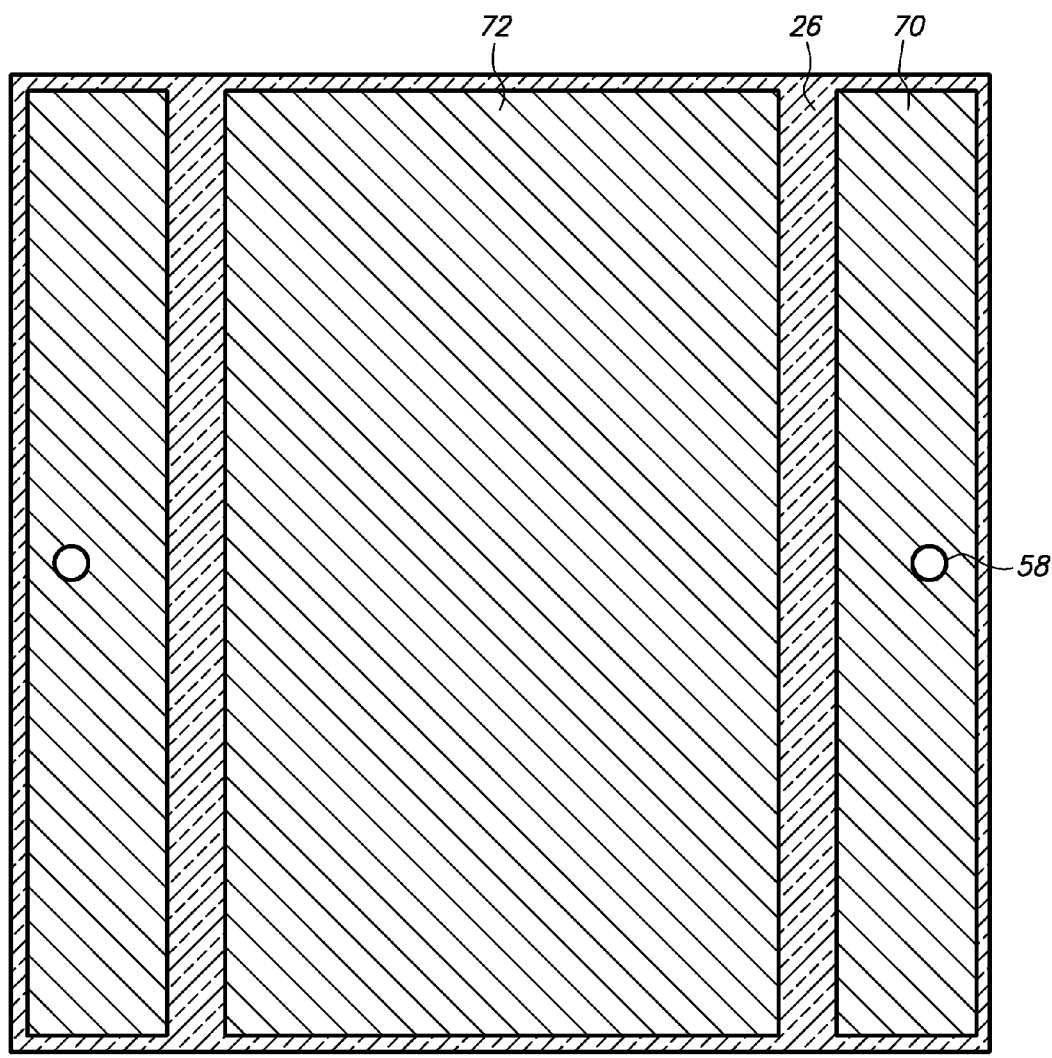

FIGS. 8A, 8B and 8C are cross-sectional, top and bottom views, respectively, of a thermal board with an insulative filler in an outer hole in accordance with an embodiment of the present invention.

In this embodiment, the insulative filler is located within the outer hole and the adhesive is located outside the outer hole. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 88 includes adhesive 32, insulative filler 38, substrate 36, conductive trace 74 and heat spreader 76. Substrate 36 includes dielectric layer 42. Conductive trace 74 includes plated through-hole 58, pad 64 and terminal 70. Heat spreader 76 includes post 22, base 24, ESD protection layer 26, cap 66 and underlayer 72.

Outer hole 30 extends through base 24, ESD protection layer 26, adhesive 32, dielectric layer 42, pad 64 and terminal 70. Adhesive 32 is located outside outer hole 30 and is spaced from ESD protection layer 26 and terminal 70. Insulative filler 38 is located within outer hole 30 and contacts base 24, ESD protection layer 26, adhesive 32, dielectric layer 42, pad 64 and terminal 70 in outer hole 30. Likewise, plated through-hole 58 contacts and extends through insulative filler 38 in inner hole 50 and is spaced from adhesive 32 and dielectric layer 42.

Insulative filler 38 can be various dielectric films formed from numerous organic and inorganic electrical insulators. For instance, insulative filler 38 can be polyimide or FR-4 epoxy although other epoxies such as polyfunctional and bismaleimide triazine (BT) are suitable.

Thermal board 88 can be manufactured in a manner similar to thermal board 80 with suitable adjustments for outer hole 30 and insulative filler 38. For instance, adhesive 32 is mounted on base 24, substrate 36 is mounted on adhesive 32 and heat and pressure are applied to flow and solidify adhesive 32. Thereafter, outer hole 30 is drilled through base 24, ESD protection layer 26, metal layer 28, adhesive 32, conductive layer 40 and dielectric layer 42. As a result, adhesive 32 does not extend into outer hole 30. Thereafter, insulative filler 38 is deposited into and fills outer hole 30 and then grinding is applied to planarize the top and bottom surfaces, inner hole 50 is drilled through insulative filler 38 alone and then plated layers 54 and 56 and plated through-hole 58 are deposited on the structure as previously described. Thereafter, conductive layer 40 and plated layer 54 are etched to form pad 64 and cap 66, metal layer 28 and plated layer 56 are etched to form terminal 70 and underlayer 72 and then plated contacts 78 provide a surface finish for pad 64, cap 66, terminal 70 and underlayer 72. Thereafter, base 24, ESD protection layer 26, adhesive 32 and substrate 36 are cut or cracked at the peripheral edges of thermal board 88 to detach it from the batch.

Insulative filler 38 is initially an epoxy paste that is selectively screen printed into outer hole 30. Thereafter, the epoxy paste is heated and hardened at a relatively low temperature such as 190° C.

Figure 9A:
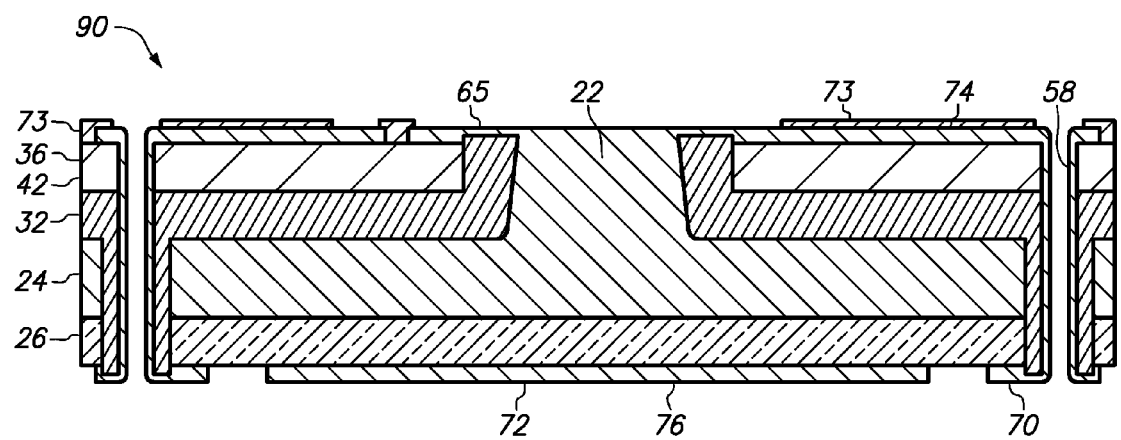
FIGS. 9A, 9B and 9C are cross-sectional, top and bottom views, respectively, of a thermal board with a shared pad in accordance with an embodiment of the present invention.
Figure 9B:
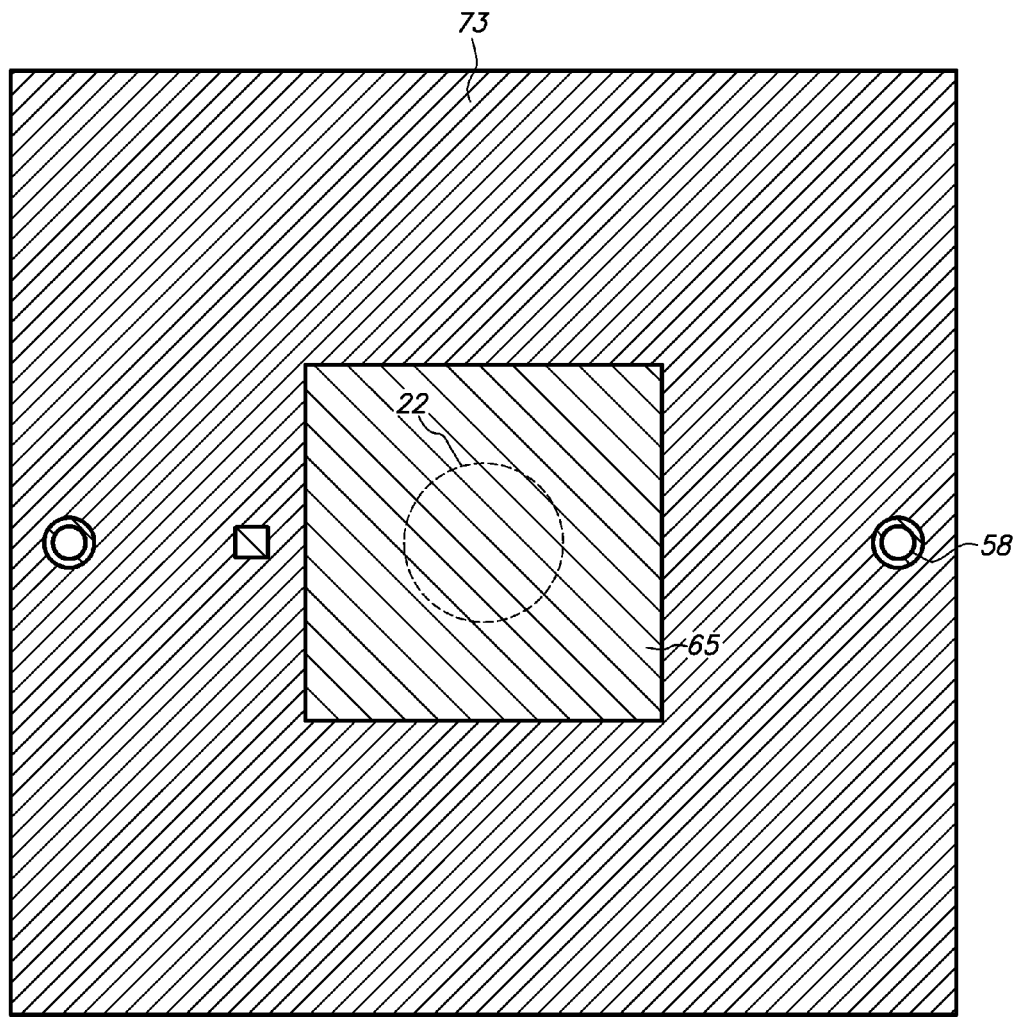
Figure 9C:
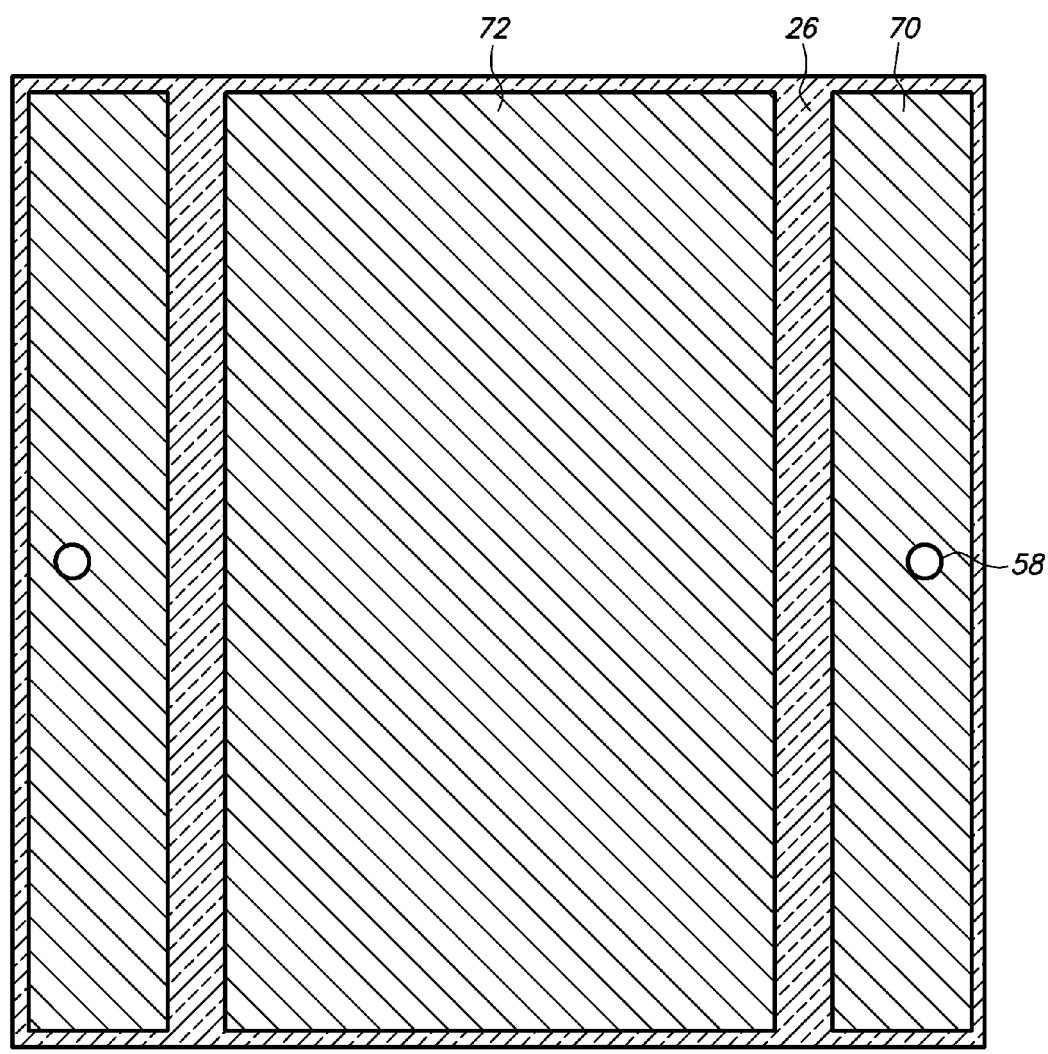

FIGS. 9A, 9B and 9C are cross-sectional, top and bottom views, respectively, of a thermal board with a shared pad in accordance with an embodiment of the present invention.

In this embodiment, the pad and the cap are merged to provide a single unitary dual-purpose pad shared by the conductive trace and the heat spreader. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 90 includes adhesive 32, substrate 36, conductive trace 74 and heat spreader 76. Substrate 36 includes dielectric layer 42. Conductive trace 74 includes plated through-hole 58, shared pad 65 and terminal 70. Heat spreader 76 includes post 22, base 24, ESD protection layer 26, shared pad 65 and underlayer 72.

Shared pad 65 is a combination of pad 64 and cap 66. Shared pad 65 serves as a pad (similar to pad 64) for conductive trace 74 and a cap (similar to cap 66) for heat spreader 76. Shared pad is electrically connected to plated through-hole 58 and thereby electrically connected to terminal 70. Shared pad 65 is also electrically connected to post 22 and base 24 but more importantly remains electrically isolated from underlayer 72 by ESD protection layer 26. Shared pad 65 also overlaps and is adjacent to and thermally connected to post 22 and thereby thermally connected to underlayer 72. Thus, conductive trace 74 and heat spreader 76 share pad 65 and are integral with one another.

Thermal board 90 can be manufactured in a manner similar to thermal board 80 with suitable adjustments for shared pad 65. For instance, adhesive 32 is mounted on base 24, substrate 36 is mounted on adhesive 32, heat and pressure are applied to flow and solidify adhesive 32, grinding is applied to planarize the top and bottom surfaces, inner hole 50 is drilled through the structure and then plated layers 54 and 56 and plated through-hole 58 are deposited on the structure as previously described. Thereafter, conductive layer 40 and plated layer 54 are etched to form shared pad 65 (rather than pad 64 and cap 66) as defined by etch mask 60, metal layer 28 and plated layer 56 are etched to form terminal 70 and underlayer 72 and then plated contacts 78 provide a surface finish for shared pad 65, terminal 70 and underlayer 72. Thereafter, base 24, ESD protection layer 26, adhesive 32 and substrate 36 are cut or cracked at the peripheral edges of thermal board 90 to detach it from the batch.

Figure 10A:
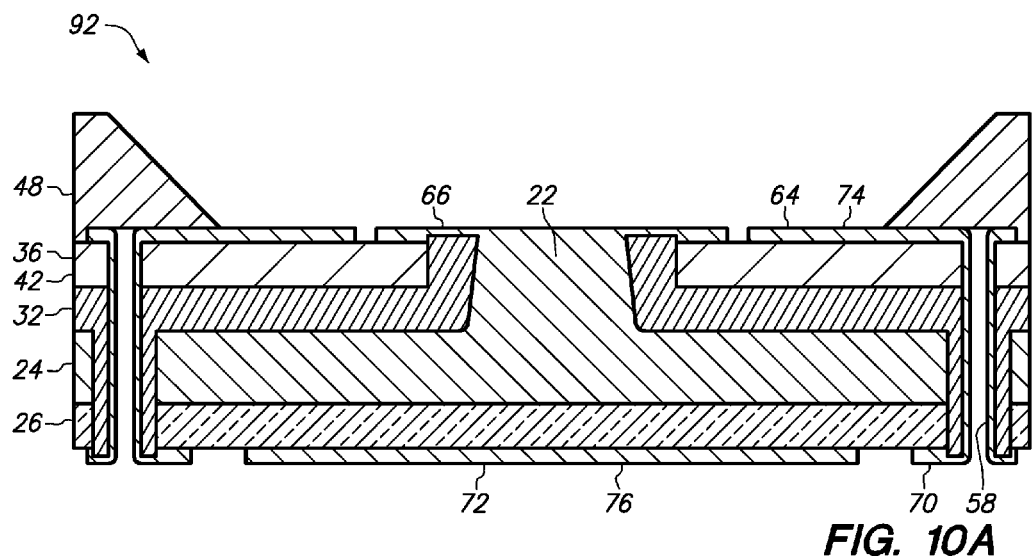
FIGS. 10A, 10B and 10C are cross-sectional, top and bottom views, respectively, of a thermal board with a rim in accordance with an embodiment of the present invention.
Figure 10B:
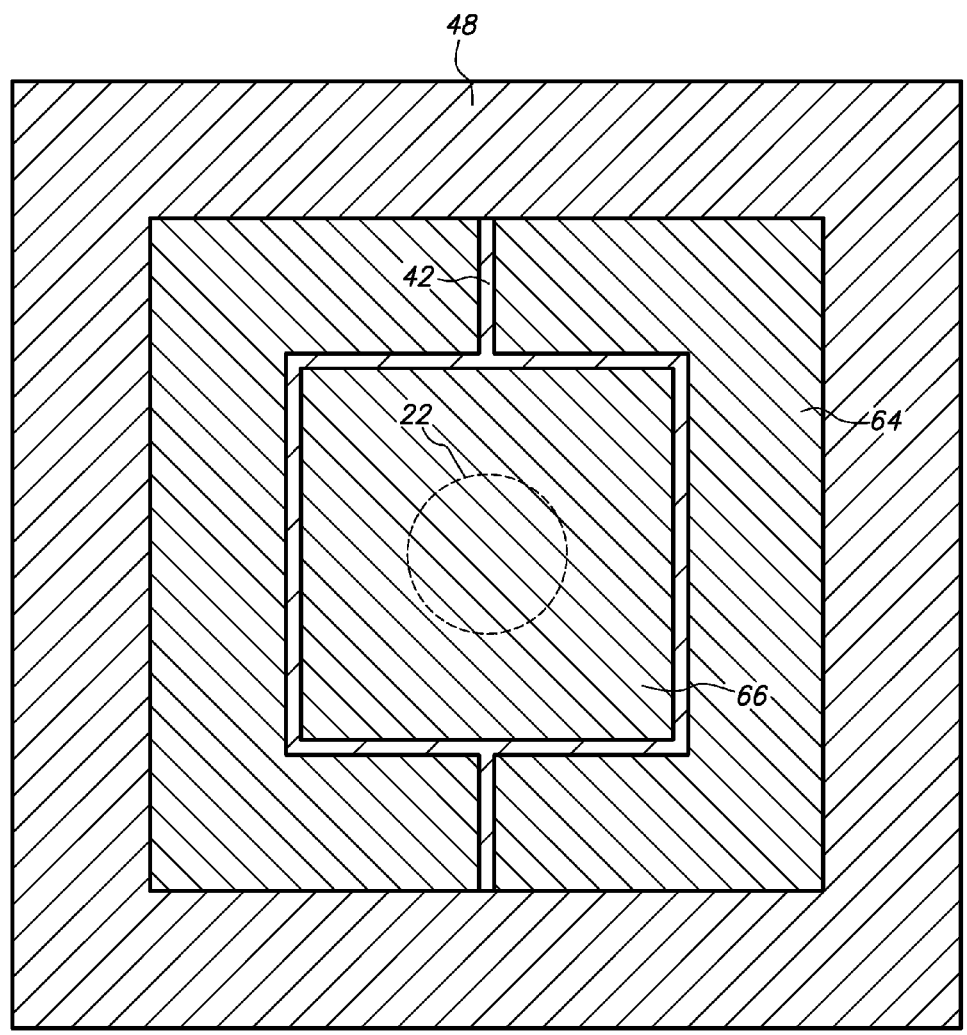
Figure 10C:
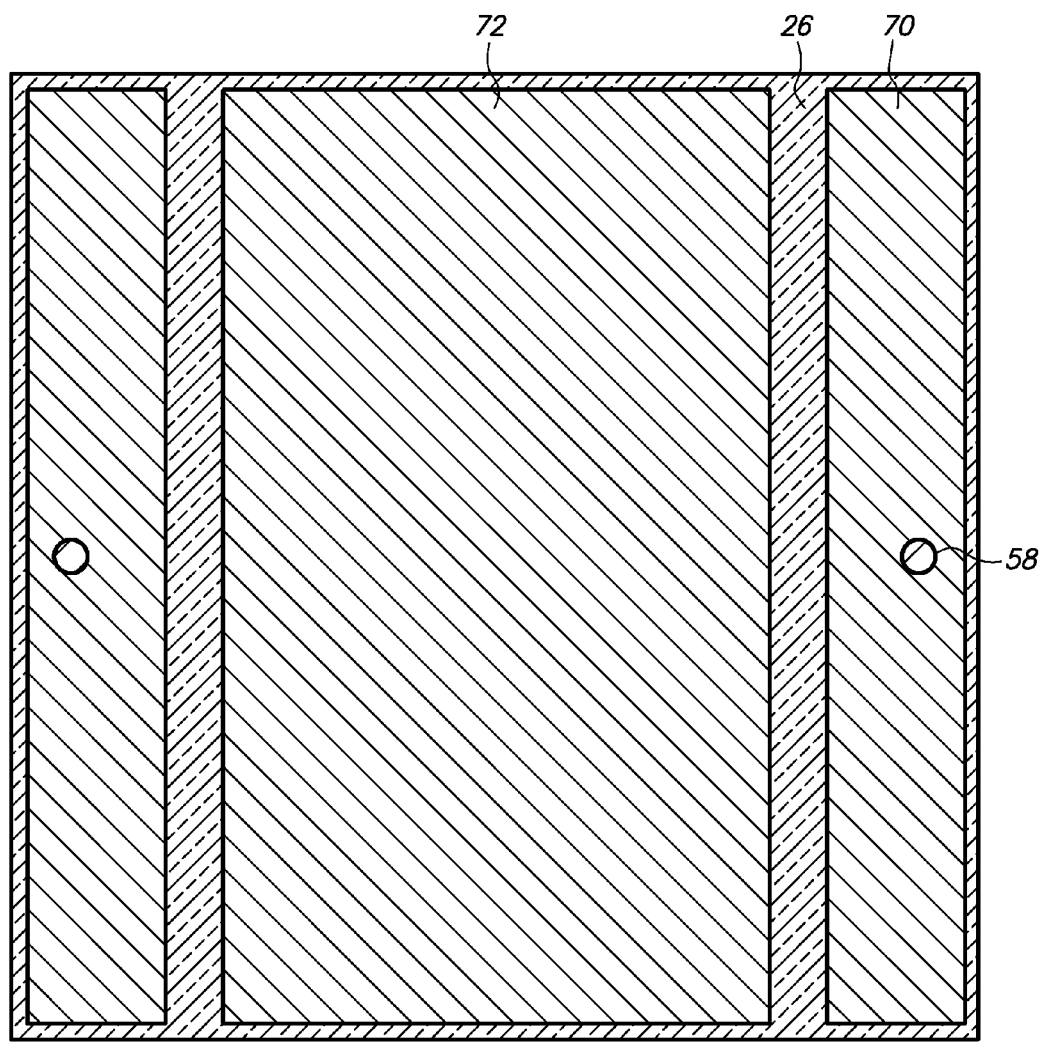

FIGS. 10A, 10B and 10C are cross-sectional, top and bottom views, respectively, of a thermal board with a rim in accordance with an embodiment of the present invention.

In this embodiment, a rim is mounted on the top surface. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 92 includes adhesive 32, substrate 36, rim 48, conductive trace 74 and heat spreader 76. Substrate 36 includes dielectric layer 42. Conductive trace 74 includes plated through-hole 58, pad 64 and terminal 70. Heat spreader 76 includes post 22, base 24, ESD protection layer 26, cap 66 and underlayer 72.

Rim 48 is a square shaped frame that contacts and extends above pad 64. Post 22 and cap 66 are centrally located within the periphery of rim 48. For instance, rim 48 has a height of 600 microns, a width (between its inner and outer sidewalls) of 1000 microns and is laterally spaced from cap 66 by 500 microns.

Rim 48 includes a solder mask, a laminate and an adhesive film shown as a single layer for convenience of illustration. The solder mask contacts and extends above the laminate and provides the top surface, the adhesive film contacts and extends below the laminate and provides the bottom surface, and the laminate contacts and is sandwiched between and laminated to the solder mask and adhesive film. The solder mask, laminate and adhesive film are electrical insulators. For instance, the solder mask has a thickness of 50 microns, the laminate has a thickness of 500 microns, and the adhesive film has thickness of 50 microns. Thus, rim 48 has a height of 600 microns (50+500+50).

The laminate can be various dielectric films formed from numerous organic and inorganic electrical insulators. For instance, the laminate can be polyimide or FR-4 epoxy although other epoxies such as polyfunctional and bismaleimide triazine (BT) are suitable. Alternatively, rim 48 can include a metal ring on the adhesive film.

Thermal board 92 can be manufactured in a manner similar to thermal board 80 with suitable adjustments for rim 48. For instance, adhesive 32 is mounted on base 24, substrate 36 is mounted on adhesive 32, heat and pressure are applied to flow and solidify adhesive 32, grinding is applied to planarize the top and bottom surfaces, inner hole 50 is drilled through the structure and then plated layers 54 and 56 and plated through-hole 58 are deposited on the structure as previously described. Thereafter, conductive layer 40 and plated layer 54 are etched to form pad 64 and cap 66, metal layer 28 and plated layer 56 are etched to form terminal 70 and underlayer 72, then rim 48 is mounted on the top surface and then plated contacts 78 provide a surface finish for pad 64, cap 66, terminal 70 and underlayer 72. Thereafter, base 24, ESD protection layer 26, adhesive 32 and substrate 36 are cut or cracked at the peripheral edges of thermal board 92 to detach it from the batch.

Figure 11A:
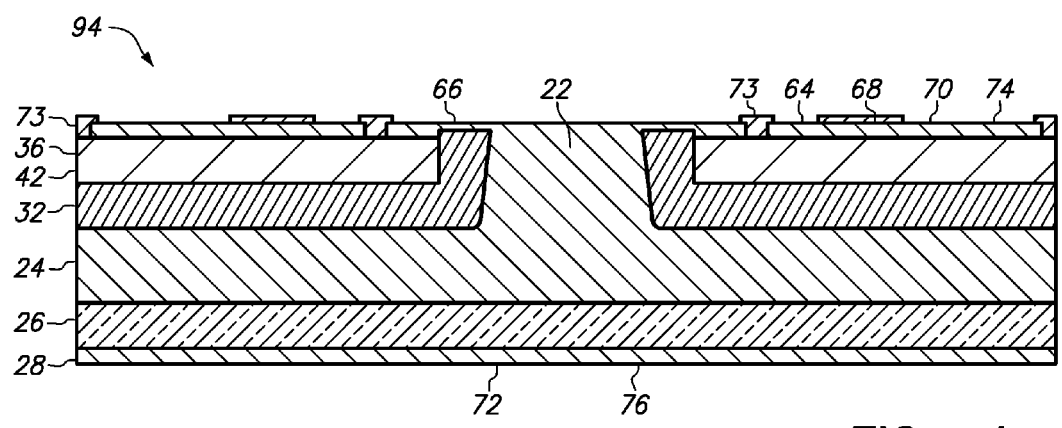
FIGS. 11A, 11B and 11C are cross-sectional, top and bottom views, respectively, of a thermal board with horizontal signal routing in accordance with an embodiment of the present invention.
Figure 11B:
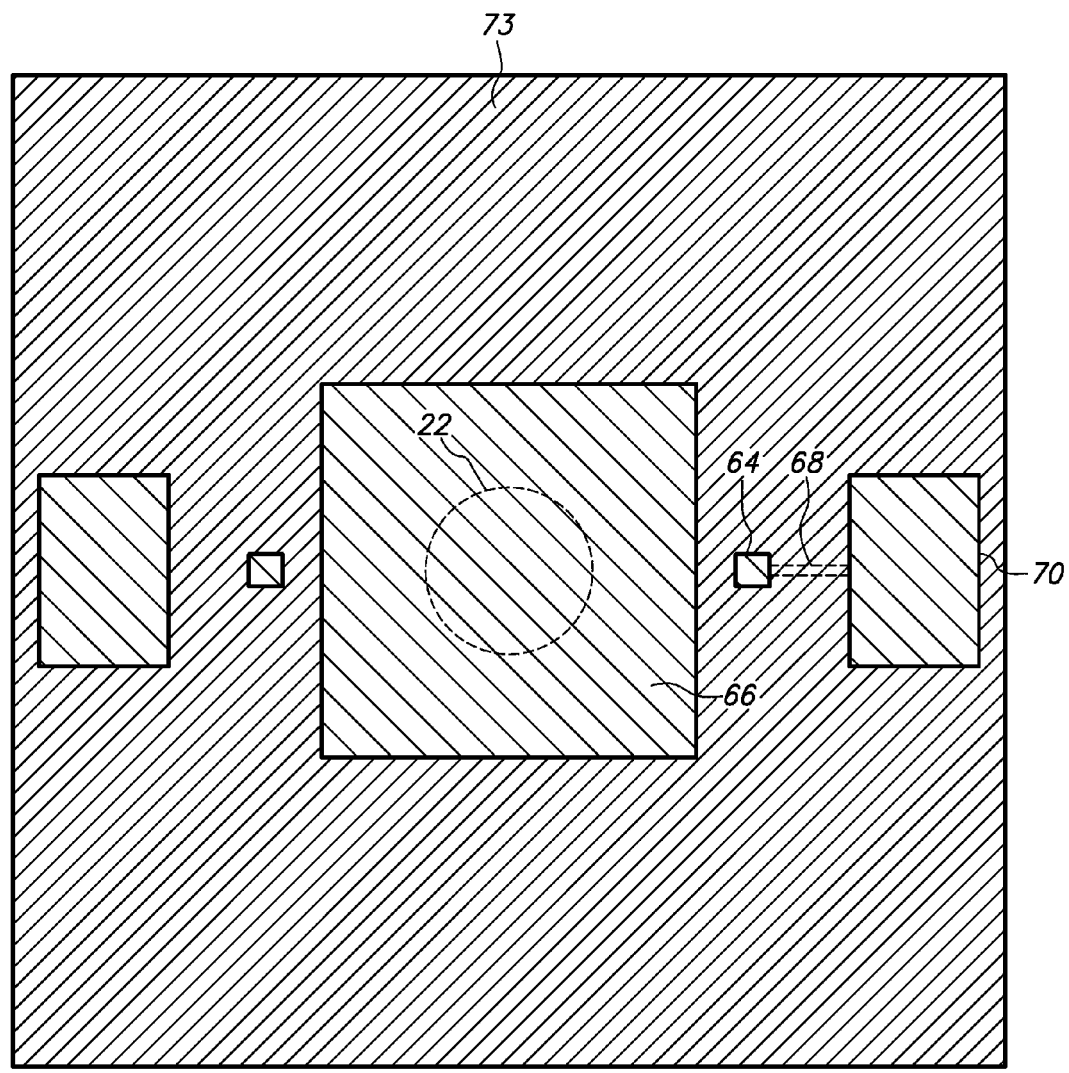
Figure 11C:
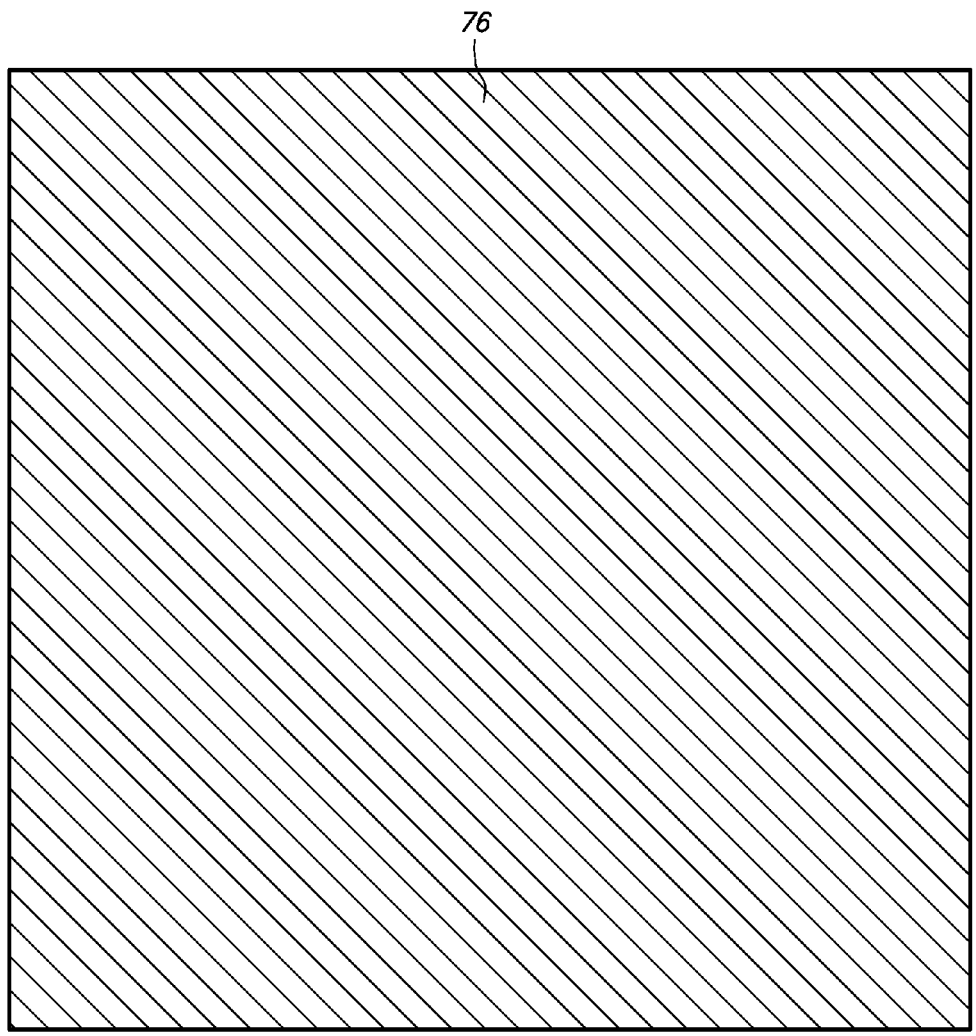

FIGS. 11A, 11B and 11C are cross-sectional, top and bottom views, respectively, of a thermal board with horizontal signal routing in accordance with an embodiment of the present invention.

In this embodiment, the pad and the terminal are located above the dielectric layer and the plated through-hole is omitted. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 94 includes adhesive 32, substrate 36, solder mask 73, conductive trace 74 and heat spreader 76. Substrate 36 includes dielectric layer 42. Conductive trace 74 includes pad 64, routing line 68 and terminal 70. Heat spreader 76 includes post 22, base 24, ESD protection layer 26, cap 66 and underlayer 72.

Conductive trace 74 provides horizontal (lateral) fan-out routing from pad 64 to terminal 70 and routing line 68 provides an electrically conductive path between pad 64 and terminal 70. Pad 64, routing line 68 and terminal 70 are located above and contact dielectric layer 42 and are spaced from and overlap adhesive 32. Pad 64 is coplanar with terminal 70 above dielectric layer 42. Furthermore, inner hole 30, outer hole 50 and plated through-hole 58 are omitted, adhesive 32 is coplanar with post 22 at base 24 and underlayer 72 covers post 22, base 24, ESD protection layer 26, adhesive 32, substrate 36, solder mask 73 and conductive trace 74 in the downward direction and extends to the peripheral edges of thermal board 94.

Solder mask 73 is an electrically insulative layer that selectively exposes pad 64, cap 66 and terminal 70 and covers routing line 68 in the upward direction and extends to the peripheral edges of thermal board 94.

Thermal board 94 can be manufactured in a manner similar to thermal board 80 with suitable adjustments for solder mask 73 and conductive trace 74. For instance, adhesive 32 is mounted on base 24, substrate 36 is mounted on adhesive 32, heat and pressure are applied to flow and solidify adhesive 32, grinding is applied to planarize the top and bottom surfaces and then plated layers 54 and 56 are deposited on the structure as previously described. However, holes 30 and 50 are omitted and therefore plated through-hole 58 is omitted. Thereafter, conductive layer 40 and plated layer 54 are etched to form pad 64, cap 66, routing line 68 and terminal 70 as defined by etch mask 60, metal layer 28 and plated layer 56 remain unpatterned and provide underlayer 72 and then plated contacts 78 provide a surface finish for pad 64, cap 66, terminal 70 and underlayer 72. Thereafter, base 24, ESD protection layer 26, adhesive 32, substrate 36 and underlayer 72 are cut or cracked at the peripheral edges of thermal board 90 to detach it from the batch.

Solder mask 73 is initially a photoimageable liquid resin that is dispensed on the top surface. Thereafter, solder mask 73 is patterned by selectively applying light through a reticle (not shown) so that the solder mask portions exposed to the light are rendered insoluble, applying a developer solution to remove the solder mask portions that are unexposed to the light and remain soluble and then hard baking, as is conventional.

Figure 12A:
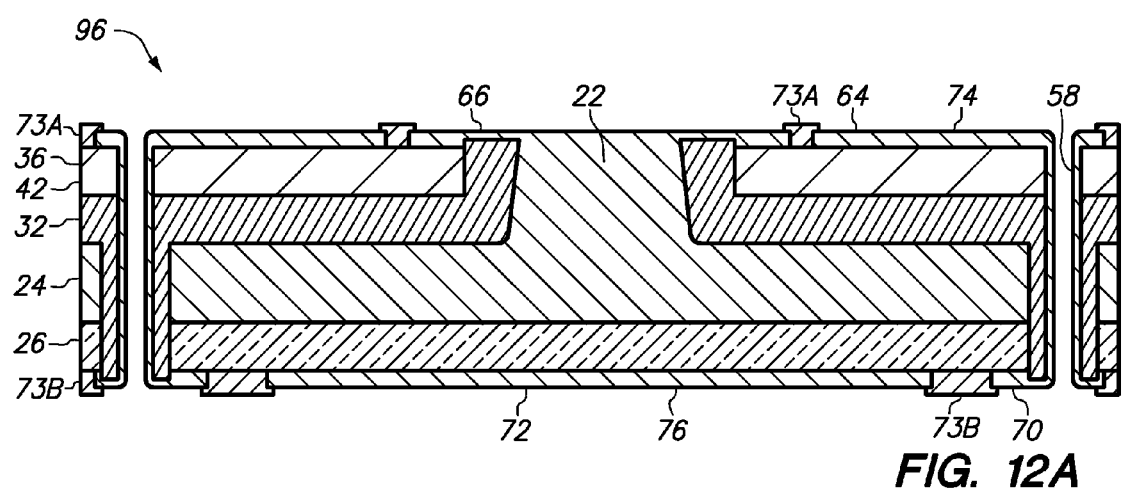
FIGS. 12A, 12B and 12C are cross-sectional, top and bottom views, respectively, of a thermal board with solder masks in accordance with an embodiment of the present invention.
Figure 12B:
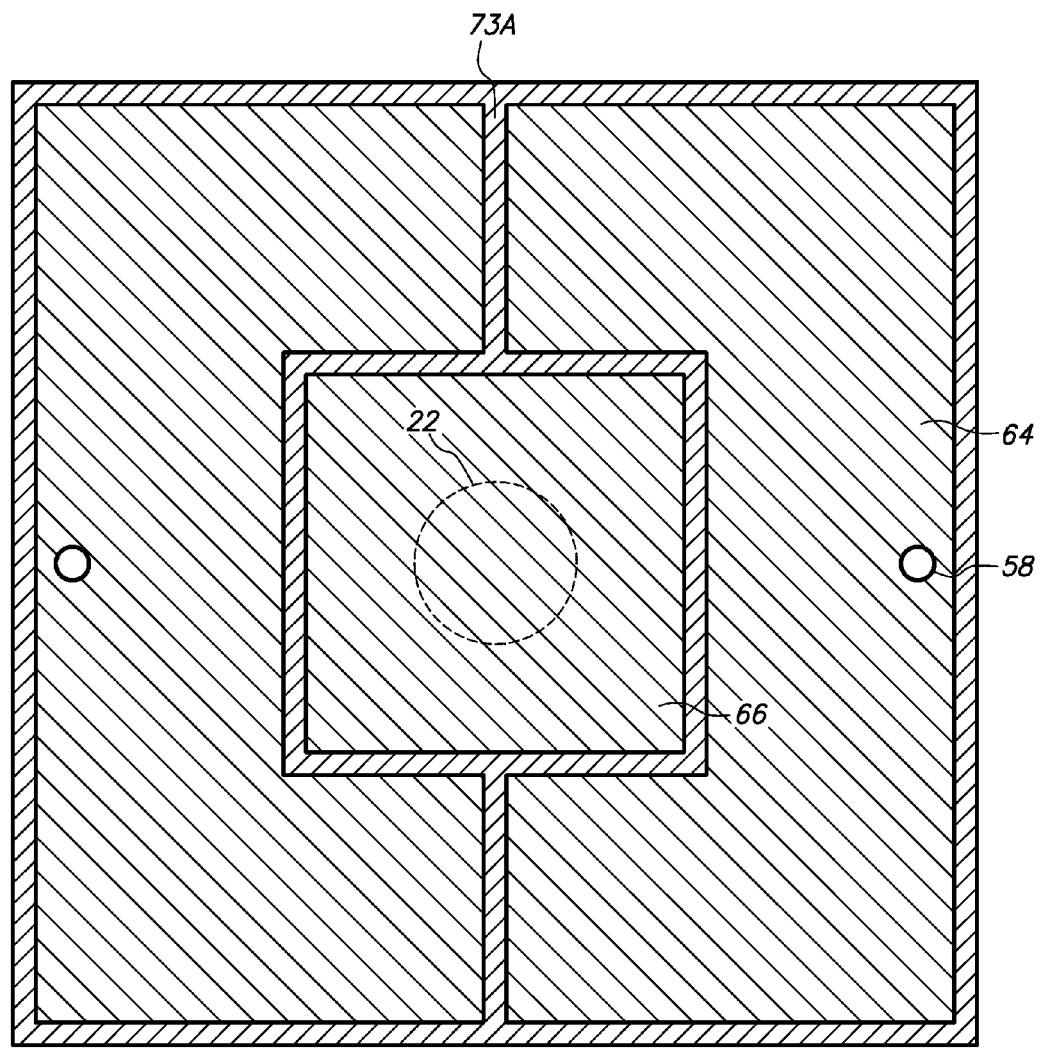
Figure 12C:
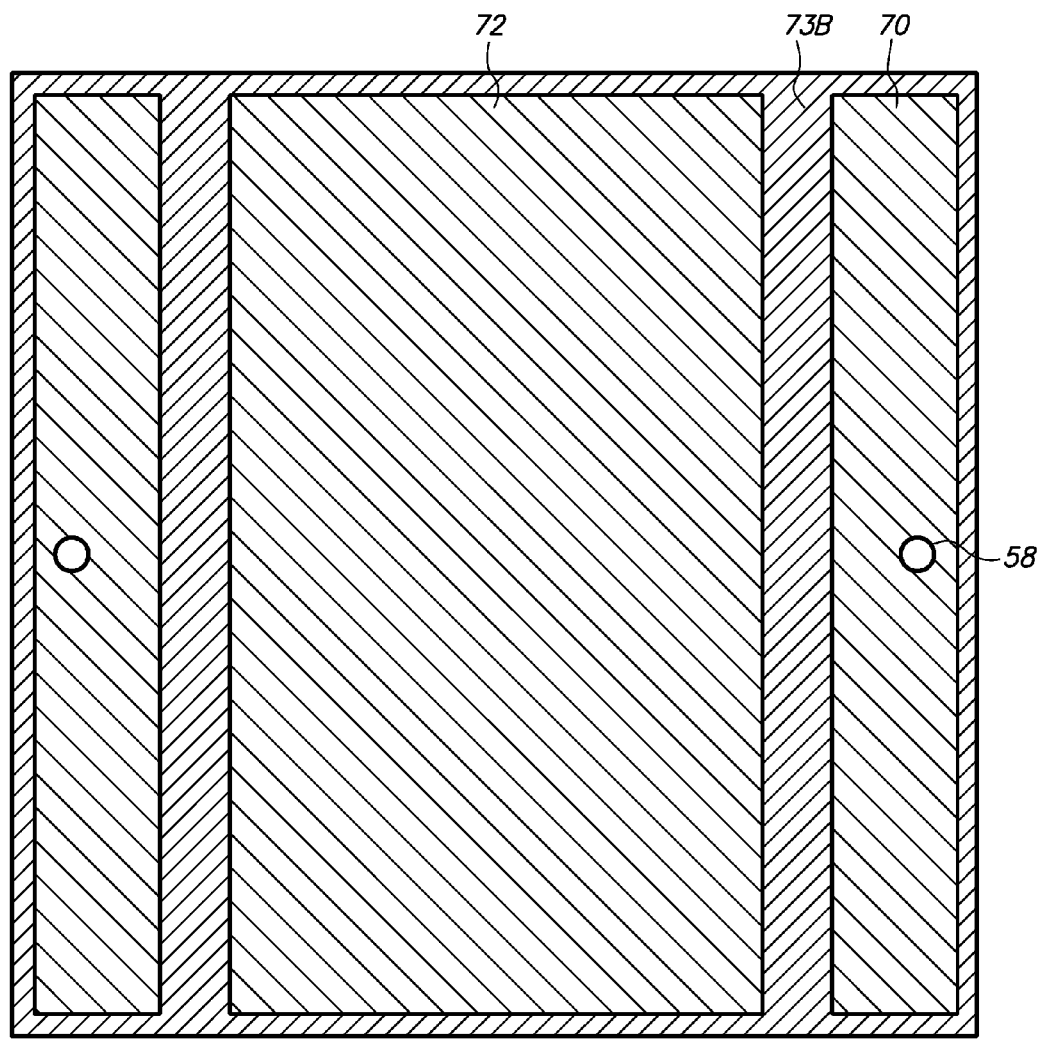

FIGS. 12A, 12B and 12C are cross-sectional, top and bottom views, respectively, of a thermal board with solder masks in accordance with an embodiment of the present invention.

In this embodiment, top and bottom solder masks selectively expose the conductive trace and the heat spreader. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 96 includes adhesive 32, substrate 36, solder masks 73A and 73B, conductive trace 74 and heat spreader 76. Substrate 36 includes dielectric layer 42. Conductive trace 74 includes plated through-hole 58, pad 64 and terminal 70. Heat spreader 76 includes post 22, base 24, ESD protection layer 26, cap 66 and underlayer 72.

Solder mask 73A is an electrically insulative layer that selectively exposes pad 64 and cap 66 in the upward direction and covers dielectric layer 42 where it is otherwise exposed in the upward direction, and solder mask 73B is an electrically insulative layer that selectively exposes terminal 70 and underlayer 72 in the downward direction and covers ESD protection layer 26 where it is otherwise exposed in the downward direction.

Thermal board 96 can be manufactured in a manner similar to thermal board 80 with suitable adjustments for solder masks 73A and 73B. For instance, adhesive 32 is mounted on base 24, substrate 36 is mounted on adhesive 32, heat and pressure are applied to flow and solidify adhesive 32, grinding is applied to planarize the top and bottom surfaces, inner hole 50 is drilled through the structure and then plated layers 54 and 56 and plated through-hole 58 are deposited on the structure as previously described. Thereafter, conductive layer 40 and plated layer 54 are etched to form pad 64 and cap 66, metal layer 28 and plated layer 56 are etched to form terminal 70 and underlayer 72, then solder mask 73A is formed on the top surface and solder mask 73B is formed on the bottom surface and then plated contacts 78 provide a surface finish for pad 64, cap 66, terminal 70 and underlayer 72. Thereafter, base 24, ESD protection layer 26, adhesive 32, substrate 36 and solder masks 73A and 73B are cut or cracked at the peripheral edges of thermal board 96 to detach it from the batch.

Solder masks 73A and 73B are initially a photoimageable liquid resin that is dispensed on the top and bottom surfaces, respectively. Thereafter, solder masks 73A and 73B are patterned by selectively applying light through reticles (not shown) so that the solder mask portions exposed to the light are rendered insoluble, applying a developer solution to remove the solder mask portions that are unexposed to the light and remain soluble and then hard baking, as is conventional.

Figure 13A:
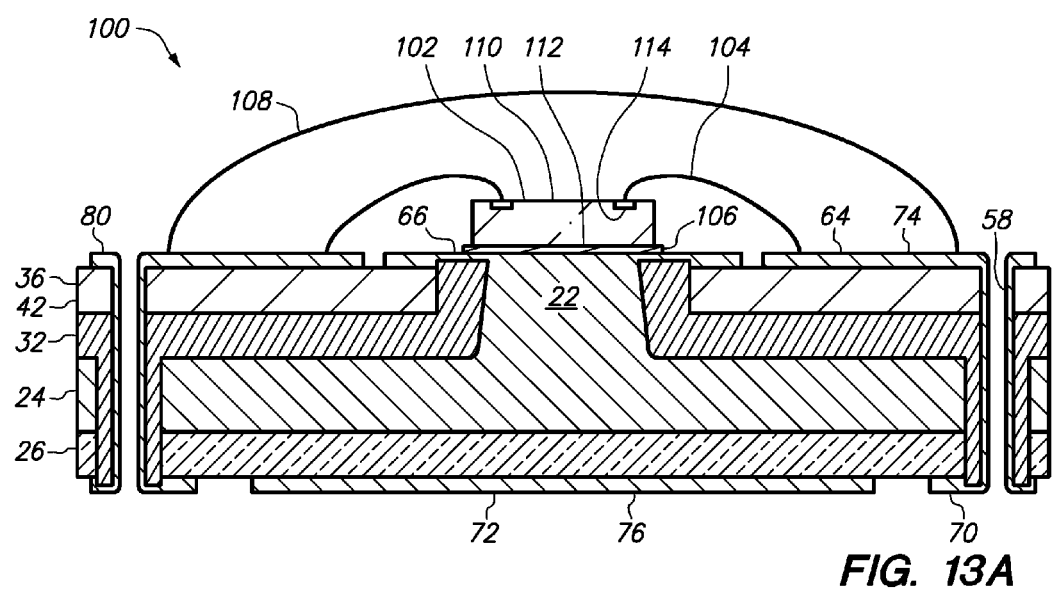
FIGS. 13A, 13B and 13C are cross-sectional, top and bottom views, respectively, of a semiconductor chip assembly that includes a thermal board, a semiconductor device and an encapsulant in accordance with an embodiment of the present invention.
Figure 13B:
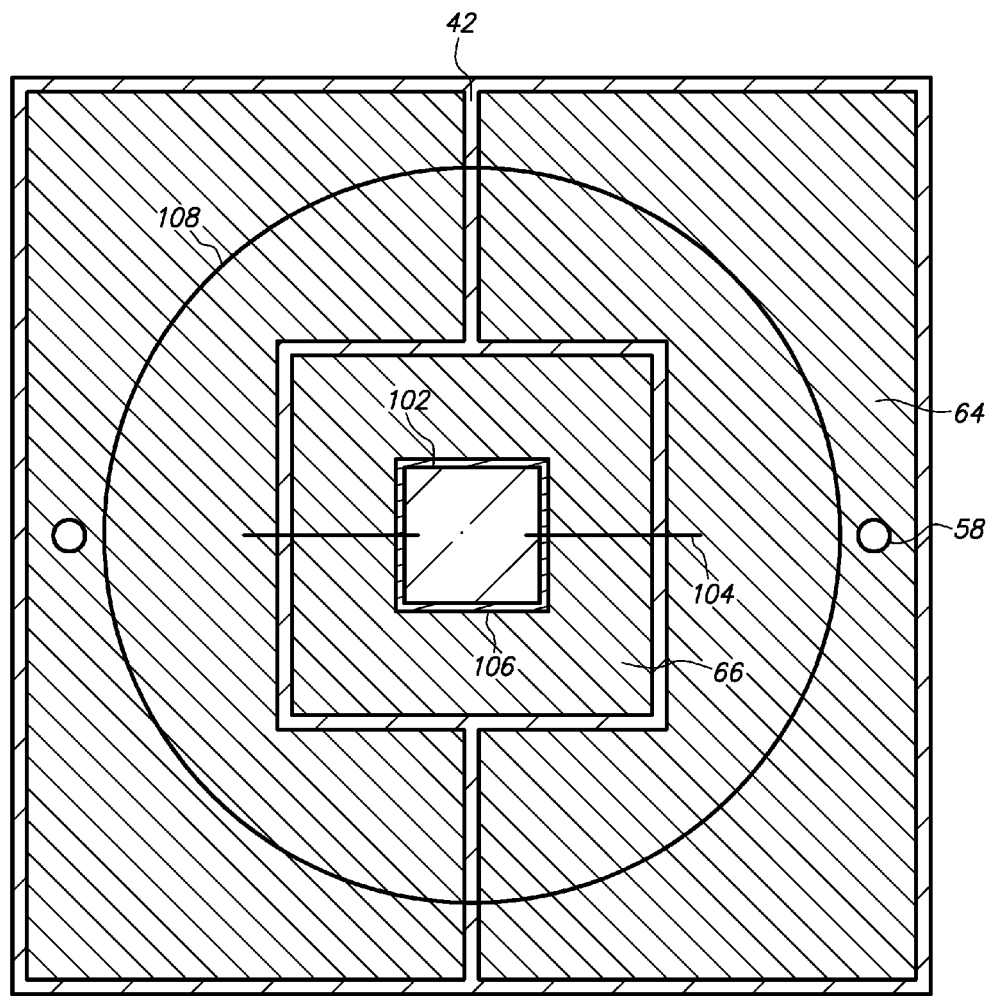
Figure 13C:
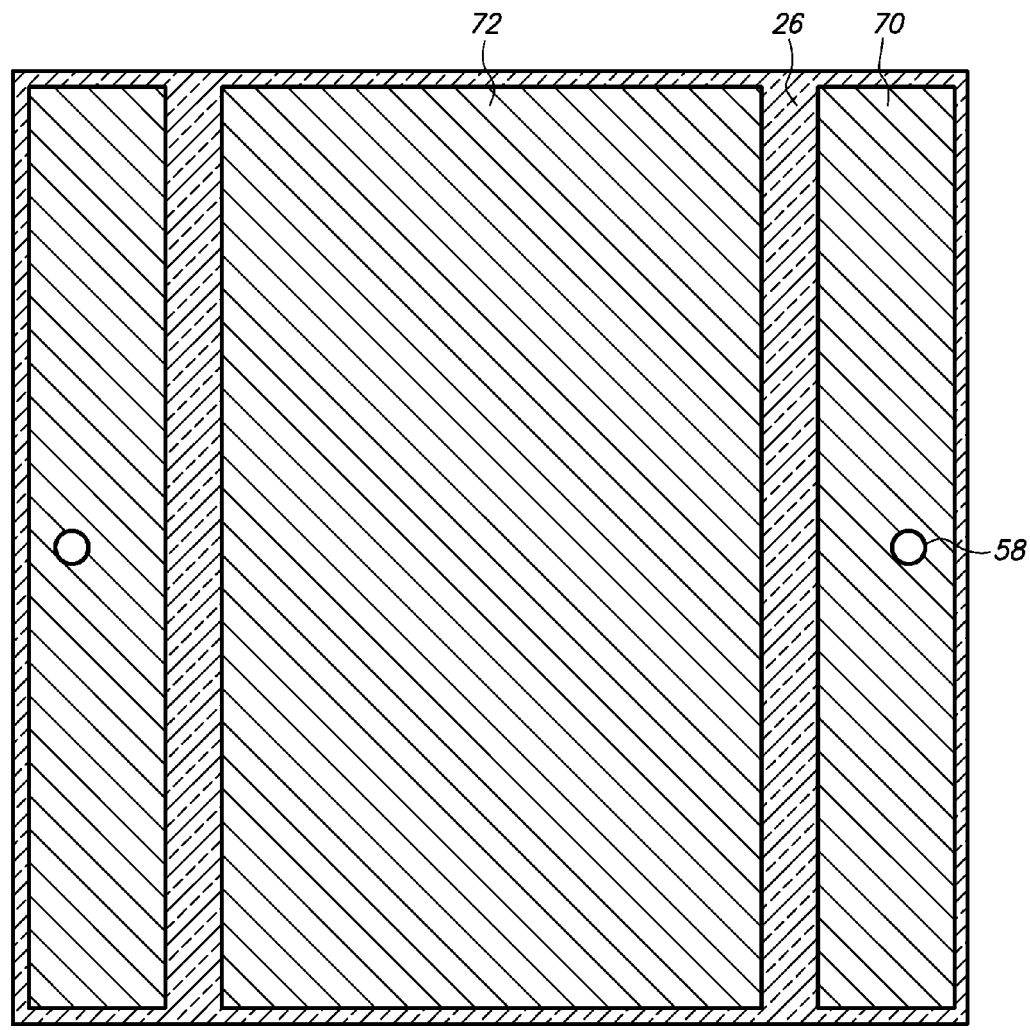

FIGS. 13A, 13B and 13C are cross-sectional, top and bottom views, respectively, of a semiconductor chip assembly that includes a thermal board, a semiconductor device and an encapsulant in accordance with an embodiment of the present invention.

In this embodiment, the semiconductor device is an LED chip that emits blue light, is mounted on the cap, is electrically connected to the pad using a wire bond and is thermally connected to the cap using a die attach. The semiconductor device is covered by a color-shifting encapsulant that converts the blue light to white light.

Semiconductor chip assembly 100 includes thermal board 80, LED chip 102, wire bond 104, die attach 106 and encapsulant 108. LED chip 102 includes top surface 110, bottom surface 112 and bond pad 114. Top surface 110 is the active surface and includes bond pad 114 and bottom surface 112 is a thermal contact surface.

LED chip 102 is mounted on heat spreader 76, electrically connected to conductive trace 74 and thermally connected to heat spreader 76. In particular, LED chip 102 is mounted on cap 66 (and thus post 22), overlaps post 22, base 24, ESD protection layer 26, cap 66 and underlayer 72 but does not overlap substrate 36 or conductive trace 74, is electrically connected to pad 64 by wire bond 104 and is thermally connected to and mechanically attached to cap 66 by die attach 106.

For instance, wire bond 104 is bonded to and electrically connects pads 64 and 114, thereby electrically connecting LED chip 102 to terminal 70. Die attach 106 contacts and is sandwiched between and thermally connects and mechanically attaches cap 66 and thermal contact surface 112, thereby thermally connecting LED chip 102 to post 22, thereby thermally connecting LED chip 102 to base 24, thereby thermally connecting LED chip 102 to ESD protection layer 26 and thereby thermally connecting LED chip 102 to underlayer 72.

Encapsulant 108 is a solid adherent electrically insulative color-shifting protective enclosure that provides environmental protection such as moisture resistance and particle protection for LED chip 102 and wire bond 104. Encapsulant 108 contacts dielectric layer 42, pad 64, cap 66, LED chip 102, wire bond 104 and die attach 106, is spaced from post 22, base 24, ESD protection layer 26, adhesive 32, plated through-hole 58, terminal 70 and underlayer 72 and covers post 22, cap 66, underlayer 72, LED chip 102, wire bond 104 and die attach 106 in the upward direction. Encapsulant 108 is transparent for convenience of illustration.

Pad 64 is spot plated with nickel/silver to bond well with wire bond 104, thereby improving signal transfer from conductive trace 74 to LED chip 102, and cap 66 is spot plated with nickel/silver to bond well with die attach 106, thereby improving heat transfer from LED chip 102 to heat spreader 76. Pad 64 and cap 66 also provide a highly reflective surface which reflects the light emitted towards the silver surface layer by LED chip 102, thereby increasing light output in the upward direction. Furthermore, since cap 66 is shaped and sized to accommodate thermal contact surface 112, post 22 is not and need not be shaped and sized to accommodate thermal contact 112.

LED chip 102 includes a compound semiconductor that emits blue light, has high luminous efficiency and forms a p-n junction. Suitable compound semiconductors include gallium-nitride, gallium-arsenide, gallium-phosphide, gallium-arsenic-phosphide, gallium-aluminum-phosphide, gallium-aluminum-arsenide, indium-phosphide and indium-gallium-phosphide. LED chip 102 also has high light output and generates considerable heat.

Encapsulant 108 includes transparent silicone and yellow phosphor. For instance, the silicone can be polysiloxane resin and the yellow phosphor can be cerium-doped yttrium-aluminum-garnet (Ce:YAG) fluorescent powder. The yellow phosphor emits yellow light in response to blue light, and the blue and yellow light mix to produce white light. As a result, encapsulant 108 converts the blue light emitted by LED chip 102 into white light and assembly 100 is a white light source. In addition, encapsulant 108 has a hemisphere dome shape which provides a convex refractive surface that focuses the white light in the upward direction.

Semiconductor chip assembly 100 can be manufactured by mounting LED chip 102 on cap 66 using die attach 106, then wire bonding pads 64 and 114 and then forming encapsulant 108.

For instance, die attach 106 is initially a silver-filled epoxy paste with high thermal conductivity that is selectively screen printed on cap 66 and then LED chip 102 placed on the epoxy paste using a pick-up head and an automated pattern recognition system in step-and-repeat fashion. Thereafter, the epoxy paste is heated and hardened at a relatively low temperature such as 190° C. to form die attach 106. Next, wire bond 104 is a gold wire that is thermosonically ball bonded to pads 64 and 114 and then encapsulant 108 is molded on the structure.

LED chip 102 can be electrically connected to pad 64 by a wide variety of connection media, thermally connected to and mechanically attached to heat spreader 76 by a wide variety of thermal adhesives and encapsulated by a wide variety of encapsulants.

Semiconductor chip assembly 100 is a first-level single-chip package.

Figure 14A:
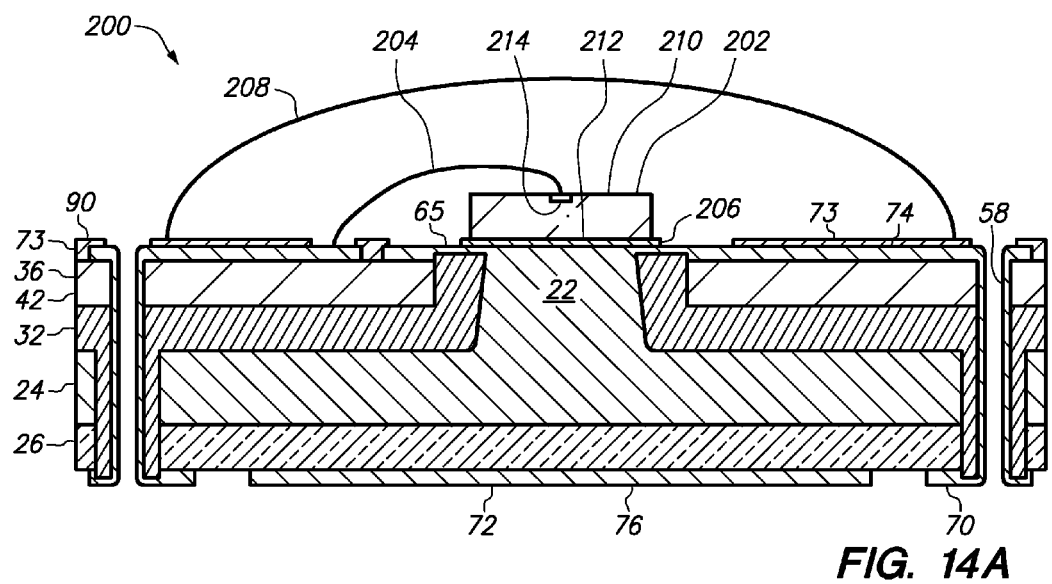
FIGS. 14A, 14B and 14C are cross-sectional, top and bottom views, respectively, of a semiconductor chip assembly that includes a thermal board with a shared pad, a semiconductor device with a thermal/electrical contact surface and an encapsulant in accordance with an embodiment of the present invention.
Figure 14B:
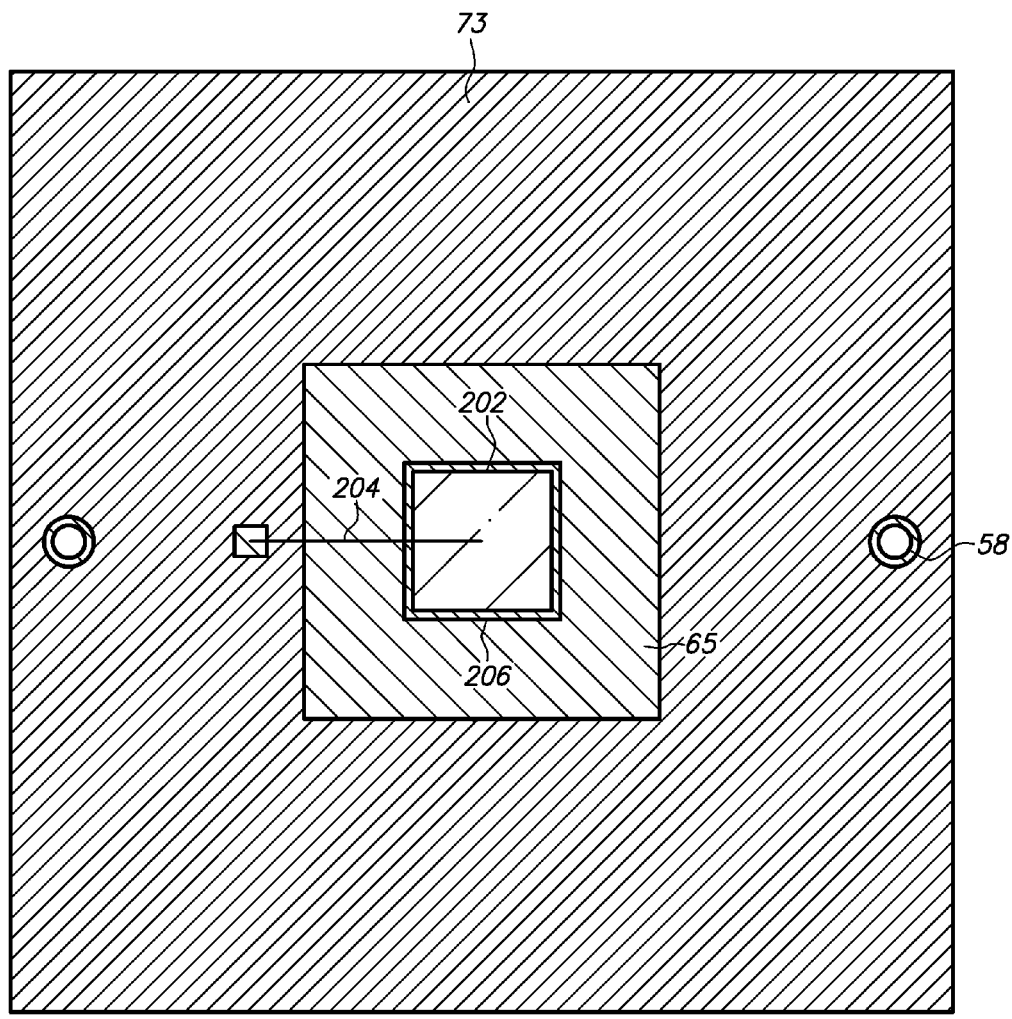
Figure 14C:
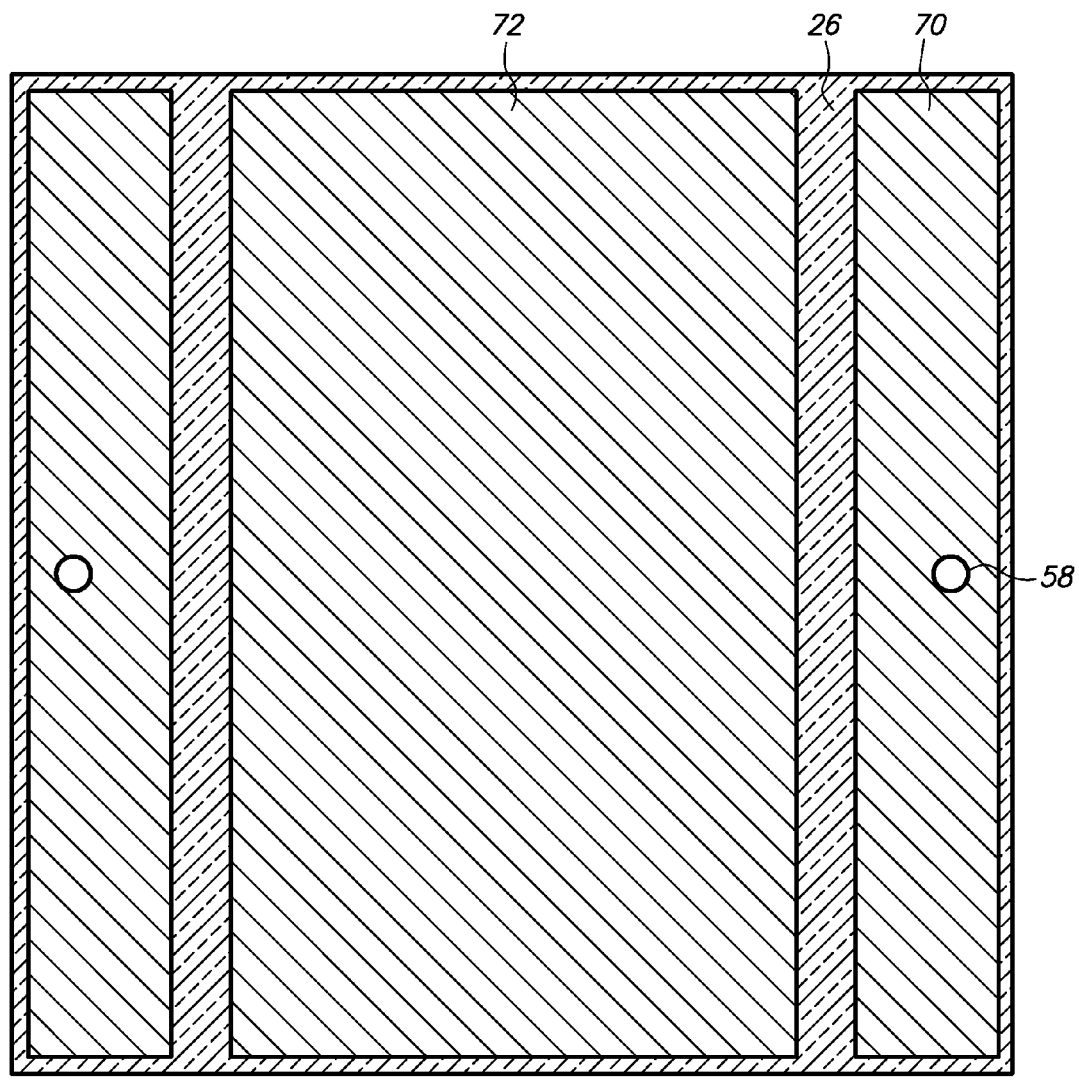

FIGS. 14A, 14B and 14C are cross-sectional, top and bottom views, respectively, of a semiconductor chip assembly that includes a thermal board with a shared pad, a semiconductor with a thermal/electrical contact surface and an encapsulant in accordance with an embodiment of the present invention.

In this embodiment, the semiconductor device has an electrical/thermal contact surface that is electrically and thermally connected to a pad shared by the conductive trace and the heat spreader. For purposes of brevity, any description of assembly 100 is incorporated herein insofar as the same is applicable, and the same description need not be repeated. Likewise, elements of the assembly similar to those in assembly 100 have corresponding reference numerals indexed at two-hundred rather than one-hundred. For instance, LED chip 202 corresponds to LED chip 102, wire bond 204 corresponds to wire bond 104, etc.

Semiconductor chip assembly 200 includes thermal board 90, LED chip 202, wire bond 204, die attach 206 and encapsulant 208. LED chip 202 includes top surface 210 and bottom surface 212. Top surface 210 includes bond pad 214 and bottom surface 212 is a thermal/electrical contact surface.

Thus, LED chip 202 is a vertical chip with bond pad 214 as a frontside electrical pad and thermal/electrical contact surface 212 as a backside electrical pad.

LED chip 202 is mounted on heat spreader 76, electrically connected to conductive trace 74 and thermally connected to heat spreader 76. In particular, LED chip 202 is mounted on pad 65 (and thus post 22), overlaps post 22, base 24, ESD protection layer 26, pad 65 and underlayer 72 but does not overlap substrate 36 or terminal 70 and is electrically connected to, thermally connected to and mechanically attached to pad 65 by die attach 206.

For instance, die attach 206 is a gold-tin eutectic with high thermal and electrical conductivity that contacts and is sandwiched between and electrically and thermally connects and mechanically attaches pad 65 and thermal/electrical contact surface 212, thereby electrically connecting LED chip 202 to terminal 70 and thermally connecting LED chip 202 to underlayer 72. Furthermore, wire bond 204 is bonded to and electrically connects bond pad 214 and another conductive trace that is electrically isolated from heat spreader 76, thereby electrically connecting LED chip 202 to another terminal.

Semiconductor chip assembly 200 can be manufactured by mounting LED chip 202 on pad 65 using die attach 206, thereby electrically connecting LED chip 202 to conductive trace 74 and thermally connecting LED chip 202 to heat spreader 76, then wire bonding pad 214 to another conductive trace and then forming encapsulant 218 by molding.

Semiconductor chip assembly 200 is a first-level single-chip package.

Figure 15A:
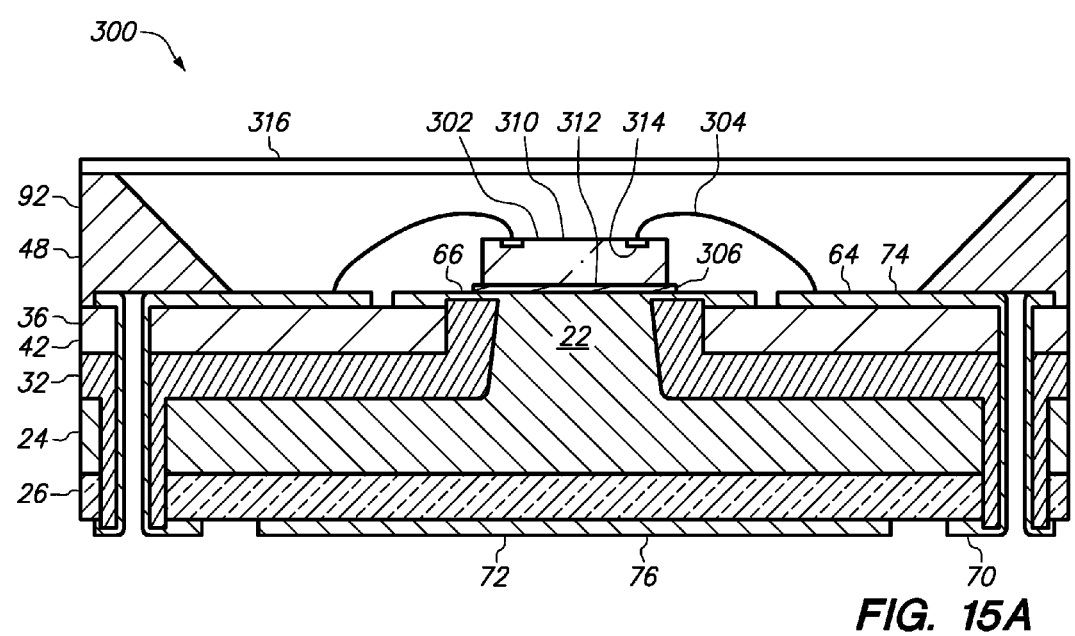
FIGS. 15A, 15B and 15C are cross-sectional, top and bottom views, respectively, of a semiconductor chip assembly that includes a thermal board with a rim, a semiconductor device and a lid in accordance with an embodiment of the present invention.
Figure 15B:
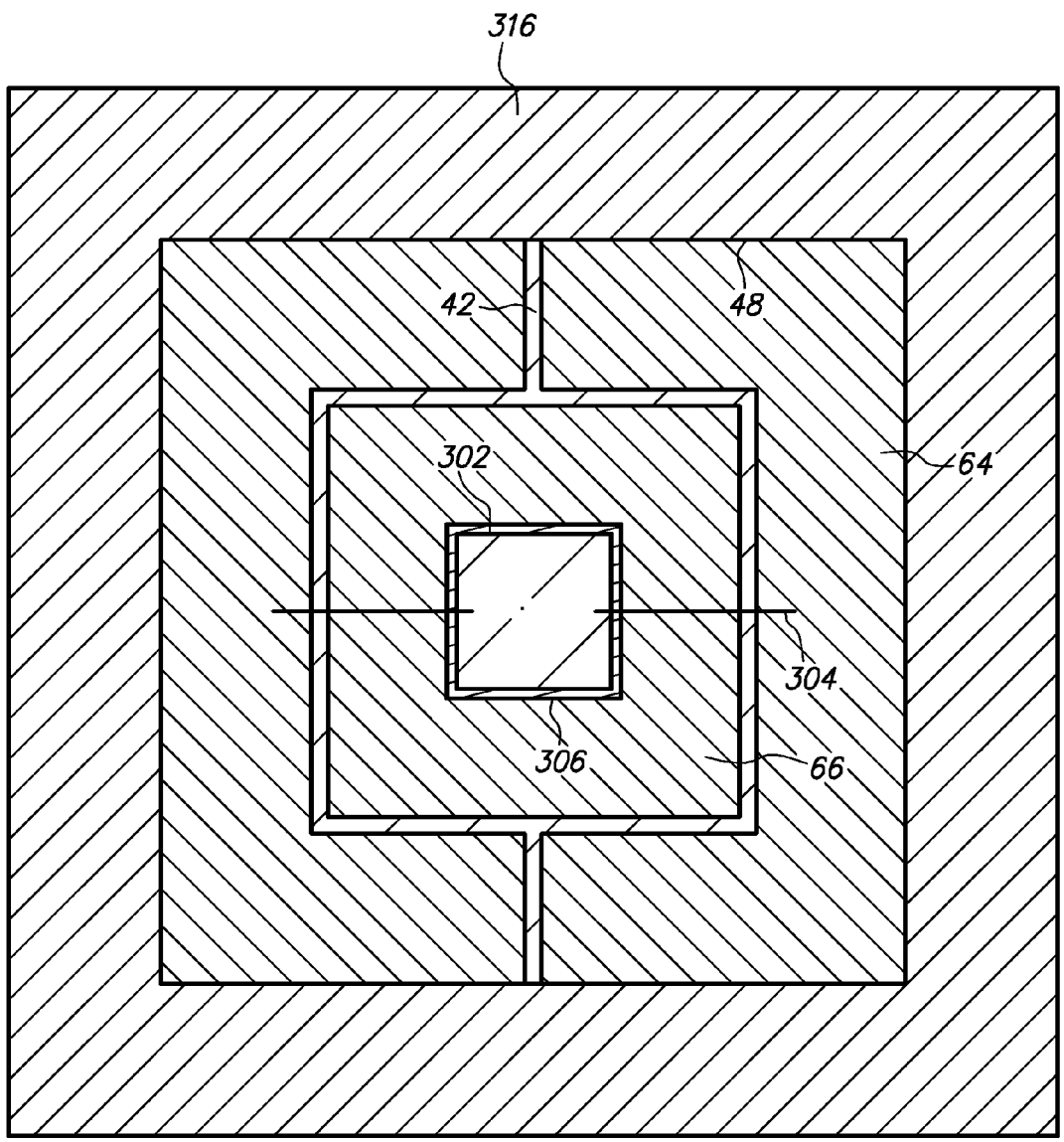
Figure 15C:
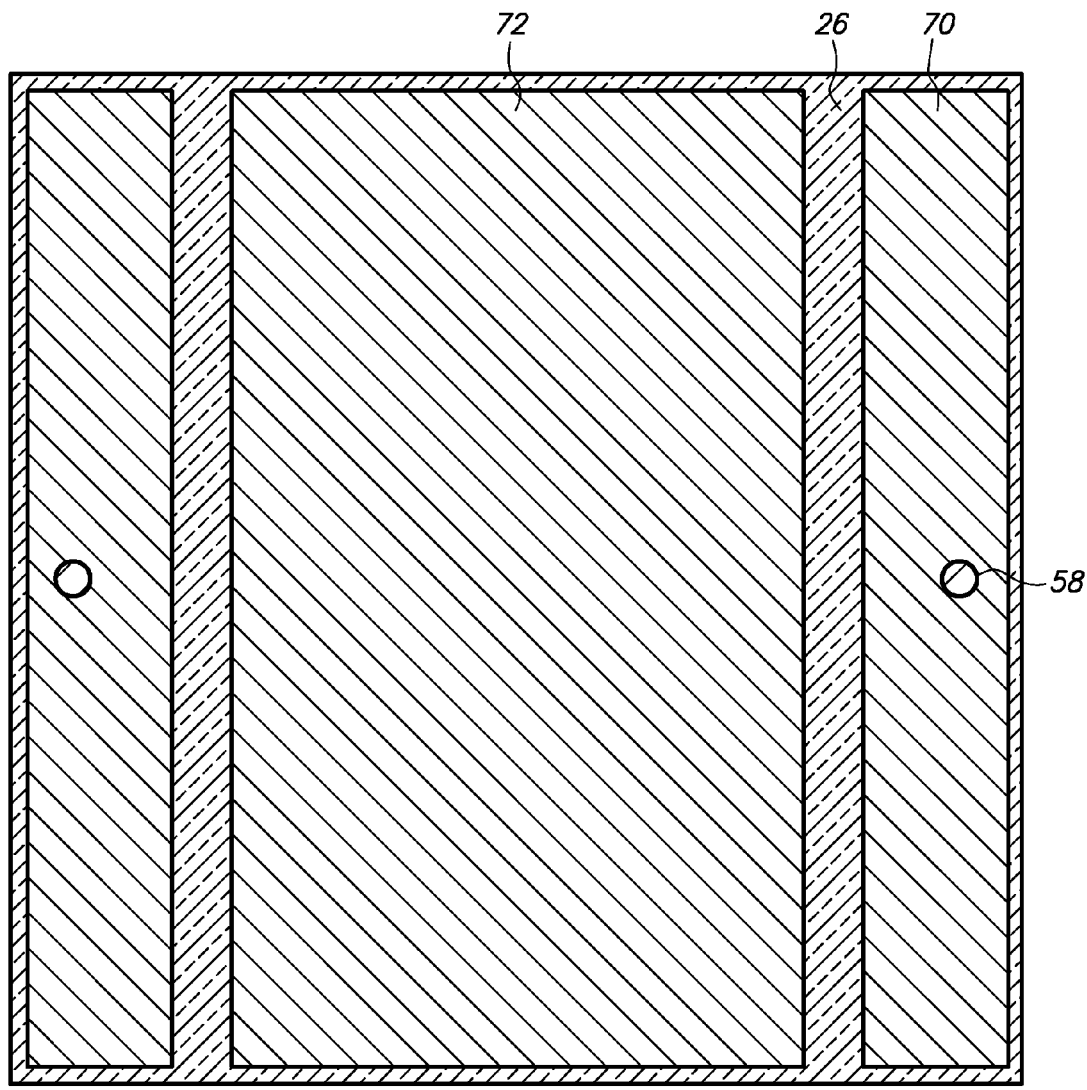

FIGS. 15A, 15B and 15C are cross-sectional, top and bottom views, respectively, of a semiconductor chip assembly that includes a thermal board with a rim, a semiconductor device and a lid in accordance with an embodiment of the present invention.

In this embodiment, the lid is mounted on the rim and the encapsulant is omitted. For purposes of brevity, any description of assembly 100 is incorporated herein insofar as the same is applicable, and the same description need not be repeated. Likewise, elements of the assembly similar to those in assembly 100 have corresponding reference numerals indexed at three-hundred rather than one-hundred. For instance, LED chip 302 corresponds to LED chip 102, wire bond 304 corresponds to wire bond 104, etc.

Semiconductor chip assembly 300 includes thermal board 92, LED chip 302, wire bond 304, die attach 306 and lid 316. LED chip 302 includes top surface 310, bottom surface 312 and bond pad 314. Top surface 310 is the active surface and includes bond pad 314 and bottom surface 312 is the thermal contact surface.

LED chip 302 is mounted on heat spreader 76, electrically connected to conductive trace 74 and thermally connected to heat spreader 76. In particular, LED chip 302 is mounted on cap 66 (and thus post 22), overlaps post 22, base 24, ESD protection layer 26, cap 66 and underlayer 72 but does not overlap substrate 36 or conductive trace 74, is electrically connected to pad 64 by wire bond 304 and is thermally connected to and mechanically attached to cap 66 by die attach 306.

Lid 316 is a glass sheet that is mounted on rim 48, thereby forming a sealed enclosure for LED chip 302 and wire bond 304 in an air cavity. Furthermore, lid 316 is transparent and does not color-shift light.

LED chip 302 emits white light which in turn radiates through lid 316 and assembly 300 is a white light source.

Semiconductor chip assembly 300 can be manufactured by mounting LED chip 302 on cap 66 using die attach 306, then wire bonding pads 64 and 314 and then mounting lid 316 on rim 48.

Semiconductor chip assembly 300 is a first-level single-chip package.

Figure 16A:
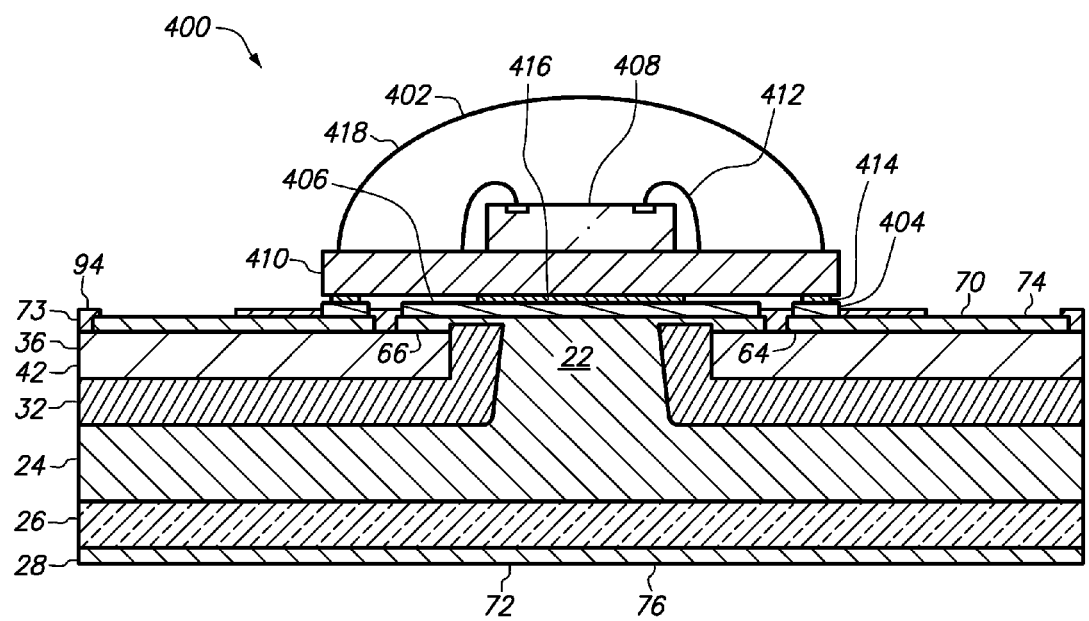
FIGS. 16A, 16B and 16C are cross-sectional, top and bottom views, respectively, of a semiconductor chip assembly that includes a thermal board with horizontal signal routing and a semiconductor device with backside contacts in accordance with an embodiment of the present invention.
Figure 16B:
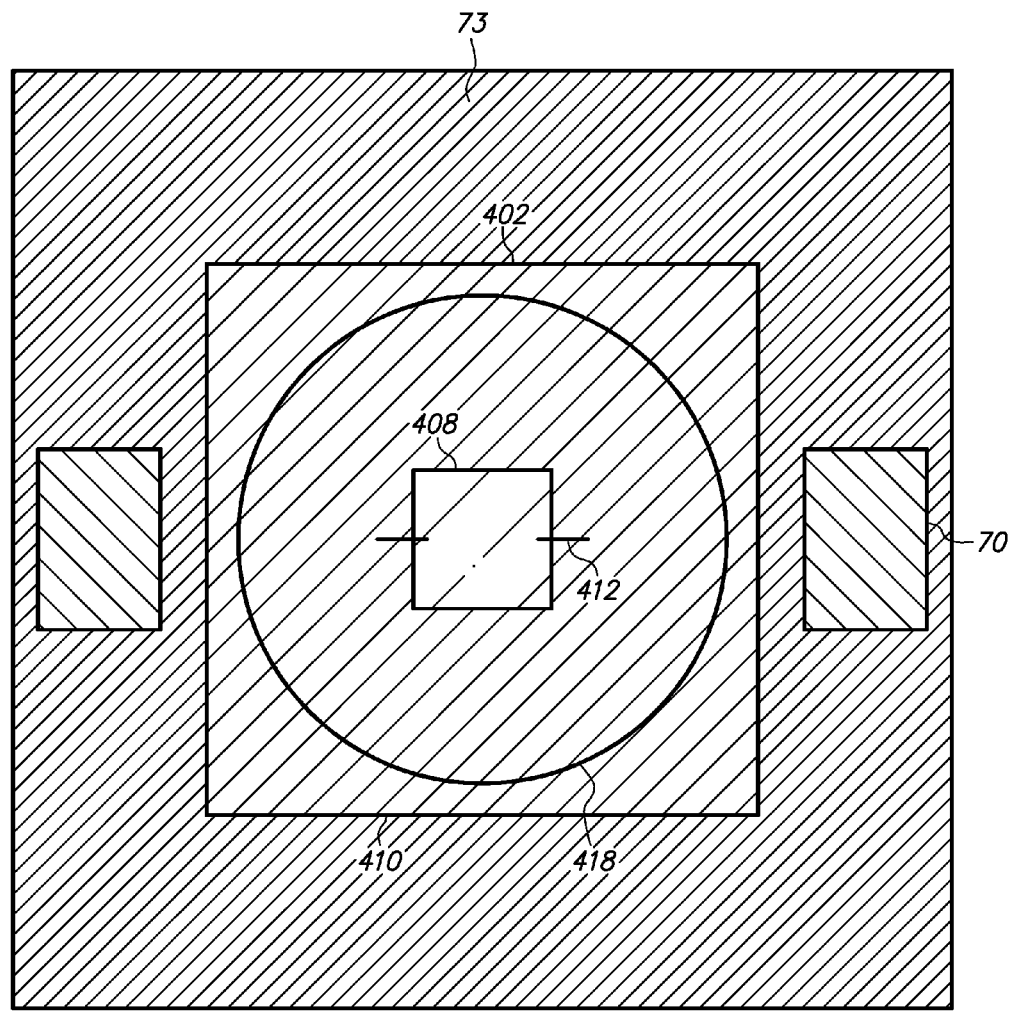
Figure 16C:
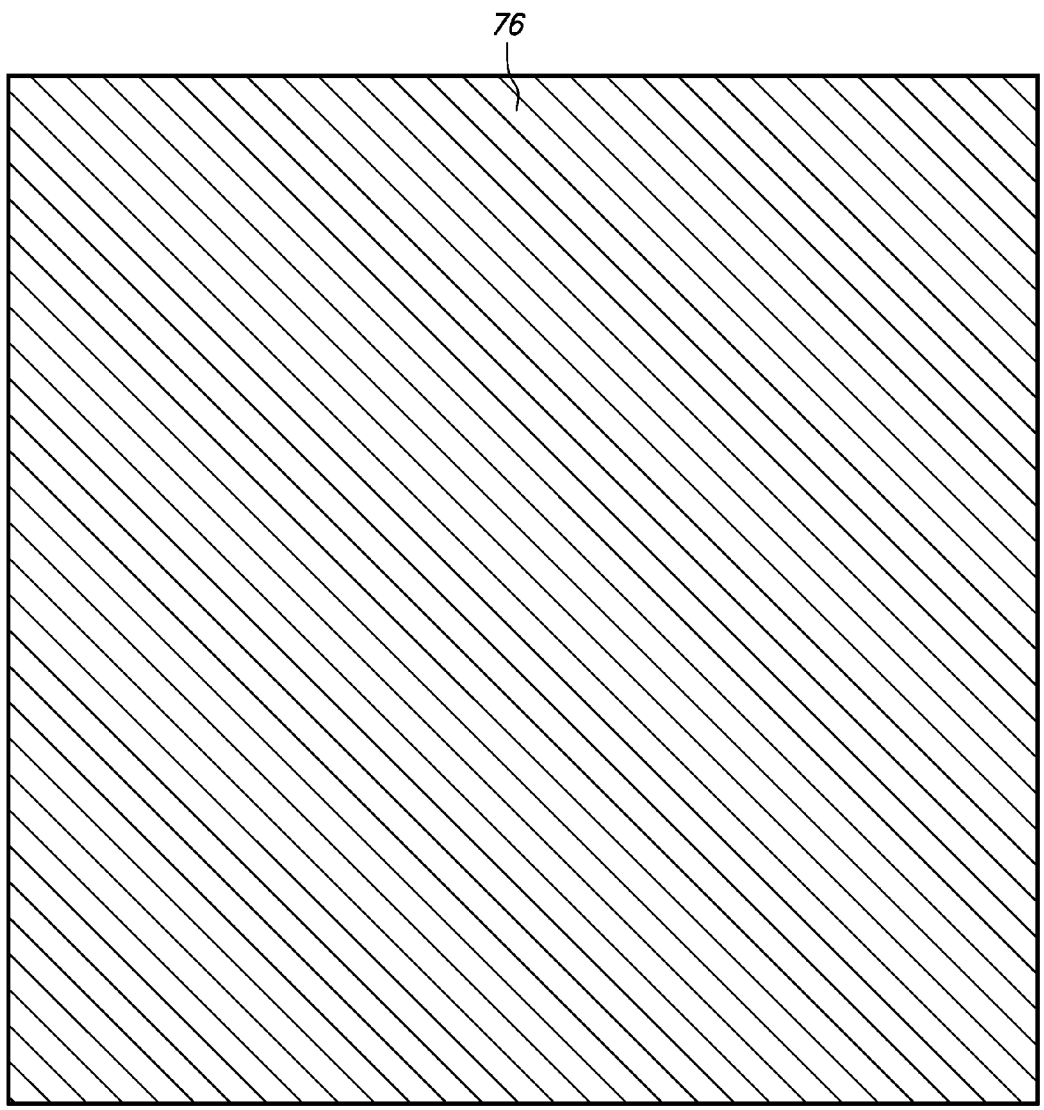

FIGS. 16A, 16B and 16C are cross-sectional, top and bottom views, respectively, of a semiconductor chip assembly that includes a thermal board with horizontal routing and a semiconductor device with backside contacts in accordance with an embodiment of the present invention.

In this embodiment, the semiconductor device is an LED package rather than an LED chip. Furthermore, the semiconductor device is mounted on the heat spreader and the substrate, overlaps the post and the substrate, is electrically connected to the pad using a solder joint and is thermally connected to the cap using a solder joint.

Semiconductor chip assembly 400 includes thermal board 94, LED package 402 and solder joints 404 and 406. LED package 402 includes LED chip 408, submount 410, wire bond 412, electrical contact 414, thermal contact 416 and encapsulant 418. LED chip 408 includes a bond pad (not shown) electrically connected to a via (not shown) in submount 410 by wire bond 412, thereby electrically connecting LED chip 408 to electrical contact 414. LED chip 408 is mounted on and thermally connected to and mechanically attached to submount 410 by a die attach (not shown), thereby thermally connecting LED chip 408 to thermal contact 416. Submount 410 is a ceramic block with low electrical conductivity and high thermal conductivity, and contacts 414 and 416 are plated on and protrude downwardly from the backside of submount 410. Furthermore, LED chip 408 is similar to LED chip 102, wire bond 412 is similar to wire bond 104 and encapsulant 418 is similar to encapsulant 108.

LED package 402 is mounted on substrate 36 and heat spreader 76, electrically connected to conductive trace 74 and thermally connected to heat spreader 76. In particular, LED package 402 is mounted on pad 64 and cap 66 (and thus post 22 and dielectric layer 42), overlaps post 22, base 24, ESD protection layer 26, adhesive 32, substrate 36, pad 64, cap 66 and underlayer 72 but does not overlap terminal 70, is electrically connected to pad 64 by solder joint 404 and is thermally connected to cap 66 by solder joint 406.

For instance, solder joint 404 contacts and is sandwiched between and electrically connects and mechanically attaches pad 64 and electrical contact 414, thereby electrically connecting LED chip 408 to terminal 70. Likewise, solder joint 406 contacts and is sandwiched between and thermally connects and mechanically attaches cap 66 and thermal contact 416, thereby thermally connecting LED chip 408 to underlayer 72.

Pad 64 is spot plated with nickel/silver to bond well with solder joint 404, thereby improving signal transfer from conductive trace 74 to LED chip 408, and cap 66 is spot plated with nickel/silver to bond well with solder joint 406, thereby improving heat transfer from LED chip 408 to heat spreader 76. Furthermore, since cap 66 is shaped and sized to accommodate thermal contact 416, post 22 is not and need not be shaped and sized to accommodate thermal contact 416.

Semiconductor chip assembly 400 can be manufactured by depositing a solder material on pad 64 and cap 66, then placing contacts 414 and 416 on the solder material over pad 64 and cap 66, respectively, and then reflowing the solder material to provide solder joints 404 and 406.

For instance, solder paste is selectively screen printed on pad 64 and cap 66, then LED package 402 is positioned over thermal board 94 using a pick-up head and an automated pattern recognition system in step-and-repeat fashion. The pick-up head places contacts 414 and 416 on the solder paste over pad 64 and cap 66, respectively. Next, the solder paste is heated and reflowed at a relatively low temperature such as 190° C. and then the heat is removed and the solder paste cools and solidifies to form hardened solder joints 404 and 406. Alternatively, solder balls are placed on pad 64 and cap 66, then contacts 414 and 416 are placed on the solder balls over pad 64 and cap 66, respectively, and then the solder balls are heated and reflowed to form solder joints 404 and 406.

The solder material can be initially deposited on thermal board 94 or LED package 402 by plating or printing or placement techniques, then sandwiched between thermal board 94 and LED package 402 and then reflowed. The solder material can also be deposited on terminal 70 if required for the next level assembly. Furthermore, a conductive adhesive such as silver-filled epoxy or other connection media can be used instead of solder, and the connection media on pad 64, cap 66 and terminal 70 need not be the same.

Semiconductor chip assembly 400 is a second-level single-chip module.

Figure 17A:
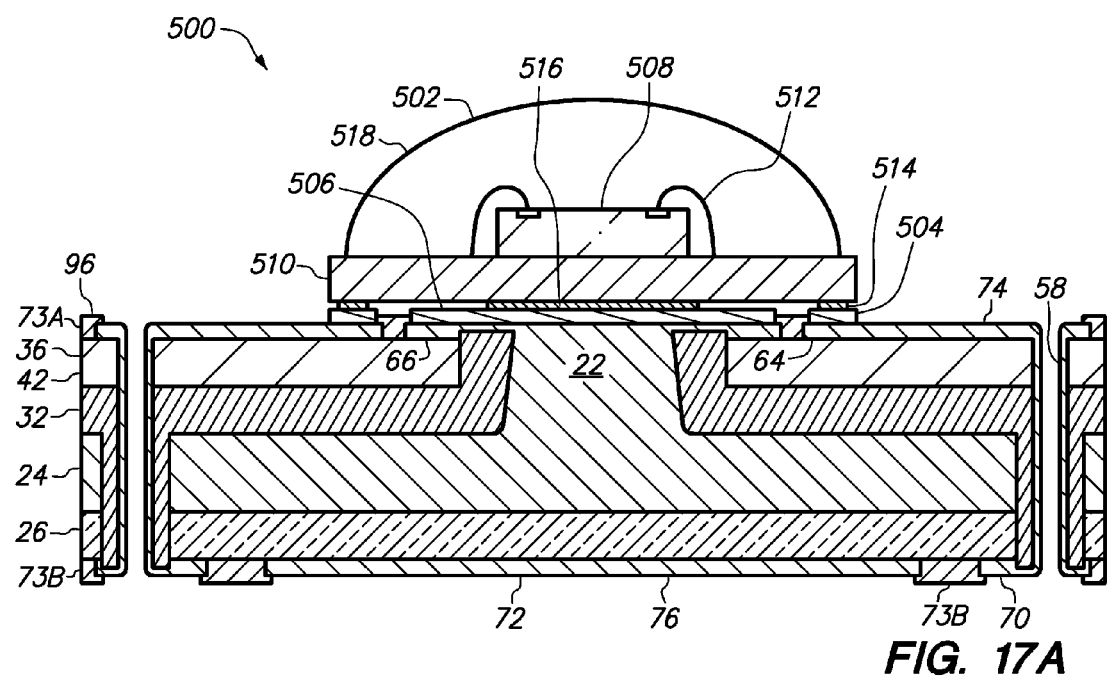
FIGS. 17A, 17B and 17C are cross-sectional, top and bottom views, respectively, of a semiconductor chip assembly that includes a thermal board with vertical signal routing and a semiconductor device with backside contacts in accordance with an embodiment of the present invention.
Figure 17B:
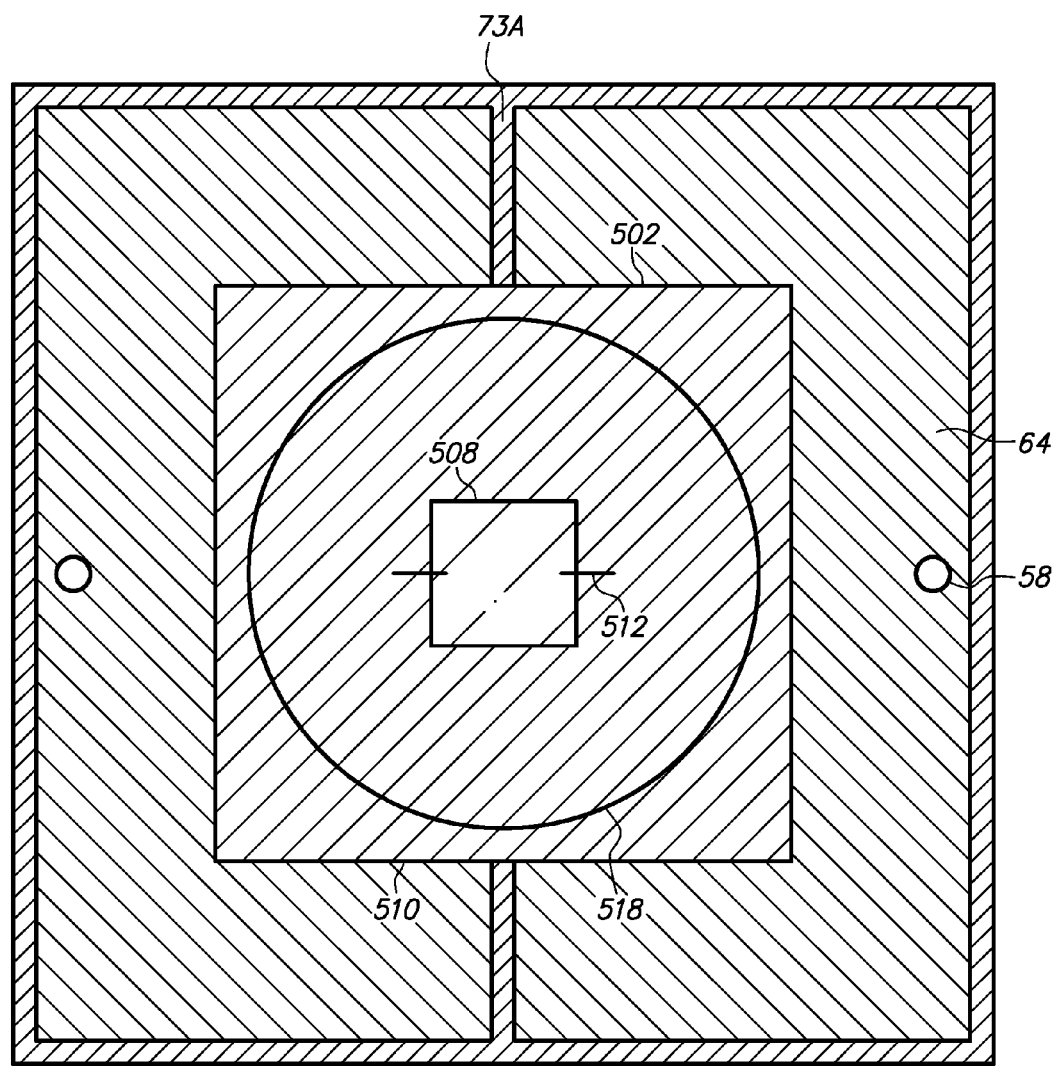
Figure 17C:
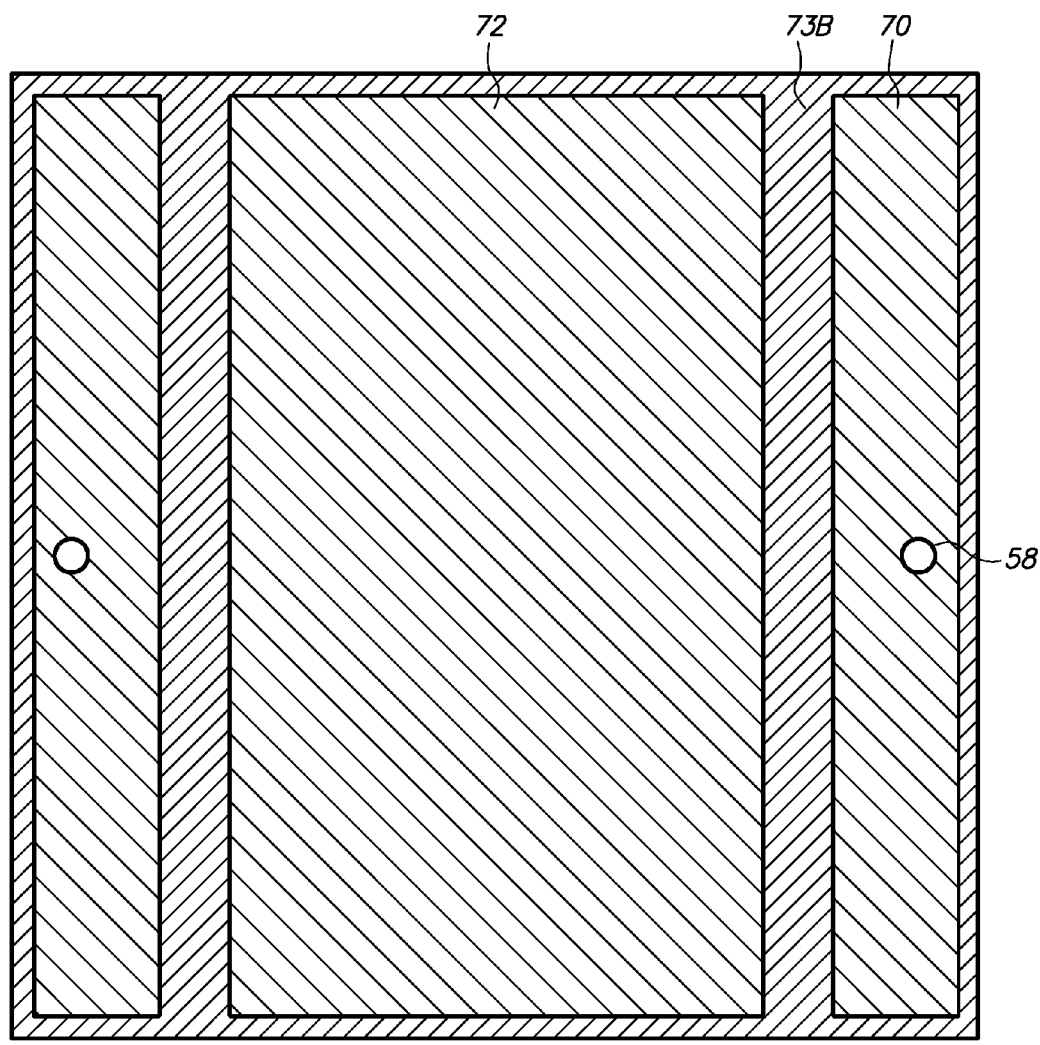

FIGS. 17A, 17B and 17C are cross-sectional, top and bottom views, respectively, of a semiconductor chip assembly that includes a thermal board with vertical routing and a semiconductor device with backside contacts in accordance with an embodiment of the present invention.

In this embodiment, the semiconductor device is an LED package rather than an LED chip. Furthermore, the semiconductor device is mounted on the heat spreader and the substrate, overlaps the post and the substrate, is electrically connected to the pad using a solder joint and is thermally connected to the cap using a solder joint. For purposes of brevity, any description of assembly 400 is incorporated herein insofar as the same is applicable, and the same description need not be repeated. Likewise, elements of the assembly similar to those in assembly 400 have corresponding reference numerals indexed at five-hundred rather than four-hundred. For instance, LED package 502 corresponds to LED package 402, solder joint 504 corresponds to solder joint 404, etc.

Semiconductor chip assembly 500 includes thermal board 96, LED package 502 and solder joints 504 and 506. LED package 502 includes LED chip 508, submount 510, wire bond 512, electrical contact 514, thermal contact 516 and encapsulant 518. LED chip 508 includes a bond pad (not shown) electrically connected to a via (not shown) in submount 510 by wire bond 512, thereby electrically connecting LED chip 508 to electrical contact 514. LED chip 508 is mounted on and thermally connected to and mechanically attached to submount 510 by a die attach (not shown), thereby thermally connecting LED chip 508 to thermal contact 516. Submount 510 is a ceramic block with low electrical conductivity and high thermal conductivity, and contacts 514 and 516 are plated on and protrude downwardly from the backside of submount 510.

LED package 502 is mounted on substrate 36 and heat spreader 76, electrically connected to conductive trace 74 and thermally connected to heat spreader 76. In particular, LED package 502 is mounted on pad 64 and cap 66 (and thus post 22 and dielectric layer 42), overlaps post 22, base 24, ESD protection layer 26, adhesive 32, substrate 36, pad 64, cap 66 and underlayer 72 but does not overlap terminal 70, is electrically connected to pad 64 by solder joint 504 and is thermally connected to cap 66 by solder joint 506.

Semiconductor chip assembly 500 can be manufactured by depositing a solder material on pad 64 and cap 66, then placing contacts 514 and 516 on the solder material over pad 64 and cap 66, respectively, and then reflowing the solder material to provide solder joints 504 and 506.

Semiconductor chip assembly 500 is a second-level single-chip module.

The semiconductor chip assemblies and thermal boards described above are merely exemplary. Numerous other embodiments are contemplated. In addition, the embodiments described above can be mixed-and-matched with one another and with other embodiments depending on design and reliability considerations. For instance, the thermal board can include single-level conductive traces and multi-level conductive traces. The thermal board can also include multiple posts arranged in an array for multiple semiconductor devices and additional conductive traces to accommodate the additional semiconductor devices. The thermal board can also include a solder mask that extends above and selectively exposes the pad, the cap and the plated through-hole. The thermal board can also include a solder mask that extends above and selectively exposes the shared pad. The thermal board can also include a solder mask that extends above and selectively exposes the pad and the cap and the insulative filler in the outer hole. The thermal board can also include a solder mask that extends above and selectively exposes the pad and the cap and a rim mounted on the solder mask. The thermal board can also include the plated through-hole at a peripheral edge and a rim mounted on the plated-through-hole. The semiconductor device can be flip-chip bonded to the pad and the cap by solder joints, overlap the pad and cover the post in the upward direction. The semiconductor device can be covered in the upward direction by a transparent, translucent or opaque encapsulant and/or a transparent, translucent or opaque lid. For instance, the semiconductor device can be an LED chip that emits blue light and is covered by a transparent encapsulant or lid so that the assembly is a blue light source or a color-shifting encapsulant or lid so that the assembly is a green, red or white light source. Likewise, the semiconductor device can be an LED package with multiple LED chips and the thermal board can include additional conductive traces to accommodate the additional LED chips.

The semiconductor device can share or not share the heat spreader with other semiconductor devices. For instance, a single semiconductor device can be mounted on the heat spreader. Alternatively, numerous semiconductor devices can mounted on the heat spreader. For instance, four small chips in a 2×2 array can be attached to the post and the thermal board can include additional conductive traces to receive and route additional wire bonds to the chips. This may be more cost effective than providing a miniature post for each chip.

The semiconductor chip can be optical or non-optical. For instance, the chip can be an LED, an IR detector, a solar cell, a microprocessor, a controller, a DRAM or an RF power amplifier. Likewise, the semiconductor package can be an LED package or an RF module. Thus, the semiconductor device can be a packaged or unpackaged optical or non-optical chip. Furthermore, the semiconductor device can be mechanically, electrically and thermally connected to the thermal board using a wide variety of connection media including solder and electrically and/or thermally conductive adhesive.

The heat spreader can provide rapid, efficient and essentially uniform heat spreading and dissipation for the semiconductor device to the next level assembly without heat flow through the adhesive or the substrate. As a result, the adhesive can have low thermal conductivity which drastically reduces cost. The heat spreader can include a post and a base that are integral with one another and a cap that is metallurgically bonded and thermally connected to the post, thereby enhancing reliability and reducing cost. The cap can be coplanar with the pad, thereby facilitating the electrical, thermal and mechanical connections with the semiconductor device. Furthermore, the cap can be customized for the semiconductor device and the underlayer can be customized for the next level assembly, thereby enhancing the thermal connection from the semiconductor device to the next level assembly. For instance, the cap can have a square or rectangular shape in a lateral plane with the same or similar topography as the thermal contact of the semiconductor device. In any case, the heat spreader can be a wide variety of thermally conductive structures.

The pad can be electrically connected to or isolated from the cap. For instance, a routing line above the adhesive and the dielectric layer can electrically connect the pad and the cap, or a routing line between the adhesive and the dielectric layer can electrically connect the base and the plated through-hole, or the pad and the cap can be merged. Thereafter, the terminal can be electrically connected to ground, thereby electrically connecting the cap to ground.

The post can be deposited on or integral with the base. The post can be integral with the base when they are a single-piece metal such as copper or aluminum. The post can also be integral with the base when they include a single-piece metal such as copper at their interface as well as additional metal elsewhere such as a solder upper post portion and a copper lower post portion and base. The post can also be integral with the base when they share single-piece metals at their interface such as a copper coating on a nickel buffer layer on an aluminum core.

The post can include a flat top surface that is coplanar with the adhesive. For instance, the post can be coplanar with the adhesive or the post can be etched after the adhesive is solidified to provide a cavity in the adhesive over the post. The post can also be selectively etched to provide a cavity in the post that extends below its top surface. In any case, the semiconductor device can be mounted on the post and located in the cavity, and the wire bond can extend from the semiconductor device in the cavity to the pad outside the cavity. In this instance, the semiconductor device can be an LED chip and the cavity can focus the LED light in the upward direction.

The base can provide mechanical support for the substrate. For instance, the base can prevent the substrate from warping during metal grinding, chip mounting, wire bonding and encapsulant molding.

The underlayer can include fins at its backside that protrude in the downward direction. For instance, the underlayer can be cut at its bottom surface by a routing machine to form lateral grooves that define the fins. In this instance, the underlayer can have a thickness of 500 microns, the grooves can have a depth of 300 microns and the fins can have a height of 300 microns. The fins can increase the surface area of the underlayer, thereby increasing the thermal conductivity of the underlayer by thermal convection when it remains exposed to the air rather than mounted on a heat sink.

The cap can be formed by numerous deposition techniques including electroplating, electroless plating, evaporating and sputtering as a single layer or multiple layers after the adhesive is solidified. The cap can be the same metal as the post or the adjacent top of the post. Furthermore, the cap can extend across the aperture to the substrate or reside within the periphery of the aperture. Thus, the cap can contact or be spaced from the substrate. In any case, the cap extends upwardly from the top of the post.

The adhesive can provide a robust mechanical bond between the heat spreader and the substrate. For instance, the adhesive can extend laterally from the post beyond the conductive trace to the peripheral edges of the assembly, the adhesive can fill the space between the post and the dielectric layer and the adhesive can be void-free with consistent bond lines. The adhesive can also absorb thermal expansion mismatch between the heat spreader and the substrate. The adhesive can also be the same material as or a different material than the dielectric layer. Furthermore, the adhesive can be a low cost dielectric that need not have high thermal conductivity. Moreover, the adhesive is not prone to delamination.

The adhesive thickness can be adjusted so that the adhesive essentially fills the gap and/or the outer hole and essentially all the adhesive is within structure once it is solidified and/or grinded. For instance, the optimal prepreg thickness can be established through trial and error. Likewise, the dielectric layer thickness can be adjusted to achieve this result.

The substrate can be a low cost laminated structure that need not have high thermal conductivity. Furthermore, the substrate can include a single conductive layer or multiple conductive layers. Moreover, the substrate can include or consist of the conductive layer.

The conductive layer alone can be mounted on the adhesive. For instance, the aperture can be formed in the conductive layer and then the conductive layer can be mounted on the adhesive so that the conductive layer contacts the adhesive and is exposed in the upward direction and the post extends into and is exposed in the upward direction by the aperture. In this instance, the conductive layer can have a thickness of 100 to 200 microns such as 125 microns which is thick enough to handle without warping and wobbling yet thin enough to pattern without excessive etching.

The conductive layer and the dielectric layer can be mounted on the adhesive. For instance, the conductive layer can be provided on the dielectric layer, then the aperture can be formed in the conductive layer and the dielectric layer, and then the conductive layer and the dielectric layer can be mounted on the adhesive so that the conductive layer is exposed in the upward direction, the dielectric layer contacts and is sandwiched between and separates the conductive layer and the adhesive and the post extends into and is exposed in the upward direction by the aperture. In this instance, the conductive layer can have a thickness of 10 to 50 microns such as 30 microns which is thick enough for reliable signal transfer yet thin enough to reduce weight and cost. Furthermore, the dielectric layer is a permanent part of the thermal board.

The conductive layer and a carrier can be mounted on the adhesive. For instance, the conductive layer can be attached to a carrier such biaxially-oriented polyethylene terephthalate polyester (Mylar) by a thin film, then the aperture can be formed in the conductive layer but not the carrier, then the conductive layer and the carrier can be mounted on the adhesive so that the carrier covers the conductive layer and is exposed in the upward direction, the thin film contacts and is sandwiched between the carrier and the conductive layer, the conductive layer contacts and is sandwiched between the thin film and the adhesive, and the post is aligned with the aperture and covered in the upward direction by the carrier. After the adhesive is solidified, the thin film can be decomposed by UV light so that the carrier can be peeled off the conductive layer, thereby exposing the conductive layer in the upward direction, and then the conductive layer can be grinded and patterned for the pad and the cap. In this instance, the conductive layer can have a thickness of 10 to 50 microns such as 30 microns which is thick enough for reliable signal transfer yet thin enough to reduce weight and cost, and the carrier can have a thickness of 300 to 500 microns which is thick enough to handle without warping and wobbling yet thin enough to reduce weight and cost. Furthermore, the carrier is a temporary fixture and not a permanent part of the thermal board.

The pad and the cap can be coplanar at their top surfaces, thereby enhancing solder joints between the semiconductor device and the thermal board by controlling solder ball collapse.

The pad and the terminal can have a wide variety of packaging formats as required by the semiconductor device and the next level assembly.

The pad and the terminal can be formed by numerous deposition techniques including electroplating, electroless plating, evaporating and sputtering as a single layer or multiple layers, either before or after the substrate is mounted on the adhesive. For instance, the conductive layer can be patterned on the substrate to provide the pad before it is mounted on the adhesive or after it is attached to the post and the base by the adhesive. Likewise, the metal layer can be patterned to provide the terminal before the plated through-hole is formed.

The plated contact surface finish can be formed before or after the pad and the terminal are formed. For instance, the plated contacts can be deposited on the conductive layer and the metal layer before or after they are etched to form the pad, the terminal, the cap and the underlayer.

The rim can be reflective or non-reflective and transparent or non-transparent. For instance, the rim can include a highly reflective metal such as silver or aluminum with a slanted inner surface which reflects the light directed at it in the upward direction, thereby increasing light output in the upward direction. Likewise, the rim can include a transparent material such as glass or a non-reflective, non-transparent low cost material such as epoxy. Furthermore, a reflective rim can be used regardless of whether it contacts or confines the encapsulant.

The encapsulant can be numerous transparent, translucent or opaque materials and have various shapes and sizes. For instance, the encapsulant can be transparent silicone, epoxy or combinations thereof. Silicone has higher thermal and color-shifting stability than epoxy but also higher cost and lower rigidity and adhesion than epoxy.

The lid can overlap or replace the encapsulant. The lid can provide environmental protection such as moisture resistance and particle protection for the chip and the wire bond in a sealed enclosure. The lid can be numerous transparent, translucent or opaque materials and have various shapes and sizes. For instance, the lid can be transparent glass or silica.

A lens can overlap or replace the encapsulant. The lens can provide environmental protection such as moisture resistance and particle protection for the chip and the wire bond in a sealed enclosure. The lens can also provide a convex refractive surface that focuses the light in the upward direction. The lens can be numerous transparent, translucent or opaque materials and have various shapes and sizes. For instance, a glass lens with a hollow hemisphere dome can be mounted on the thermal board and spaced from the encapsulant, or a plastic lens with a solid hemisphere dome can be mounted on the encapsulant and spaced from the thermal board.

The conductive trace can include additional pads, terminals, plated through-holes, routing lines and vias as well as passive components and have different configurations. The conductive trace can function as a signal, power or ground layer depending on the purpose of the corresponding semiconductor device pad. The conductive trace can also include various conductive metals such as copper, gold, nickel, silver, palladium, tin, combinations thereof, and alloys thereof. The preferred composition will depend on the nature of the external connection media as well as design and reliability considerations. Furthermore, those skilled in the art will understand that in the context of a semiconductor chip assembly, the copper material can be pure elemental copper but is typically a copper alloy that is mostly copper such as copper-zirconium (99.9% copper), copper-silver-phosphorus-magnesium (99.7% copper) and copper-tin-iron-phosphorus (99.7% copper) to improve mechanical properties such as tensile strength and elongation.

The cap, dielectric layer, insulative filler, upper and lower plated layers, plated through-hole, plated contacts, solder masks and rim are generally desirable but may be omitted in some embodiments. For instance, if the opening and the aperture are punched rather than drilled so that the top of the post is shaped and sized to accommodate a thermal contact surface of the semiconductor device then the cap can be omitted. If single-level horizontal signal routing is used then the dielectric layer can be omitted. Likewise, if a reflector is unnecessary then the rim can be omitted.

The thermal board can include a thermal via that is spaced from the post, extends through the base, the adhesive, the dielectric layer and the ESD protection layer outside the opening and the aperture and is adjacent to and thermally connects the cap and the underlayer to improve heat dissipation from the cap to the underlayer and heat spreading in the underlayer.

The assembly can provide horizontal or vertical single-level or multi-level signal routing.

Horizontal single-level signal routing with the pad, the terminal and the routing line above the dielectric layer is disclosed in U.S. application Ser. No. 12/616,773 filed Nov. 11, 2009 by Charles W. C. Lin et al. entitled "Semiconductor Chip Assembly with Post/Base Heat Spreader and Substrate" which is incorporated by reference.

Horizontal single-level signal routing with the pad, the terminal and the routing line above the adhesive and no dielectric layer is disclosed in U.S. application Ser. No. 12/616,775 filed Nov. 11, 2009 by Charles W. C. Lin et al. entitled "Semiconductor Chip Assembly with Post/Base Heat Spreader and Conductive Trace" which is incorporated by reference.

Horizontal multi-level signal routing with the pad and the terminal above the dielectric layer electrically connected by first and second vias through the dielectric layer and a routing line beneath the dielectric layer is disclosed in U.S. application Ser. No. 12/557,540 filed Sep. 11, 2009 by Chia-Chung Wang et al. entitled "Semiconductor Chip Assembly with Post/Base Heat Spreader and Horizontal Signal Routing" which is incorporated by reference.

Vertical multi-level signal routing with the pad above the dielectric layer and the terminal beneath the adhesive electrically connected by a first via through the dielectric layer, a routing line beneath the dielectric layer and a second via through the adhesive is disclosed in U.S. application Ser. No. 12/557,541 filed Sep. 11, 2009 by Chia-Chung Wang et al. entitled "Semiconductor Chip Assembly with Post/Base Heat Spreader and Vertical Signal Routing" which is incorporated by reference.

The working format for the thermal board can be a single thermal board or multiple thermal boards based on the manufacturing design. For instance, a single thermal board can be manufactured individually. Alternatively, numerous thermal boards can be simultaneously batch manufactured using a single metal plate, a single metal layer, a single ESD protection layer, a single adhesive, a single substrate and a single plated layer and then separated from one another. Likewise, numerous sets of heat spreaders and conductive traces that are each dedicated to a single semiconductor device can be simultaneously batch manufactured for each thermal board in the batch using a single metal plate, a single metal layer, a single ESD protection layer, a single adhesive, a single substrate and a single plated layer.

For example, the metal layer and the ESD protection layer can be attached to the metal plate, then multiple recesses can be etched in the metal plate to form multiple posts and the base, then multiple outer holes can be drilled through the base, the metal layer and the ESD protection layer, then the non-solidified adhesive with openings corresponding to the posts can be mounted on the base such that each post extends through an opening, then the substrate (with a single conductive layer, a single dielectric layer and apertures corresponding to the posts) can be mounted on the adhesive such that each post extends through an opening into an aperture, then the base and the substrate can be moved towards one another by platens to force the adhesive into the gaps in the apertures between the posts and the substrate and into the outer holes, then the adhesive can be cured and solidified, then the posts, the adhesive and the conductive layer can be grinded to form a lateral top surface, the adhesive and the metal layer can be grinded to form a lateral bottom surface, then the inner holes can be drilled through the outer holes, then the plated layer can be plated on the structure to form the upper and lower plated layers and the plated through-holes in the inner holes, then the conductive layer and the upper plated layer can be etched to form the caps corresponding to the posts and the pads corresponding to the plated through-holes, the metal layer and the lower plated layer can be etched to form the underlayers corresponding to the posts and the terminals corresponding to the plated through-holes, then the plated contact surface finish can be formed on the pads, the caps, the terminals and the underlayers and then the base, the adhesive, the dielectric layer and the ESD protection layer can be cut or cracked at the desired locations of the peripheral edges of the thermal boards, thereby separating the individual thermal boards from one another.

The working format for the semiconductor chip assembly can be a single assembly or multiple assemblies based on the manufacturing design. For instance, a single assembly can be manufactured individually. Alternatively, numerous assemblies can be simultaneously batch manufactured before the thermal boards are separated from one another. Likewise, multiple semiconductor devices can be electrically, thermally and mechanically connected to each thermal board in the batch.

For example, solder paste portions can be deposited on the pads and the caps, then LED packages can be placed on the solder paste portions, then the solder paste portions can be simultaneously heated, reflowed and hardened to provide the solder joints and then the thermal boards can be separated from one another.

As another example, die attach paste portions can be deposited on the caps, then chips can be placed on the die attach paste portions, then the die attach paste portions can be simultaneously heated and hardened to provide the die attaches, then the chips can be wired bonded to the corresponding pads, then the encapsulants can be formed over the chips and the wire bonds and then the thermal boards can be separated from one another.

The thermal boards can be detached from one another in a single step or multiple steps. For instance, the thermal boards can be batch manufactured as a panel, then the semiconductor devices can be mounted on the panel and then the semiconductor chip assemblies of the panel can be detached from one another. Alternatively, the thermal boards can be batch manufactured as a panel, then the thermal boards of the panel can be singulated into strips of multiple thermal boards, then the semiconductor devices can be mounted on the thermal boards of a strip and then the semiconductor chip assemblies of the strip can be detached from one another. Furthermore, the thermal boards can be detached by mechanical sawing, laser sawing, cleaving or other suitable techniques.

The term "adjacent" refers to elements that are integral (single-piece) or in contact (not spaced or separated from) with one another. For instance, the post is adjacent to the base regardless of whether the post is formed additively or subtractively.

The term "overlap" refers to above and extending within a periphery of an underlying element. Overlap includes extending inside and outside the periphery or residing within the periphery. For instance, the semiconductor device overlaps the post since an imaginary vertical line intersects the semiconductor device and the post, regardless of whether another element such as the cap or the die attach is between the semiconductor device and the post and is intersected by the line, and regardless of whether another imaginary vertical line intersects the post but not the semiconductor device (outside the periphery of the semiconductor device). Likewise, the adhesive overlaps the base and is overlapped by the pad, and the base is overlapped by the post. Likewise, the post overlaps and is within a periphery of the base. Moreover, overlap is synonymous with over and overlapped by is synonymous with under or beneath.

The term "contact" refers to direct contact. For instance, the dielectric layer contacts the pad but does not contact the post or the base.

The term "cover" refers to complete coverage in the upward, downward and/or lateral directions. For instance, the base covers the post in the downward direction but the post does not cover the base in the upward direction.

The term "layer" refers to patterned and unpatterned layers. For instance, the conductive layer can be an unpatterned blanket sheet on the dielectric layer when the substrate is mounted on the adhesive, and the conductive layer can be a patterned circuit with spaced traces on the dielectric layer when the semiconductor device is mounted on the heat spreader. Furthermore, a layer can include stacked layers.

The term "pad" in conjunction with the conductive trace refers to a connection region that is adapted to contact and/or bond to external connection media (such as solder or a wire bond) that electrically connects the conductive trace to the semiconductor device.

The term "terminal" in conjunction with the conductive trace refers to a connection region that is adapted to contact and/or bond to external connection media (such as solder or a wire bond) that electrically connects the conductive trace to an external device (such as a PCB or a wire thereto) associated with the next level assembly.

The term "plated through-hole" in conjunction with the conductive trace refers to an electrical interconnect that is formed in a hole using plating. For instance, the plated through-hole exists regardless of whether it remains intact in the hole and spaced from peripheral edges of the assembly or is subsequently split or trimmed such that the hole is converted into a groove and the remaining portion is in the groove at a peripheral edge of the assembly.

The term "cap" in conjunction with the heat spreader refers to a contact region that is adapted to contact and/or bond to external connection media (such as solder or thermally conductive adhesive) that thermally connects the heat spreader to the semiconductor device.

The terms "opening" and "aperture" and "hole" refer to a through-hole and are synonymous. For instance, the post is exposed by the adhesive in the upward direction when it is inserted into the opening in the adhesive. Likewise, the post is exposed by the substrate in the upward direction when it is inserted into the aperture in the substrate.

The term "inserted" refers to relative motion between elements. For instance, the post is inserted into the aperture regardless of whether the post is stationary and the substrate moves towards the base, the substrate is stationary and the post moves towards the substrate or the post and the substrate both approach the other. Furthermore, the post is inserted (or extends) into the aperture regardless of whether it goes through (enters and exits) or does not go through (enters without exiting) the aperture.

The phrase "move towards one another" also refers to relative motion between elements. For instance, the base and the substrate move towards one another regardless of whether the base is stationary and the substrate moves towards the base, the substrate is stationary and the base moves towards the substrate or the base and the substrate both approach the other.

The phrase "aligned with" refers to relative position between elements. For instance, the post is aligned with the aperture when the adhesive is mounted on the base, the substrate is mounted on the adhesive, the post is inserted into and aligned with the opening and the aperture is aligned with the opening regardless of whether the post is inserted into the aperture or is below and spaced from the aperture.

The phrase "mounted on" includes contact and non-contact with a single or multiple support element(s). For instance, the semiconductor device is mounted on the heat spreader regardless of whether it contacts the heat spreader or is separated from the heat spreader by a die attach.

The phrase "adhesive . . . in the gap" refers to the adhesive in the gap. For instance, adhesive that extends across the dielectric layer in the gap refers to the adhesive in the gap that extends across the dielectric layer. Likewise, adhesive that contacts and is sandwiched between the post and the dielectric layer in the gap refers to the adhesive in the gap that contacts and is sandwiched between the post at the inner sidewall of the gap and the dielectric layer at the outer sidewall of the gap.

The term "above" refers to upward extension and includes adjacent and non-adjacent elements as well as overlapping and non-overlapping elements. For instance, the post extends above, is adjacent to, overlaps and protrudes from the base. Likewise, the post extends above the dielectric layer even though it is not adjacent to or overlap the dielectric layer.

The term "below" refers to downward extension and includes adjacent and non-adjacent elements as well as overlapping and non-overlapping elements. For instance, the base extends below, is adjacent to, is overlapped by and protrudes from the post. Likewise, the post extends below the dielectric layer even though it is not adjacent to or overlapped by the dielectric layer.

The "upward" and "downward" vertical directions do not depend on the orientation of the semiconductor chip assembly (or the thermal board), as will be readily apparent to those skilled in the art. For instance, the post extends vertically above the base in the upward direction and the adhesive extends vertically below the pad in the downward direction regardless of whether the assembly is inverted and/or mounted on a heat sink. Likewise, the base extends "laterally" from the post in a lateral plane regardless of whether the assembly is inverted, rotated or slanted. Thus, the upward and downward directions are opposite one another and orthogonal to the lateral directions, and laterally aligned elements are coplanar with one another at a lateral plane orthogonal to the upward and downward directions.

The semiconductor chip assembly of the present invention has numerous advantages. The assembly is reliable, inexpensive and well-suited for high volume manufacture. The assembly is especially well-suited for high power semiconductor devices such as LED chips and large semiconductor chips as well as multiple semiconductor devices such as small semiconductor chips in arrays which generate considerable heat and require excellent heat dissipation in order to operate effectively and reliably.

The manufacturing process is highly versatile and permits a wide variety of mature electrical, thermal and mechanical connection technologies to be used in a unique and improved manner. The manufacturing process can also be performed without expensive tooling. As a result, the manufacturing process significantly enhances throughput, yield, performance and cost effectiveness compared to conventional packaging techniques. Moreover, the assembly is well-suited for copper chip and lead-free environmental requirements.

The embodiments described herein are exemplary and may simplify or omit elements or steps well-known to those skilled in the art to prevent obscuring the present invention. Likewise, the drawings may omit duplicative or unnecessary elements and reference labels to improve clarity.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

We claim:

1. A method of making a semiconductor chip assembly, comprising:

providing a post, a base, an ESD protection layer, a metal layer, an adhesive and a conductive layer, wherein the post is adjacent to the base, extends above the base in an upward direction, extends into an opening in the adhesive and is aligned with an aperture in the conductive layer, the base extends below the post in a downward direction opposite the upward direction and extends laterally from the post in lateral directions orthogonal to the upward and downward directions, the ESD protection layer is a thermally conductive, electrically insulative material that contacts and is sandwiched between the base and the metal layer, extends below the base and extends laterally beyond the post, the metal layer extends below the ESD protection layer and extends laterally beyond the post, the adhesive is mounted on and extends above the base, is sandwiched between the base and the conductive layer and is non-solidified, and the conductive layer is mounted on and extends above the adhesive; then flowing the adhesive into and upward in a gap located in the aperture between the post and the conductive layer;

solidifying the adhesive; then providing a conductive trace that includes a pad, a terminal and a selected portion of the conductive layer, wherein providing the pad includes:

grinding the post, the adhesive and the conductive layer such that the post, the adhesive and the conductive layer are laterally aligned with one another at a top lateral surface that faces in the upward direction; and then removing selected portions of the conductive layer using an etch mask that defines the pad;

providing a heat spreader that includes the post, the base, the ESD protection layer and an underlayer that includes at least a portion of the metal layer; then mounting a semiconductor device on the post, wherein the semiconductor device overlaps the post, the base, the ESD protection layer and the underlayer, the semiconductor device, the post and the base are electrically isolated from the underlayer and the underlayer covers the post in the downward direction;

electrically connecting the semiconductor device to the pad, thereby electrically connecting the semiconductor device to the terminal; and thermally connecting the semiconductor device to the post, thereby thermally connecting the semiconductor device to the underlayer.

2. The method of claim 1, wherein providing the post and the base includes:

providing a metal plate;

forming an etch mask on the metal plate that selectively exposes the metal plate and defines the post;

etching the metal plate in a pattern defined by the etch mask, thereby forming a recess in the metal plate that extends into but not through the metal plate, wherein the post includes an unetched portion of the metal plate that protrudes above the base and is laterally surrounded by the recess and the base includes an unetched portion of the metal plate below the post and the recess; and then removing the etch mask.

3. The method of claim 1, wherein providing the post, the base, the ESD protection layer and the metal layer includes:

providing a metal plate;

attaching the ESD protection layer and the metal layer to the metal plate; then forming an etch mask on the metal plate that selectively exposes the metal plate and defines the post;

etching the metal plate in a pattern defined by the etch mask, thereby forming a recess in the metal plate that extends into but not through the metal plate, wherein the post includes an unetched portion of the metal plate that protrudes above the base and is laterally surrounded by the recess and the base includes an unetched portion of the metal plate below the post and the recess; and then removing the etch mask.

4. The method of claim 1, wherein:

providing the adhesive includes providing a prepreg with uncured epoxy;

flowing the adhesive includes melting the uncured epoxy and compressing the uncured epoxy between the base and the conductive layer; and solidifying the adhesive includes curing the uncured epoxy.

5. The method of claim 1, wherein flowing the adhesive includes filling the gap with the adhesive.

6. The method of claim 1, wherein mounting the conductive layer includes mounting the conductive layer alone on the adhesive.

7. The method of claim 1, wherein mounting the conductive layer includes mounting the conductive layer and a dielectric layer on the adhesive.

8. The method of claim 1, wherein providing the pad includes removing selected portions of the conductive layer after solidifying the adhesive.

9. The method of claim 1, wherein providing the terminal includes removing selected portions of the metal layer after solidifying the adhesive.

10. The method of claim 1, wherein providing the conductive trace includes providing a plated through-hole after solidifying the adhesive.

11. The method of claim 1, wherein providing the underlayer includes removing selected portions of the metal layer after solidifying the adhesive.

12. The method of claim 1, wherein providing the conductive trace and the heat spreader includes:

removing selected portions of the conductive layer using an etch mask that defines the pad after solidifying the adhesive; and removing selected portions of the metal layer using an etch mask that defines the terminal and the underlayer after solidifying the adhesive.

13. The method of claim 1, wherein mounting the semiconductor device includes providing a first solder joint between the semiconductor device and the pad and a second solder joint between the semiconductor device and the post, electrically connecting the semiconductor device includes providing the first solder joint between the semiconductor device and the pad, and thermally connecting the semiconductor device includes providing the second solder joint between the semiconductor device and the post.

14. The method of claim 1, wherein mounting the semiconductor device includes providing a die attach between the semiconductor device and the post, electrically connecting the semiconductor device includes providing a wire bond between the semiconductor device and the pad, and thermally connecting the semiconductor device includes providing the die attach between the semiconductor device and the post.

15. A method of making a semiconductor chip assembly, comprising:

providing a post, a base, an ESD protection layer and a metal layer, wherein the post is adjacent to and integral with the base and extends above the base in an upward direction, the base extends below the post in a downward direction opposite the upward direction and extends laterally from the post in lateral directions orthogonal to the upward and downward directions, the ESD protection layer is a thermally conductive, electrically insulative material that contacts and is sandwiched between the base and the metal layer, extends below the base and extends laterally beyond the post and the metal layer extends below the ESD protection layer and extends laterally beyond the post;

providing an adhesive, wherein an opening extends through the adhesive;

providing a conductive layer, wherein an aperture extends through the conductive layer;

mounting the adhesive on the base, including inserting the post into the opening, wherein the adhesive extends above the base and the post extends into the opening;

mounting the conductive layer on the adhesive, including aligning the post with the aperture, wherein the conductive layer extends above the adhesive and the adhesive is sandwiched between the base and the conductive layer and is non-solidified; then applying heat to melt the adhesive;

moving the base and the conductive layer towards one another, thereby moving the post upward in the aperture and applying pressure to the molten adhesive between the base and the conductive layer, wherein the pressure forces the molten adhesive to flow into and upward in a gap located in the aperture between the post and the conductive layer;

applying heat to solidify the molten adhesive, thereby mechanically attaching the post and the base to the conductive layer; then providing a conductive trace that includes a pad, a terminal and a selected portion of the conductive layer, wherein providing the pad includes:
grinding the post, the adhesive and the conductive layer such that the post, the adhesive and the conductive layer are laterally aligned with one another at a top lateral surface that faces in the upward direction; and then removing selected portions of the conductive layer using an etch mask that defines the pad;

providing a heat spreader that includes the post, the base, the ESD protection layer and an underlayer that includes at least a portion of the metal layer; then mounting a semiconductor device on the post, wherein the semiconductor device overlaps the post, the base, the ESD protection layer and the underlayer, the semiconductor device, the post and the base are electrically isolated from the underlayer and the underlayer covers the post in the downward direction;

electrically connecting the semiconductor device to the pad, thereby electrically connecting the semiconductor device to the terminal; and thermally connecting the semiconductor device to the post, thereby thermally connecting the semiconductor device to the underlayer.

16. The method of claim 15, wherein providing the post and the base includes:
providing a metal plate;
forming an etch mask on the metal plate that selectively exposes the metal plate and defines the post;
etching the metal plate in a pattern defined by the etch mask, thereby forming a recess in the metal plate that extends into but not through the metal plate, wherein the post includes an unetched portion of the metal plate that protrudes above the base and is laterally surrounded by the recess and the base includes an unetched portion of the metal plate below the post and the recess; and then
removing the etch mask.

17. The method of claim 15, wherein providing the post, the base, the ESD protection layer and the metal layer includes:
providing a metal plate;
attaching the ESD protection layer and the metal layer to the metal plate; then
forming an etch mask on the metal plate that selectively exposes the metal plate and defines the post;
etching the metal plate in a pattern defined by the etch mask, thereby forming a recess in the metal plate that extends into but not through the metal plate, wherein the post includes an unetched portion of the metal plate that protrudes above the base and is laterally surrounded by the recess and the base includes an unetched portion of the metal plate below the post and the recess; and then
removing the etch mask.

18. The method of claim 15, wherein:
providing the adhesive includes providing a prepreg with uncured epoxy;
flowing the adhesive includes melting the uncured epoxy and compressing the uncured epoxy between the base and the conductive layer; and
solidifying the adhesive includes curing the uncured epoxy.

19. The method of claim 15, wherein flowing the adhesive includes filling the gap with the adhesive.

20. The method of claim 15, wherein mounting the conductive layer includes mounting the conductive layer alone on the adhesive.

21. The method of claim 15, wherein mounting the conductive layer includes mounting the conductive layer and a dielectric layer on the adhesive.

22. The method of claim 15, wherein providing the pad includes removing selected portions of the conductive layer after solidifying the adhesive.

23. The method of claim 15, wherein providing the terminal includes removing selected portions of the metal layer after solidifying the adhesive.

24. The method of claim 15, wherein providing the conductive trace includes providing a plated through-hole after solidifying the adhesive.

25. The method of claim 15, wherein providing the underlayer includes removing selected portions of the metal layer after solidifying the adhesive.

26. The method of claim 15, wherein providing the conductive trace and the heat spreader includes:
removing selected portions of the conductive layer using an etch mask that defines the pad after solidifying the adhesive; and
removing selected portions of the metal layer using an etch mask that defines the terminal and the underlayer after solidifying the adhesive.

27. The method of claim 15, wherein mounting the semiconductor device includes providing a first solder joint between the semiconductor device and the pad and a second solder joint between the semiconductor device and the post, electrically connecting the semiconductor device includes providing the first solder joint between the semiconductor device and the pad, and thermally connecting the semiconductor device includes providing the second solder joint between the semiconductor device and the post.

28. The method of claim 15, wherein mounting the semiconductor device includes providing a die attach between the semiconductor device and the post, electrically connecting the semiconductor device includes providing a wire bond between the
semiconductor device and the pad, and thermally connecting the semiconductor device includes providing the die attach between the semiconductor device and the post.

29. A method of making a semiconductor chip assembly, compromising:
providing a post, a base, an ESD protection layer, a metal layer, an adhesive and a substrate, wherein
the post is adjacent to the base, extends above the base in an upward direction, extends into an opening in the adhesive and is aligned with an aperture in the substrate,
the base extends below the post in a downward direction opposite the upward direction and extends laterally from the post in lateral directions orthogonal to the upward and downward directions,
the ESD protection layer is a thermally conductive, electrically insulative material that contacts and is sandwiched between the base and the metal layer, extends below the base and extends laterally beyond the post,
the metal layer extends below the ESD protection layer and extends laterally beyond the post,
the adhesive is mounted on and extends above the base, is sandwiched between the base and the substrate and is non-solidified, and
the substrate is mounted on and extends above the adhesive, wherein the substrate includes a conductive layer and a dielectric layer and the conductive layer extends above the dielectric layer; then flowing the adhesive into and upward in a gap located in the aperture between the post and the substrate;
solidifying the adhesive; then
providing a plated through-hole that extends through the base, the adhesive, the dielectric layer and the ESD protection layer and is spaced from the base; then
providing a conductive trace that includes a pad, a terminal and the plated through-hole, wherein the pad includes a selected portion of the conductive layer, the terminal includes a selected portion of the metal layer and an electrically conductive path between the pad and the terminal includes the plated through-hole;
providing a heat spreader that includes the post, the base, the ESD protection layer, a cap that includes a selected portion of the conductive layer and an underlayer that includes a selected portion of the metal layer, wherein the cap extends above and is adjacent to and covers in the upward direction and extends laterally from a top of the post and overlaps and is adjacent to the adhesive; then
mounting a semiconductor device on the cap, wherein the semiconductor device overlaps the post, the base, the cap, the ESD protection layer and the underlayer, the semiconductor device, the post, the base and the cap are electrically isolated from the underlayer and the underlayer covers the post in the downward direction;
electrically connecting the semiconductor device to the pad, thereby electrically connecting the semiconductor device to the terminal; and
thermally connecting the semiconductor device to the cap, thereby thermally connecting the semiconductor device to the underlayer.

30. The method of claim 29, wherein providing the post, the base, the ESD protection layer and the metal layer includes:
providing a metal plate;
attaching the ESD protection layer and the metal layer to the metal plate; then
forming an etch mask on the metal plate that selectively exposes the metal plate and defines the post;
etching the metal plate in a pattern defined by the etch mask, thereby forming a recess in the metal plate that extends into but not through the metal plate, wherein the post includes an unetched portion of the metal plate that protrudes above the base and is laterally surrounded by the recess and the base includes an unetched portion of the metal plate below the post and the recess; and then
removing the etch mask.

31. The method of claim 29, wherein:
providing the adhesive includes providing a prepreg with uncured epoxy;
flowing the adhesive includes melting the uncured epoxy and compressing the uncured epoxy between the base and the substrate; and
solidifying the adhesive includes curing the uncured epoxy.

32. The method of claim 29, wherein flowing the adhesive includes filling the gap with the adhesive.

33. The method of claim 29, wherein providing the pad and the cap includes:
grinding the post, the adhesive and the conductive layer such that the post, the adhesive and the conductive layer are laterally aligned with one another at a top lateral surface that faces in the upward direction; and then
removing selected portions of the conductive layer using an etch mask that defines the pad and the cap.

34. The method of claim 29, wherein providing the pad, the cap and the plated through-hole includes:
providing a hole that extends through the base, the adhesive, the dielectric layer, the conductive layer, the metal layer and the ESD protection layer after solidifying the adhesive; then
depositing a plated layer on the conductive layer and into the hole, wherein the plated layer forms an upper plated layer that covers the post in the upward direction and the plated through-hole in the hole; then
forming an etch mask on the upper plated layer that defines the pad and the cap;
etching the conductive layer and the upper plated layer in a pattern defined by the etch mask; and then
removing the etch mask.

35. The method of claim 29, wherein providing the terminal and the plated through-hole includes:
providing a hole through that extends through the base, the adhesive, the dielectric layer, the metal layer, the conductive layer and the ESD protection layer after solidifying the adhesive; then
depositing a plated layer on the metal layer and into the hole, wherein the plated layer forms a lower plated layer that covers the post in the downward direction and the plated throughhole in the hole; then
forming an etch mask on the lower plated layer that defines the terminal;
etching the metal layer and the lower plated layer in a pattern defined by the etch mask; and then
removing the etch mask.

36. The method of claim 29, wherein providing the pad, the terminal, the cap, the plated through-hole and the underlayer includes:
providing a hole that extends through the base, the adhesive, the dielectric layer, the conductive layer, the metal layer and the ESD protection layer after solidifying the adhesive; then
depositing a plated layer on the conductive layer and the metal layer, wherein the plated layer forms an upper plated layer that covers the post in the upward direction, a lower plated layer that covers the post in the downward direction and the plated through-hole in the hole; then
forming a first etch mask on the upper plated layer that defines the pad and the cap;
etching the conductive layer and the upper plated layer in a pattern defined by the first etch mask;
forming a second etch mask on the lower plated layer that defines the terminal and the underlayer;
etching the metal layer and the lower plated layer in a pattern defined by the second etch mask; and
removing the etch masks.

37. The method of claim 29, wherein mounting the semiconductor device includes providing a first solder joint between the semiconductor device and the pad and a second solder joint between the semiconductor device and the cap, electrically connecting the semiconductor device includes providing the first solder joint between the semiconductor device and the pad, and thermally connecting the semiconductor device includes providing the second solder joint between the semiconductor device and the cap.

38. The method of claim 29, wherein mounting the semiconductor device includes providing a die attach between the semiconductor device and the cap, electrically connecting the semiconductor device includes providing a wire bond between the semiconductor device and the pad, and thermally connecting the semiconductor device includes providing the die attach between the semiconductor device and the cap.

39. A method of making a semiconductor chip assembly, comprising:

providing a post, and a base, an ESD protection layer and a metal layer, wherein the post is adjacent to and integral with the base and extends above the base in an upward direction, and the base extends below the post in a downward direction opposite the upward direction and extends laterally from the post in lateral directions orthogonal to the upward and downward directions, the ESD protection layer is a thermally conductive, electrically insulative material that contacts and is sandwiched between the base and the metal layer, extends below the base and extends laterally beyond the post and the metal layer extends below the ESD protection layer and extends laterally beyond the post;

providing an adhesive, wherein an opening extends through the adhesive;

providing a substrate that includes a conductive layer and a dielectric layer, wherein an aperture extends through the substrate;

mounting the adhesive on the base, including inserting the post through the opening, wherein the adhesive extends above the base and the post extends through the opening;

mounting the substrate on the adhesive, including inserting the post into the aperture, wherein the substrate extends above the adhesive, the conductive layer extends above the dielectric layer, the post extends through the opening into the aperture and the adhesive is sandwiched between the base and the substrate and is non-solidified; then applying heat to melt the adhesive;

moving the base and the substrate towards one another, thereby moving the post upward in the aperture and applying pressure to the molten adhesive between the base and the substrate, wherein the pressure forces the molten adhesive to flow into and upward in a gap located in the aperture between the post and the substrate;

applying heat to solidify the molten adhesive, thereby mechanically attaching the post and the base to the substrate; then providing a plated through-hole that extends through the base, the adhesive, the dielectric layer and the ESD protection layer and is spaced from the base; then providing a conductive trace that includes a pad, a terminal and the plated through-hole, wherein the pad includes a selected portion of the conductive layer, the terminal includes a selected portion of the metal layer and an electrically conductive path between the pad and the terminal includes the plated through-hole;

providing a heat spreader that includes the post, the base, the ESD protection layer, a cap and an underlayer, wherein the cap extends above and is adjacent to and covers in the upward direction and extends laterally from a top of the post and overlaps and is adjacent to the adhesive and includes a selected portion of the conductive layer and the underlayer includes a selected portion of the metal layer; then mounting a semiconductor device on the cap, wherein the semiconductor device overlaps the post, the base, the cap, the ESD protection layer and the underlayer, the semiconductor device, the post, the base and the cap are electrically isolated from the underlayer and the underlayer covers the post in the downward direction;

electrically connecting the semiconductor device to the pad, thereby electrically connecting the semiconductor device to the terminal; and thermally connecting the semiconductor device to the cap, thereby thermally connecting the semiconductor device to the underlayer.

40. The method of claim 39, wherein providing the post, the base, the ESD protection layer and the metal layer includes:

providing a metal plate;

attaching the ESD protection layer and the metal layer to the metal plate; then forming an etch mask on the metal plate that selectively exposes the metal plate and defines the post;

etching the metal plate in a pattern defined by the etch mask, thereby forming a recess in the metal plate that extends into but not through the metal plate, wherein the post includes an unetched portion of the metal plate that protrudes above the base and is laterally surrounded by the recess and the base includes an unetched portion of the metal plate below the post and the recess; and then removing the etch mask.

41. The method of claim 39, wherein:

providing the adhesive includes providing a prepreg with uncured epoxy;

flowing the adhesive includes melting the uncured epoxy and compressing the uncured epoxy between the base and the substrate; and solidifying the adhesive includes curing the uncured epoxy.

42. The method of claim 39, wherein providing the pad, the terminal, the plated through-hole, the cap and the underlayer includes:

providing a hole that extends through the base, the adhesive, the dielectric layer, the conductive layer, the metal layer and the ESD protection after solidifying the adhesive; then depositing a plated layer on the post, the conductive layer and the metal layer, wherein the plated layer forms an upper plated layer that covers the post in the upward direction, a lower plated layer that covers the post in the downward direction and the plated through-hole in the hole; then forming a first etch mask on the upper plated layer that defines the pad and the cap;

etching the conductive layer and the upper plated layer in a pattern defined by the first etch mask;

forming a second etch mask on the lower plated layer that defines the terminal and the underlayer;

etching the metal layer and the lower plated layer in a pattern defined by the second etch mask; and removing the etch masks.

43. The method of claim 39, wherein mounting the semiconductor device includes providing a die attach between the semiconductor device and the cap, electrically connecting the semiconductor device includes providing a wire bond between the semiconductor device and the pad, and thermally connecting the semiconductor device includes providing the die attach between the semiconductor device and the cap.

44. A method of making a semiconductor chip assembly, comprising:

providing a post, a base, an ESD protection layer, a metal layer, an adhesive and a conductive layer, wherein the post is adjacent to the base, extends above the base in an upward direction, extends into an opening in the adhesive and is aligned with an aperture in the conductive layer, the base extends below the post in a downward direction opposite the upward direction and extends laterally from the post in lateral directions orthogonal to the upward and downward directions, the ESD protection layer is a thermally conductive, electrically insulative material that contacts and is sandwiched between the base and the metal layer, extends below the base and extends laterally beyond the post, the metal layer extends below the ESD protection layer and extends laterally beyond the post, the adhesive is mounted on and extends above the base, is sandwiched between the base and the conductive layer and is non-solidified, and the conductive layer is mounted on and extends above the adhesive; then flowing the adhesive into and upward in a gap located in the aperture between the post and the conductive layer;

solidifying the adhesive; then providing a conductive trace that includes a pad, a terminal and a selected portion of the conductive layer, wherein providing the terminal includes removing selected portions of the metal layer after solidifying the adhesive;

providing a heat spreader that includes the post, the base, the ESD protection layer and an underlayer that includes at least a portion of the metal layer; then mounting a semiconductor device on the post, wherein the semiconductor device overlaps the post, the base, the ESD protection layer and the underlayer, the semiconductor device, the post and the base are electrically isolated from the underlayer and the underlayer covers the post in the downward direction;

electrically connecting the semiconductor device to the pad, thereby electrically connecting the semiconductor device to the terminal; and thermally connecting the semiconductor device to the post, thereby thermally connecting the semiconductor device to the underlayer.

45. A method of making a semiconductor chip assembly, comprising:

providing a post, a base, an ESD protection layer, a metal layer, an adhesive and a conductive layer, wherein the post is adjacent to the base, extends above the base in an upward direction, extends into an opening in the adhesive and is aligned with an aperture in the conductive layer, the base extends below the post in a downward direction opposite the upward direction and extends laterally from the post in lateral directions orthogonal to the upward and downward directions, the ESD protection layer is a thermally conductive, electrically insulative material that contacts and is sandwiched between the base and the metal layer, extends below the base and extends laterally beyond the post, the metal layer extends below the ESD protection layer and extends laterally beyond the post, the adhesive is mounted on and extends above the base, is sandwiched between the base and the conductive layer and is non-solidified, and the conductive layer is mounted on and extends above the adhesive; then flowing the adhesive into and upward in a gap located in the aperture between the post and the conductive layer;

solidifying the adhesive; then providing a conductive trace that includes a pad, a terminal and a selected portion of the conductive layer, wherein providing the conductive trace includes providing a plated through-hole after solidifying the adhesive;

providing a heat spreader that includes the post, the base, the ESD protection layer and an underlayer that includes at least a portion of the metal layer; then mounting a semiconductor device on the post, wherein the semiconductor device overlaps the post, the base, the ESD protection layer and the underlayer, the semiconductor device, the post and the base are electrically isolated from the underlayer and the underlayer covers the post in the downward direction;

electrically connecting the semiconductor device to the pad, thereby electrically connecting the semiconductor device to the terminal; and thermally connecting the semiconductor device to the post, thereby thermally connecting the semiconductor device to the underlayer.

46. A method of making a semiconductor chip assembly, comprising:

providing a post, a base, an ESD protection layer, a metal layer, an adhesive and a conductive layer, wherein the post is adjacent to the base, extends above the base in an upward direction, extends into an opening in the adhesive and is aligned with an aperture in the conductive layer, the base extends below the post in a downward direction opposite the upward direction and extends laterally from the post in lateral directions orthogonal to the upward and downward directions, the ESD protection layer is a thermally conductive, electrically insulative material that contacts and is sandwiched between the base and the metal layer, extends below the base and extends laterally beyond the post, the metal layer extends below the ESD protection layer and extends laterally beyond the post, the adhesive is mounted on and extends above the base, is sandwiched between the base and the conductive layer and is non-solidified, and the conductive layer is mounted on and extends above the adhesive; then flowing the adhesive into and upward in a gap located in the aperture between the post and the conductive layer;

solidifying the adhesive; then providing a conductive trace that includes a pad, a terminal and a selected portion of the conductive layer;

providing a heat spreader that includes the post, the base, the ESD protection layer and an underlayer that includes at least a portion of the metal layer, wherein providing the underlayer includes removing selected portions of the metal layer after solidifying the adhesive; then mounting a semiconductor device on the post, wherein the semiconductor device overlaps the post, the base, the ESD protection layer and the underlayer, the semiconductor device, the post and the base are electrically isolated from the underlayer and the underlayer covers the post in the downward direction;

electrically connecting the semiconductor device to the pad, thereby electrically connecting the semiconductor device to the terminal; and thermally connecting the semiconductor device to the post, thereby thermally connecting the semiconductor device to the underlayer.

47. A method of making a semiconductor chip assembly, comprising:

providing a post, a base, an ESD protection layer, a metal layer, an adhesive and a conductive layer, wherein the post is adjacent to the base, extends above the base in an upward direction, extends into an opening in the adhesive and is aligned with an aperture in the conductive layer, the base extends below the post in a downward direction opposite the upward direction and extends laterally from the post in lateral directions orthogonal to the upward and downward directions, the ESD protection layer is a thermally conductive, electrically insulative material that contacts and is sandwiched between the base and the metal layer, extends below the base and extends laterally beyond the post, the metal layer extends below the ESD protection layer and extends laterally beyond the post, the adhesive is mounted on and extends above the base, is sandwiched between the base and the conductive layer and is non-solidified, and the conductive layer is mounted on and extends above the adhesive; then flowing the adhesive into and upward in a gap located in the aperture between the post and the conductive layer;

solidifying the adhesive; then providing a conductive trace that includes a pad, a terminal and a selected portion of the conductive layer;

providing a heat spreader that includes the post, the base, the ESD protection layer and an underlayer that includes at least a portion of the metal layer, wherein providing the conductive trace and the heat spreader includes:

removing selected portions of the conductive layer using an etch mask that defines the pad after solidifying the adhesive; and removing selected portions of the metal layer using an etch mask that defines the terminal and the underlayer after solidifying the adhesive; then mounting a semiconductor device on the post, wherein the semiconductor device overlaps the post, the base, the ESD protection layer and the underlayer, the semiconductor device, the post and the base are electrically isolated from the underlayer and the underlayer covers the post in the downward direction;

electrically connecting the semiconductor device to the pad, thereby electrically connecting the semiconductor device to the terminal; and thermally connecting the semiconductor device to the post, thereby thermally connecting the semiconductor device to the underlayer.

48. A method of making a semiconductor chip assembly, comprising:

providing a post, a base, an ESD protection layer and a metal layer, wherein the post is adjacent to and integral with the base and extends above the base in an upward direction, the base extends below the post in a downward direction opposite the upward direction and extends laterally from the post in lateral directions orthogonal to the upward and downward directions, the ESD protection layer is a thermally conductive, electrically insulative material that contacts and is sandwiched between the base and the metal layer, extends below the base and extends laterally beyond the post and the metal layer extends below the ESD protection layer and extends laterally beyond the post;

providing an adhesive, wherein an opening extends through the adhesive;

providing a conductive layer, wherein an aperture extends through the conductive layer;

mounting the adhesive on the base, including inserting the post into the opening, wherein the adhesive extends above the base and the post extends into the opening;

mounting the conductive layer on the adhesive, including aligning the post with the aperture, wherein the conductive layer extends above the adhesive and the adhesive is sandwiched between the base and the conductive layer and is non-solidified; then applying heat to melt the adhesive;

moving the base and the conductive layer towards one another, thereby moving the post upward in the aperture and applying pressure to the molten adhesive between the base and the conductive layer, wherein the pressure forces the molten adhesive to flow into and upward in a gap located in the aperture between the post and the conductive layer;

applying heat to solidify the molten adhesive, thereby mechanically attaching the post and the base to the conductive layer; then providing a conductive trace that includes a pad, a terminal and a selected portion of the conductive layer, wherein providing the terminal includes removing selected portions of the metal layer after solidifying the adhesive;

providing a heat spreader that includes the post, the base, the ESD protection layer and an underlayer that includes at least a portion of the metal layer; then mounting a semiconductor device on the post, wherein the semiconductor device overlaps the post, the base, the ESD protection layer and the underlayer, the semiconductor device, the post and the base are electrically isolated from the underlayer and the underlayer covers the post in the downward direction;

electrically connecting the semiconductor device to the pad, thereby electrically connecting the semiconductor device to the terminal; and thermally connecting the semiconductor device to the post, thereby thermally connecting the semiconductor device to the underlayer.

49. A method of making a semiconductor chip assembly, comprising:

providing a post, a base, an ESD protection layer and a metal layer, wherein the post is adjacent to and integral with the base and extends above the base in an upward direction, the base extends below the post in a downward direction opposite the upward direction and extends laterally from the post in lateral directions orthogonal to the upward and downward directions, the ESD protection layer is a thermally conductive, electrically insulative material that contacts and is sandwiched between the base and the metal layer, extends below the base and extends laterally beyond the post and the metal layer extends below the ESD protection layer and extends laterally beyond the post;

providing an adhesive, wherein an opening extends through the adhesive;

providing a conductive layer, wherein an aperture extends through the conductive layer;

mounting the adhesive on the base, including inserting the post into the opening, wherein the adhesive extends above the base and the post extends into the opening;

mounting the conductive layer on the adhesive, including aligning the post with the aperture, wherein the conductive layer extends above the adhesive and the adhesive is sandwiched between the base and the conductive layer and is non-solidified; then applying heat to melt the adhesive;

moving the base and the conductive layer towards one another, thereby moving the post upward in the aperture and applying pressure to the molten adhesive between the base and the conductive layer, wherein the pressure forces the molten adhesive to flow into and upward in a gap located in the aperture between the post and the conductive layer;

applying heat to solidify the molten adhesive, thereby mechanically attaching the post and the base to the conductive layer; then providing a conductive trace that includes a pad, a terminal and a selected portion of the conductive layer, wherein providing the conductive trace includes providing a plated through-hole after solidifying the adhesive;

providing a heat spreader that includes the post, the base, the ESD protection layer and an underlayer that includes at least a portion of the metal layer; then mounting a semiconductor device on the post, wherein the semiconductor device overlaps the post, the base, the ESD protection layer and the underlayer, the semiconductor device, the post and the base are electrically isolated from the underlayer and the underlayer covers the post in the downward direction;

electrically connecting the semiconductor device to the pad, thereby electrically connecting the semiconductor device to the terminal; and thermally connecting the semiconductor device to the post, thereby thermally connecting the semiconductor device to the underlayer.

50. A method of making a semiconductor chip assembly, comprising:

providing a post, a base, an ESD protection layer and a metal layer, wherein the post is adjacent to and integral with the base and extends above the base in an upward direction, the base extends below the post in a downward direction opposite the upward direction and extends laterally from the post in lateral directions orthogonal to the upward and downward directions, the ESD protection layer is a thermally conductive, electrically insulative material that contacts and is sandwiched between the base and the metal layer, extends below the base and extends laterally beyond the post and the metal layer extends below the ESD protection layer and extends laterally beyond the post;

providing an adhesive, wherein an opening extends through the adhesive;

providing a conductive layer, wherein an aperture extends through the conductive layer;

mounting the adhesive on the base, including inserting the post into the opening, wherein the adhesive extends above the base and the post extends into the opening;

mounting the conductive layer on the adhesive, including aligning the post with the aperture, wherein the conductive layer extends above the adhesive and the adhesive is sandwiched between the base and the conductive layer and is non-solidified; then applying heat to melt the adhesive;

moving the base and the conductive layer towards one another, thereby moving the post upward in the aperture and applying pressure to the molten adhesive between the base and the conductive layer, wherein the pressure forces the molten adhesive to flow into and upward in a gap located in the aperture between the post and the conductive layer;

applying heat to solidify the molten adhesive, thereby mechanically attaching the post and the base to the conductive layer; then providing a conductive trace that includes a pad, a terminal and a selected portion of the conductive layer;

providing a heat spreader that includes the post, the base, the ESD protection layer and an underlayer that includes at least a portion of the metal layer,
wherein providing the underlayer includes removing selected portions of the metal layer after solidifying the adhesive; then mounting a semiconductor device on the post, wherein the semiconductor device overlaps the post, the base, the ESD protection layer and the underlayer, the semiconductor device, the post and the base are electrically isolated from the underlayer and the underlayer covers the post in the downward direction;

electrically connecting the semiconductor device to the pad, thereby electrically connecting the semiconductor device to the terminal; and thermally connecting the semiconductor device to the post, thereby thermally connecting the semiconductor device to the underlayer.

51. A method of making a semiconductor chip assembly, comprising:

providing a post, a base, an ESD protection layer and a metal layer, wherein the post is adjacent to and integral with the base and extends above the base in an upward direction, the base extends below the post in a downward direction opposite the upward direction and extends laterally from the post in lateral directions orthogonal to the upward and downward directions, the ESD protection layer is a thermally conductive, electrically insulative material that contacts and is sandwiched between the base and the metal layer, extends below the base and extends laterally beyond the post and the metal layer extends below the ESD protection layer and extends laterally beyond the post;

providing an adhesive, wherein an opening extends through the adhesive;

providing a conductive layer, wherein an aperture extends through the conductive layer;

mounting the adhesive on the base, including inserting the post into the opening, wherein the adhesive extends above the base and the post extends into the opening;

mounting the conductive layer on the adhesive, including aligning the post with the aperture, wherein the conductive layer extends above the adhesive and the adhesive is sandwiched between the base and the conductive layer and is non-solidified; then applying heat to melt the adhesive;

moving the base and the conductive layer towards one another, thereby moving the post upward in the aperture and applying pressure to the molten adhesive between the base and the conductive layer, wherein the pressure forces the molten adhesive to flow into and upward in a gap located in the aperture between the post and the conductive layer;

applying heat to solidify the molten adhesive, thereby mechanically attaching the post and the base to the conductive layer; then providing a conductive trace that includes a pad, a terminal and a selected portion of the conductive layer;

providing a heat spreader that includes the post, the base, the ESD protection layer and an underlayer that includes at least a portion of the metal layer, wherein providing the conductive trace and the heat spreader includes:
    removing selected portions of the conductive layer using an etch mask that defines the pad after solidifying the adhesive; and
    removing selected portions of the metal layer using an etch mask that defines the terminal and the underlayer after solidifying the adhesive; then
mounting a semiconductor device on the post, wherein the semiconductor device overlaps the post, the base, the ESD protection layer and the underlayer, the semiconductor device, the post and the base are electrically isolated from the underlayer and the underlayer covers the post in the downward direction;
    electrically connecting the semiconductor device to the pad, thereby electrically connecting the semiconductor device to the terminal; and
thermally connecting the semiconductor device to the post, thereby thermally connecting the semiconductor device to the underlayer.

* * * * *